United States Patent
Hasegawa et al.

(10) Patent No.: US 6,901,652 B2
(45) Date of Patent: Jun. 7, 2005

(54) METHOD FOR MANUFACTURING MAGNETIC SENSING ELEMENT HAVING IMPROVED MAGNETIC FIELD SENSITIVITY

(75) Inventors: Naoya Hasegawa, Nigata-ken (JP); Eiji Umetsu, Nigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 243 days.

(21) Appl. No.: 10/193,675

(22) Filed: Jul. 11, 2002

(65) Prior Publication Data
US 2003/0163913 A1 Sep. 4, 2003

(30) Foreign Application Priority Data

Jul. 13, 2001 (JP) ........................................ 2002-214276
Feb. 8, 2002 (JP) ........................................ 2002-032728

(51) Int. Cl.$^7$ ................................................ H01F 3/00
(52) U.S. Cl. ................................ 29/603.15; 29/603.13; 29/603.14; 148/108; 360/113
(58) Field of Search .................... 148/108; 360/113; 29/603.13, 603.14, 603.15

(56) References Cited

U.S. PATENT DOCUMENTS

| 5,949,623 | A |  | 9/1999 | Lin |  |
|---|---|---|---|---|---|
| 6,030,753 | A |  | 2/2000 | Lin |  |
| 6,648,985 | B2 | * | 11/2003 | Saito et al. | ................. 148/121 |
| 2001/0012188 | A1 | * | 8/2001 | Hasegawa et al. | ..... 360/324.12 |
| 2003/0053269 | A1 | * | 3/2003 | Nishiyama | ............... 360/324.1 |

FOREIGN PATENT DOCUMENTS

| JP | 2000-348309 | 12/2000 |
|---|---|---|
| JP | 2001-52315 | 2/2001 |

* cited by examiner

Primary Examiner—John P. Sheehan
(74) Attorney, Agent, or Firm—Brinks Hofer Gilson & Lione

(57) ABSTRACT

A method for manufacturing magnetic sensing elements for use in magnetic sensors and hard disks. A ferromagnetic layer and a second antiferromagnetic layer are deposited on a nonmagnetic layer having a uniform thickness. The second antiferromagnetic layer is milled to form an indent. The resulting magnetic sensing element has a free magnetic layer reliably set in a single-magnetic-domain state in the track width direction.

46 Claims, 33 Drawing Sheets

METHOD FOR MANUFACTURING MAGNETIC SENSING ELEMENT HAVING IMPROVED MAGNETIC FIELD SENSITIVITY

BACKGROUND OF THE INVENTION

1. Field of the Invention

The present invention relates generally to magnetic sensing elements for use in magnetic sensors and hard disks. In particular, the present invention relates to a method for manufacturing a magnetic sensing element having improved magnetic field sensitivity.

2. Description of the Related Art

FIG. 38 is a cross-sectional view of a magnetic sensing element made according to a known manufacturing method when viewed from a face of the element opposing a recording medium. This face is hereinafter referred to as the "opposing face".

The magnetic sensing element shown in FIG. 38 is of a spin-valve type which is a type of giant magnetoresistive (GMR) element utilizing the giant magnetoresistive effect. The spin-valve magnetic sensing element detects a recorded magnetic field on a recording medium such as a hard disk.

As shown in FIG. 38, this spin-valve magnetic sensing element comprises: a composite 8 comprising a substrate 1, an underlayer 2, a first antiferromagnetic layer 3, a pinned magnetic layer 4, a nonmagnetic layer 5, a free magnetic layer 6, and a protective layer 7; a pair of ferromagnetic layers 9 disposed at two sides of the composite 8; a pair of second antiferromagnetic layers 10 formed on the ferromagnetic layers 9; and a pair of electrode layers L.

Generally, the first antiferromagnetic layer 3 and the second antiferromagnetic layers 10 are made of an Platinum-manganese (Pt—Mn) alloy. The pinned magnetic layer 4, the free magnetic layer 6, and the ferromagnetic layers 9 are made of a nickel-iron (Ni—Fe) alloy. The nonmagnetic layer 5 is made of copper. The underlayer 2 and the protective layer 7 are made of tantalum. The electrode layers L are made of chromium.

The pinned magnetic layer 4 is set to a single-magnetic-domain state in the Y direction in the drawing due to an exchange anisotropic magnetic field with the first antiferromagnetic layer 3. The Y direction is the direction of the magnetic field leaking from the recording medium and is also the height direction.

The ferromagnetic layers 9 are set to a single-magnetic domain state in the X direction by an exchange anisotropic magnetic field with the second antiferromagnetic layers 10. The ferromagnetic layers 9 come into contact with the free magnetic layer 6 at junctions J to make a continuous ferromagnetic unit. Thus, the free magnetic layer 6 is set to a single-magnetic-domain state in the X direction by an exchange bias method. The advantage of the exchange bias method is that no surface magnetic charge is generated at the two sides of the free magnetic layer 6, i.e., the junctions J and the demagnetizing field in the free magnetic layer 6 can be minimized.

In the magnetic sensing element, a detecting current, i.e., a sense current, is fed from the electrode layers L to the free magnetic layer 6, the nonmagnetic layer 5, and the pinned magnetic layer 4 via the second antiferromagnetic layers 10 and the ferromagnetic layers 9. The moving direction of the recording medium such as a hard disk is the Z direction. When a leakage magnetic field is applied from the recording medium in the Y direction, the magnetization direction of the free magnetic layer 6 shifts from the X direction toward the Y direction. Such a shift in the magnetization direction of the free magnetic layer 6 relative to the pinned magnetization of the pinned magnetic layer 4 changes the electrical resistance. This phenomenon is known as the magnetoresistive effect. The change in voltage cause by this change in electrical resistance helps detect the leakage magnetic field from the recording medium.

In manufacturing the magnetic sensing element shown in FIG. 38, the underlayer 2, the first antiferromagnetic layer 3, the pinned magnetic layer 4, the nonmagnetic layer 5, the free magnetic layer 6, and the protective layer 7 are deposited on the substrate 1. Each of these layers has a uniform thickness. Subsequently, specific portions of the deposited layers are ion-milled to make the composite 8 shown in FIG. 38. The ferromagnetic layers 9 are then deposited at the two sides of the composite 8 so that the ferromagnetic layers 9 come into direct contact with side faces 8a of the composite 8. Finally, the second antiferromagnetic layers 10 and the electrode layers L are formed on the ferromagnetic layers 9.

In the magnetic sensing element shown in FIG. 38, the side faces 8a of the composite 8 are formed by milling, as described above. When ferromagnetic layers 9 are directly formed on surfaces formed by milling, such as the side faces 8a, it is difficult to make a continuous ferromagnetic unit comprising the ferromagnetic layers 9 and the bias layers 6 in contact with each other at the junctions J. Thus, it is difficult to stably set the free magnetic layer 6 into a single-magneticdomain state in the X direction.

Moreover, since the junctions J between the ferromagnetic layers 9 and the free magnetic layer 6 are arranged above the side faces 8a of the composite 8, it is difficult to magnetically couple the ferromagnetic layers 9 and the free magnetic layer 6 at the junctions J. Thus, it is difficult to stably set the free magnetic layer 6 into a single-magnetic-domain state in the X direction.

If an angle $\theta_1$ of the side face 8a of the composite 8 is minimized to stabilize the magnetic coupling between the ferromagnetic layers 9 and the free magnetic layer 6 at the junctions J, then it would be difficult to form the free magnetic layer 6 at a predetermined width in the track width direction (the X direction).

As described above, the known magnetic sensing element shown in FIG. 38 employing the exchange bias method suffers from the problem that a stable longitudinal bias cannot be stably applied to the free magnetic layer 6, thereby preventing the free magnetic layer 6 from entering into a single-magnetic-domain state in the X direction.

Further, to ensure the coupling of the ferromagnetic layers 9 and the free magnetic layer 6, the thickness of the ferromagnetic layers 9 must be increased. However, thick ferromagnetic layers 9 decreases the magnitude of the unidirectional anisotropic magnetic field of the ferromagnetic layers 9. Hence, a stable and sufficient longitudinal bias cannot be applied to the free magnetic layer 6. Moreover, when the thickness of the ferromagnetic layers 9 is increased, insensitive regions are generated at the two sides of the free magnetic layer 6, causing degradation of the read sensitivity.

SUMMARY OF THE INVENTION

It is an object of the present invention to overcome the problems of the conventional art by providing a method for manufacturing an exchange-bias type magnetic sensing element having an improved magnetic sensitivity in which a free magnetic layer is stably set in a single-magnetic-domain state in the X direction.

A first aspect of the present invention provides a method for manufacturing a magnetic sensing element, comprising the steps of:

(1a) forming a first composite comprising a first antiferromagnetic layer, a pinned magnetic layer, a nonmagnetic material layer, a free magnetic layer, and a nonmagnetic layer on a substrate;

(1b) annealing the first composite at a first annealing temperature in a magnetic field of a first magnitude to pin a magnetization direction of the pinned magnetic layer in a predetermined direction;

(1c) depositing a ferromagnetic layer and a second antiferromagnetic layer on the annealed first composite to form a second composite;

(1d) forming an indent having side faces penetrating the second antiferromagnetic layer and the ferromagnetic layer and a bottom portion lying in the nonmagnetic layer; and (1e) annealing the second composite at a second annealing temperature in a magnetic field of a second magnitude to pin a magnetization direction of the free magnetic layer in a direction substantially orthogonal to the magnetization direction of the pinned magnetic layer.

In step (c), the ferromagnetic layer and the second antiferromagnetic layer are deposited on a flat surface of the nonmagnetic layer. Thus, the ferromagnetic layer and the second antiferromagnetic layer can also have flat surfaces. As a result, the resulting synthetic ferrimagnetic structure comprising the ferromagnetic layer, the second antiferromagnetic layer, and the free magnetic layer can exhibit a large Ruderman-Kittel-Kasuya-Yosida (RKKY) interaction between the ferromagnetic layer and the free magnetic layer.

In the present invention, since the ferromagnetic layer and the second antiferromagnetic layer are deposited on the flat surface of the nonmagnetic layer, the deposition of the ferromagnetic layer and the second antiferromagnetic layer can be easily controlled. As a result, the resulting synthetic ferrimagnetic structure comprising the ferromagnetic layer, the second antiferromagnetic layer, and the free magnetic layer can have a thin ferromagnetic layer, thereby increasing the spin-flop magnetic field between the ferromagnetic layer and the free magnetic layer.

In the present invention, the free magnetic layer is extended to the regions under the ferromagnetic layer and the second antiferromagnetic layer. Thus, the influence on the magnetization of the free magnetic layer of the demagnetizing field generated by the surface magnetic charges at the two end portions of the free magnetic layer can be minimized.

In the present invention, since the magnetization direction of the pinned magnetic layer is pinned in a predetermined direction by field annealing the composite prior to depositing the second antiferromagnetic layer, no exchange anisotropic magnetic field is generated at the second antiferromagnetic layer when the second antiferromagnetic layer is deposited on the composite. Hence, the exchange anisotropic magnetic field of the second antiferromagnetic layer is generated in step (e) above to magnetize the free magnetic layer in a predetermined direction. The magnetization direction of the free magnetic layer can thus be easily pinned in a direction substantially orthogonal to the magnetization direction of the pinned magnetic layer.

The magnetic sensing element manufactured by the method of the present invention has a track width regulated by the width of the bottom portion of the indent. That is, the magnetization direction varies in response to an external field only at the region under the bottom portion of the indent. The indent is formed by milling the second antiferromagnetic layer having a uniform thickness in a direction perpendicular to the track width by means of reactive ion etching or ion milling; hence, the indent can have accurate dimensions. As a result, the track width of the magnetic sensing element can be accurately regulated.

In the magnetic sensing element manufactured by the present invention, the ferromagnetic layers deposited on the nonmagnetic layer and the second antiferromagnetic layers are deposited on the ferromagnetic layers. The ferromagnetic layers are separated from each other by a predetermined gap in the track width direction.

In the magnetic sensing element manufactured by the present invention, the magnetization direction of the ferromagnetic layer under the second antiferromagnetic layer is oriented in the track width direction as a result of magnetic coupling with the second ferromagnetic layer. The magnetization direction of the two side portions of the free magnetic layer covered by the ferromagnetic layers and the nonmagnetic layers is oriented in a direction antiparallel to the magnetization direction of the ferromagnetic layers due to the RKKY interaction with the ferromagnetic layers. That is, the ferromagnetic layer, the nonmagnetic layer, and the free magnetic layer form a synthetic ferrimagnetic structure under the second antiferromagnetic layer. The two side portions of the free magnetic layer covered by the second antiferromagnetic layers and the ferromagnetic layers are magnetized in a direction substantially orthogonal to the magnetization direction of the pinned magnetic layer.

In contrast, the region of the free magnetic layer not covered by the second antiferromagnetic layers and the ferromagnetic layers is magnetized antiparallel to the track width direction because of the magnetization of the two side portions in the absence of an applied external magnetic field. When an external magnetic field is applied in a direction perpendicular to the track width direction (the height direction), the magnetization direction shifts toward the height direction.

This shift in the magnetization direction of the free magnetic layer in the track width region relative to the pinned magnetization direction of the pinned magnetic layer changes the electrical resistance (magnetoresistive effect). The change in electrical resistance changes the voltage and an external magnetic field such as a magnetic field leaking from a recording medium can be detected.

In the present invention, the ferromagnetic layer, the nonmagnetic layer, and the free magnetic layer form a synthetic ferrimagnetic structure under the second antiferromagnetic layer. Thus, the unidirectional anisotropic magnetic field for magnetizing the two side portions of the free magnetic layer in a predetermined direction can be increased.

Thus, an increase in the magnetic track width due to the change in the magnetization direction of the two side portions of the free magnetic layer by the external field can be prevented.

Even when the exchange coupling magnetic field between the second antiferromagnetic layers and the ferromagnetic layers is relatively weak, the magnetization direction of the free magnetic layer can be reliably oriented in a direction substantially orthogonal to the magnetization direction of the pinned magnetic layer.

The track width (optical track width) region of the magnetic sensing element regulated by the width of the bottom portion of the indent in the track width direction effectively contributes to the reading of recording magnetic field and functions as a sensitive region.

In the present invention, the optical track width of the magnetic sensing element is equal to the magnetic track width, and no insensitive region is generated. Thus, the optical track width $T_w$ of the magnetic sensing element can be reduced to meet demand for higher recording density without degradation in read output.

The magnitude of the bias magnetic field applied to the free magnetic layer is substantially the same as the magnetic moment per unit area of the free magnetic field. Thus, the magnetic sensing element has an improved sensitivity and high output.

Since the free magnetic layer is extended to the regions covered by the second antiferromagnetic layers and the ferromagnetic layers, the influence of the demagnetizing field generated by the surface magnetic charges at the two end portions of the free magnetic layer on the magnetization of the free magnetic layer can be minimized.

A second aspect of the present invention provides a method for manufacturing a magnetic sensing element, comprising the steps of:

(2a) forming a first composite comprising a first antiferromagnetic layer, a pinned magnetic layer, a nonmagnetic material layer, a free magnetic layer, and a nonmagnetic layer on a substrate;

(2b) annealing the first composite at a first annealing temperature in a magnetic field of a first magnitude to pin the magnetization direction of the pinned magnetic layer in a predetermined direction;

(2c) depositing a ferromagnetic layer and a second antiferromagnetic layer on the annealed first composite to form a second composite;

(2d) forming an indent in the second antiferromagnetic layer, the indent having a bottom portion lying in the second antiferromagnetic layer; and (2e) annealing the resulting second composite at a second annealing temperature in a magnetic field of a second magnitude to pin the magnetization direction of the free magnetic layer in a direction substantially orthogonal to the magnetization direction of the pinned magnetic layer.

Step (1d) is replaced by step (2d). The bottom portion of the indent is located in the second antiferromagnetic layer. The free magnetic layer and the ferromagnetic layer are adjacent to each other with the nonmagnetic layer therebetween. The magnetization directions of the free magnetic layer and the ferromagnetic layer are antiparallel to each other, i.e., in a ferrimagnetic state.

Here, the composite comprising the free magnetic layer, the nonmagnetic layer, and the ferromagnetic layer functions as one free magnetic layer of a synthetic ferrimagnetic type. This type of free magnetic layer has the same advantages as those obtained by reducing the thickness of the free magnetic layer. That is, the magnetization direction of the free magnetic layer can be easily shifted, thereby improving the magnetic sensitivity of the resulting magnetoresistive element. The magnetic moment per unit area of the free magnetic layer must differ from that of the ferromagnetic layer. The magnitude of the magnetic moment per unit area of the free magnetic layer and the ferromagnetic layer is determined by multiplying the saturation magnetization $M_s$ of the ferromagnetic material and the layer thickness t.

The thickness of the region of the second antiferromagnetic layer under the bottom portion of the indent is preferably larger than about 0 Å but not larger than about 50 Å. At such a thickness, no exchange coupling magnetic field is generated between with the ferromagnetic layer.

A third aspect of the present invention provides a method for manufacturing a magnetic sensing element, comprising the steps of:

(3a) forming a first composite comprising a first antiferromagnetic layer, a pinned magnetic layer, a nonmagnetic material layer, a free magnetic layer, and a nonmagnetic layer on a substrate;

(3b) annealing the first composite at a first annealing temperature in a magnetic field of a first magnitude to pin the magnetization direction of the pinned magnetic layer in a predetermined direction;

(3c) depositing a ferromagnetic layer and a second antiferromagnetic layer on the annealed first composite to form a second composite;

(3d) forming an indent having side faces penetrating the second antiferromagnetic layer and a bottom portion lying in the ferromagnetic layer; and (3e) annealing the second composite at a second annealing temperature in a magnetic field of a second magnitude to pin the magnetization direction of the free magnetic layer in a direction substantially orthogonal to the magnetization direction of the pinned magnetic layer.

In this embodiment, step (1d) is replaced by step (3d). In this structure, the free magnetic layer, the nonmagnetic layer and the ferromagnetic layer form a composite which functions as one free magnetic layer of a synthetic ferrimagnetic type.

In the present invention, no second antiferromagnetic layer is provided above the track width region of the free magnetic layer in which the magnetization direction changes in response to an external magnetic field. Thus, the track width region of the free magnetic layer is sensitive to the external magnetic field, and the magnetic sensitivity of the resulting magnetic sensing element can be improved.

In the present invention, the side faces of the indent may be perpendicular to the track width direction. In this manner, the second antiferromagnetic layer can have sufficient thickness at all regions outside the track width region for generating a sufficient antiferromagnetism to reliably pin the magnetization direction of the free magnetic layer.

Hence, the magnetization direction of the free magnetic layer is rotatable only in the track width region of the magnetic sensing element. This prevents side reading in the vicinity of the track width region.

In the present invention, the step of depositing a pair of electrode layers on the second antiferromagnetic layer may be included to make a magnetic sensing element in which an electrical current flows in a direction parallel to the surface of each layer constituting the composite. Here, the pair of electrode layers are separated from each other by a gap in the track width direction.

In the present invention, the pair of electrode layers may be deposited in each of the steps (1d), (2d), or (3d) above. The portion of the second antiferromagnetic layer between the electrode layers is milled to form an indent having a bottom portion having the same width as the track width.

When the indent is milled using the pair of electrode layers as a mask, the end faces opposing the track width region of the electrode layers can be continuous with the end faces of the second antiferromagnetic layers.

Alternatively, a pair of first resist layers may be formed on the second antiferromagnetic layer in each of the steps (1d), (2d), or (3d) above. The pair of first resist layers are separated from each other by a gap in the track width direction. The portion of the second antiferromagnetic layer between the first resist layers is milled to form an indent.

After the indent is formed and the first resist layers are removed, the steps of (4a) forming a second resist layer in the indent and on the second antiferromagnetic layers near the opening of the indent;

(4b) depositing electrode layers on the regions of the second antiferromagnetic layers not covered by the second resist layer; and (4c) removing the second resist layer, may be performed.

After the indent is formed using the first resist layers as a mask in step (1d), the electrode layers may be formed using the second resist layer formed in step (4a).

The magnetic sensing element made according to the present invention may include an upper shield layer and a lower shield layer at the top and the bottom portions of the element separated from the rest of the magnetic sensing element by gap layers.

When the end faces of the electrode layers opposing the track width region are closer to the outer edges of the composite than the end faces of the second antiferromagnetic layers opposing the track width region are to the outer edges of the composite, the step differences formed by the upper surface of the track width region of the nonmagnetic layer and the upper faces of the electrode layers and the second antiferromagnetic layers can be minimized. Thus, even when the thickness of the gap layer at the top is reduced, the gap layer can be reliably formed on the step differences. That is, short-circuiting between the upper shield layer and the electrode layers, the second antiferromagnetic layers, the ferromagnetic layers, and the nonmagnetic layer can be securely prevented. A magnetic sensing element which can sufficiently meet the need for narrow gaps can be obtained.

Moreover, if the distance between the upper shield layer and the lower shield layer is large at the two side regions of the track width region, a magnetic field from a recording medium generated from the tracks adjacent to the target recording track readily enters the magnetic sensing element through the region between the upper shield layer and the lower shield layer. This increases the effective track width and results in cross-talks between recording tracks.

As described above, the step differences formed by the upper surfaces of the nonmagnetic layer at the track width region and the upper surfaces of the electrode layers and the second antiferromagnetic layers can be decreased, the distance between the lower shield layer and the upper shield layer at two side portions of the track width region can be minimized, and the effective track width can be reduced.

In the present invention the steps of (5a) forming a second resist layer on the bottom portion of the indent, the width of the bottom portion of the second resist layer in the track width direction being smaller than that of the bottom portion of the indent;

(5b) depositing electrode layers in the indent and over the second antiferromagnetic layers; and (5c) removing the second resist layer, may be included after the indent is formed and the first resist layers are removed in step (1d), (2d), or (3d).

By forming the electrode layers using the second resist layer formed in step (5a) as a mask after step (1d), (2d), or (3d), a magnetic sensing element in which the electrode layers are deposited on the second antiferromagnetic layers can be made. The end faces of the electrode layers opposing the track width regions are closer to the center of the composite than the end faces of the ferromagnetic layers and the second antiferromagnetic layers are to the center of the composite.

The ferromagnetic layer and the second antiferromagnetic layer are composed of a material having a specific resistance larger than that of the electrode layers. When the electrode layers are deposited only on the ferromagnetic layer and the second antiferromagnetic layer, a direct current supplied to the electrode layers flows into the nonmagnetic layer, the free magnetic layer, the nonmagnetic material layer, and the pinned magnetic layer via the ferromagnetic layer and the second antiferromagnetic layers. This increases the DC resistance of the magnetic sensing element.

When the end faces of the electrode layers opposing the track width regions are closer to the center of the composite than the end faces of the ferromagnetic layers and the second antiferromagnetic layers are to the center of the composite, the end faces of the electrode layers are extended onto the nonmagnetic layer. The DC current supplied to the electrode layers can be supplied without having to pass through the ferromagnetic layer and the second antiferromagnetic layer. Thus, the DC resistance of the magnetic sensing element can be minimized.

Moreover, when the end faces of the electrode layers are extended onto the nonmagnetic layer, the track width $T_w$ of the magnetic sensing element is regulated by the distance between these end faces of the electrode layer. Thus, the change in the track width $T_w$ can be prevented even when the change in the composition of the second antiferromagnetic layers or sagging of the layers occur in the vicinity of the end faces of the second antiferromagnetic layers.

According to other aspects of the present invention, a magnetic sensing element of a current-perpendicular-to-plane (CPP) type can be manufactured.

According to a fourth aspect of the present invention, a CPP-type magnetic sensing element may be manufactured using the following steps:

(6a) forming a lower electrode layer on a substrate;

(6b) forming a first composite comprising a first antiferromagnetic layer, a pinned magnetic layer, a nonmagnetic material layer, a free magnetic layer, and a nonmagnetic layer on the lower electrode layer;

(6c) annealing the first composite at a first annealing temperature in a magnetic field of a first magnitude so as to pin the magnetization direction of the pinned magnetic layer in a predetermined direction;

(6d) depositing a ferromagnetic layer and a second antiferromagnetic layer on the annealed first composite so as to form a second composite;

(6e) depositing a first insulating layer on the second antiferromagnetic layer;

(6f) depositing a resist layer having an opening at the center in the track width direction on the first insulating layer and milling the portion of the first insulating layer and the second antiferromagnetic layer exposed by the opening so as to form an indent;

(6g) depositing an upper electrode layer on a bottom portion of the indent so as to form a second composite;

(6h) annealing the second composite at a second annealing temperature in a magnetic field of a second magnitude to pin the magnetization direction of the free magnetic layer in a direction substantially orthogonal to the magnetization direction of the pinned magnetic layer.

According to the fourth aspect of the invention, the first insulating layer is formed on the second antiferromagnetic layers to reduce shunting of the sensing current from the upper electrode layer to the second antiferromagnetic layers.

Moreover, since part of the upper electrode layer extends inside the indent, the path of the sensing current can be narrowed to improve output and reduce the side reading.

Preferably, after step (6f) and before step (6g), the steps of:

(7a) depositing a second insulating layer over the indent and the first insulating layers; and (7b) removing a portion of the second insulating layer deposited on the bottom portion of the indent may be performed to insulate the side faces of the indent and the upper electrode layer.

Preferably, after step (6a) and before step (6b), the following steps are performed:

(8a) forming a protrusion at the center of the lower electrode layer in the track width direction, the protrusion projecting toward the region where the first composite is to be formed; and (8b) forming third insulating layers on two side portions of the lower electrode layer in the track width direction, the two side portions being arranged beside the protrusion. Preferably, in step (6b), the lower surface of the first composite is in contact with the upper surface of the protrusion to limit the path of the sensing current, improve output, and prevent side reading.

Step (8b) preferably further includes planarizing the upper surface of the protrusion and the upper surfaces of the third insulating layers formed on the two side portions of the lower electrode layer so that the composite can be formed on the planarized surface.

Preferably, at least one of the lower electrode layer and the upper electrode layer is composed of a magnetic material so that the layer can also function as the shield layer, thereby simplifying the structure of the magnetic sensing element and manufacturing method. Moreover, the gap length can be reduced, and a magnetic sensing element that can meet the demands for higher recording density can be made.

Preferably, the upper electrode layer includes a nonmagnetic conductive sublayer and a magnetic sublayer, the nonmagnetic conductive sublayer being electrically connected to the bottom portion of the indent. With this structure, the magnetic influence of the magnetic sublayer of the upper electrode layer to the free magnetic layer can be minimized.

The nonmagnetic material layer preferably comprises a nonmagnetic conductive material. The magnetic sensing element having a nonmagnetic material layer comprising a nonmagnetic conductive material is called a spin-valve GMR magnetoresistive element (CPP-GMR).

In the present invention, when the magnetic sensing element is of a CPP type, the nonmagnetic material layer may be composed of an insulating material. Such a magnetic sensing element is called a spin-valve tunneling magnetoresistive material (CPP-TMR).

In step (6h), the second annealing temperature is preferably lower than the blocking temperature of the first antiferromagnetic layer, and the second magnitude of the magnetic field is smaller than the exchange anisotropic magnetic field of the first antiferromagnetic layer.

In step (3a) or (6b) above, the nonmagnetic layer may comprise a conductive material. Thus, the nonmagnetic material may function as a back layer exhibiting a spin-filter effect (described below), and the sensitivity of the magnetic sensing element can be improved.

The nonmagnetic layer preferably comprises at least one element selected from the group consisting of Ru, Rh, Ir, Re, and Os. Since the surface of such a nonmagnetic layer is rarely oxidized during the step (b), the surface of the nonmagnetic layer does not have to be treated, i.e., milled, prior to the sputter deposition of the ferromagnetic layer. In addition, the RKKY interaction can still arise between the free magnetic layer and the ferromagnetic layer through the nonmagnetic layer.

Since the interfaces of the nonmagnetic layer and the ferromagnetic layer is not subjected to milling, a decrease in the unidirectional anisotropic magnetic field for orienting the magnetization direction at the two side portions of the free magnetic layer in a predetermined direction can be prevented.

However, since the ferromagnetic layer and the free magnetic layer are magnetically coupled by the RKKY interaction through the nonmagnetic layer therebetween, a sufficient unidirectional anisotropic magnetic field for magnetizing the free magnetic layer in a particular direction can still be obtained even when the surface of the nonmagnetic layer is milled.

The nonmagnetic layer preferably comprises Ru and has a thickness of about 0.8 to about 1.1 nm since the RKKY interaction between the ferromagnetic layer and the free magnetic layer can be enhanced. More preferably, the thickness is about 0.85 to about 0.9 nm.

In step (3a) or (6b) above, a conductive layer is preferably formed between the nonmagnetic layer and the free magnetic layer. The conductive layer may be composed of a conductive material having a specific resistance lower than that of the nonmagnetic layer. In this manner, a large spin-filter effect can be achieved compared with the case where only the nonmagnetic layer is provided, and the sensitivity of the magnetic sensing element can be further improved.

When the conductive layer is formed, the nonmagnetic layer is preferably composed of Ru and has a thickness of about 0.4 to about 1.1 nm, and the conductive layer is preferably composed of Cu and has a thickness of about 0.3 to about 0.5 nm.

When the nonmagnetic layer in contact with the upper surface of the free magnetic layer is composed of a conductive material or when the conductive layer is disposed between the nonmagnetic layer and the free magnetic layer, the nonmagnetic layer can function as a back layer that exhibits the spin-filter effect.

When a sensing current is applied to the spin-valve magnetic sensing element, conduction electrons mainly travel in the vicinity of the nonmagnetic material layer having a low electrical resistance. The conduction electrons can be classified into spin-up electrons and spin-down electrons that exist in statistically equal amounts.

The rate of change in resistance has a positive correlation with the change in the effective mean free path of the spin-up electrons.

The spin-down conduction electrons are always scattered at the interface between the nonmagnetic material layer and the free magnetic layer regardless of the direction of the external magnetic field applied. The probability of the spin-down electrons moving into the free magnetic layer is low, and its mean free path is shorter compared to that of the spin-up conduction electrons.

When the magnetization direction of the free magnetic layer becomes parallel to the magnetization direction of the pinned magnetic layer due to an external magnetic field, the probability of the spin-up conduction electrons traveling from the nonmagnetic material layer to the free magnetic layer increases, and the mean free path is extended. When the magnetization direction of the free magnetic layer changes from a direction due to an external magnetic field, the probability of the spin-up conduction electrons scattering at the interface between the nonmagnetic material layer and the free magnetic layer increases, and the mean free path of the spin-up conduction electrons is reduced.

As described above, the external magnetic field dramatically changes the mean free path of the spin-up conduction electrons compared to that of the spin-down conduction electrons, and the difference in the mean free path between the spin-up conduction electrons and the spin-down conduction electrons dramatically changes. Thus, the resistance of the element as a whole, which is a parallel circuit of the resistance of spin-up electrons and spin-down electrons, changes dramatically, and the rate of change in magnetoresistance ($\Delta R/R$) of the spin-valve magnetic sensing element can be further improved.

If the back layer is connected to the free magnetic layer, spin-up conduction electrons traveling in the free magnetic layer can move into the back layer, thereby further extending the mean free path of spin-up conduction electrons in proportion to the thickness of the back layer. Thus, the spin-filter effect can be generated, the difference in the mean free path of spin-down and spin-up conduction electrons can be increased, and the rate of change in magnetoresistance ($\Delta R/R$) of the spin-valve magnetic sensing element can be further improved.

Preferably, the thickness of the free magnetic layer is in the range of about 1.5 to 4.5 nm.

An increase in the difference in mean free path of the spin-up and spin-down conduction electrons can exhibit an enhanced effect when the thickness of the free magnetic layer is relatively small.

If the thickness of the free magnetic layer is less than about 1.5 nm, it may not sufficiently function as the ferromagnetic layer and may not exhibit sufficient magnetoresistive effect. Moreover, some conduction electrons may undergo diffusive scattering instead of specular reflection, thereby degrading the rate of change in resistance.

When the thickness of the free magnetic layer 17 is larger than about 4.5 nm, the number of spin-up conduction electrons that are scattered before reaching the nonmagnetic layer 18 increases. As a result, the percentage change in the rate of change in resistance due to the spin-filter effect decreases, which is a problem.

In step (3a) or (6b) above, the pinned magnetic layer is preferably formed by depositing a plurality of ferromagnetic sublayers having different magnitudes of the magnetic moment per unit area with a nonmagnetic intermediate sublayer therebetween. The magnetization directions of the ferromagnetic sublayers are antiparallel to each other, i.e., in a ferrimagnetic state.

As a result, the ferromagnetic sublayers mutually pin the magnetization direction of each other, thereby firmly pinning the magnetization direction of the overall pinned magnetic layer in a particular direction. A large exchange coupling magnetic field $H_{ex}$ can be obtained between the first antiferromagnetic layer and the pinned magnetic layer.

Moreover, the demagnetizing field, i.e., the dipole magnetic field, caused by the pinned magnetization of the pinned magnetic layer can be cancelled since the static magnetic fields of these ferromagnetic sublayers cancel out each other. Thus, the influence of the demagnetizing field (dipole magnetic field) due to the pinned magnetization of the pinned magnetic layer on the variable magnetization of the free magnetic layer can be reduced.

Thus, the variable magnetization direction of the free magnetic layer can be easily corrected to a desired magnetization direction, and a magnetic sensing element having superior symmetrical properties, i.e., small asymmetry, can be obtained.

The term asymmetry indicates the degree of asymmetry of the output waveform. When an output waveform has a symmetrical waveform, it has a small asymmetry. The closer the asymmetry is to zero, the better the symmetry of the output waveform.

The asymmetry is zero when the direction of the variable magnetization of the free magnetic layer is orthogonal to the magnetization direction of the pinned magnetic layer. When the asymmetry is large, information from a recording medium cannot be read accurately, thereby causing errors. Thus, a spin-valve magnetic sensing element preferably has a small asymmetry to improve the reliability in read signal processing.

The demagnetizing field (dipole magnetic field) $H_d$ due to the pinned magnetization of the pinned magnetic layer has a nonuniform distribution. The demagnetizing field is larger at the end portions and smaller at the central portions, which prevents the free magnetic layer from being set to a single-magnetic-domain state. This problem can be overcome by forming the pinned magnetic layer as above since the dipole magnetic field $H_d$ can be completely removed, and domain walls are not formed in the free magnetic layer. Thus, generation of nonuniform magnetization and Barkhausen noise can be prevented.

In step (3a) or (6b) above, the free magnetic layer is preferably formed by depositing a plurality of ferromagnetic sublayers having different magnitudes of magnetic moment per unit area with a nonmagnetic intermediate sublayer therebetween, the magnetization directions of the ferromagnetic sublayers being antiparallel to each other, i.e., in a ferrimagnetic state. In this manner, the same advantages as those achieved when the thickness of the free magnetic layer is reduced can be obtained.

The magnitude of the magnetic moment per unit area of the ferromagnetic layers is determined by multiplying the saturation magnetization $M_s$ of the ferromagnetic material and the layer thickness t.

The nonmagnetic intermediate sublayer preferably comprises at least one element selected from the group consisting of Ru, Rh, Ir, Os, Cr, Re, and Cu.

In the present invention, preferably, at least one of the ferromagnetic layer and the free magnetic layer comprises a CoFeNi alloy containing from about 9 to about 17 atomic percent Fe, from about 0.5 to about 10 atomic percent Ni, and the balance being Co.

In the present invention, an intermediate layer composed of a CoFe alloy or Co may be formed between the free magnetic layer and the nonmagnetic material layer. When the intermediate layer is formed, at least one of the ferromagnetic layer and the free magnetic layer is preferably composed of a magnetic material represented by CoFeNi containing from about 7 to about 15 atomic percent Fe, from about 5 to about 15 atomic percent Ni, and the balance being Co. Both the ferromagnetic layer and the free magnetic layer are preferably composed of the above material In the present invention, the ferromagnetic layer, the nonmagnetic layer, and the free magnetic layer form a ferrimagnetic structure under the second antiferromagnetic layers. The ferromagnetic layer and the free magnetic layer are magnetized antiparallel to each other through the nonmagnetic layer therebetween so as to enter a ferrimagnetic state. To properly maintain the antiparallel state, the exchange coupling magnetic field in the RKKY interaction arising between the ferromagnetic layer and the free magnetic layer must be increased. This can be achieved by using a NiFe alloy as a magnetic material for forming the ferromagnetic layer and the free magnetic layer. A NiFe alloy has superior soft magnetic property and has been used in forming a free magnetic layer. However, when the ferrimagnetic composite is formed by stacking the ferromagnetic layer and the free magnetic layer made of a NiFe alloy, the antiparallel coupling between these layers is not sufficiently strong.

To strengthen the antiparallel coupling between these layers, firmly pin the magnetization of the two side portions of the free magnetic layer in the track width direction, and prevent side reading, a CoFeNi alloy is preferably used for forming at least one, preferably both, of the ferromagnetic layer and the free magnetic layer. Cobalt enhances the antiparallel coupling between these layers.

FIG. 18 is a graph that shows a hysteresis loop of a ferrimagnetic composite formed by depositing ferromagnetic thin films with a nonmagnetic layer therebetween. For example, the magnetic moment per unit area of a first ferromagnetic sublayer F1, i.e., the product of the saturation magnetization $M_s$ and layer thickness t, is larger than that of a second ferromagnetic sublayer F2. An applied external magnetic field pointing to the right is shown in the drawing.

The combined magnetic moment per unit area of the first ferromagnetic sublayer and the second ferromagnetic sublayer is constant up to a point when an applied external magnetic field is increased. In an external magnetic field region A in which the combined magnetic moment per unit area is constant, the antiparallel coupling force arising between the first and second ferromagnetic sublayers is stronger than the external magnetic field. Thus, the first and second ferromagnetic sublayers are properly set in a single-magnetic-domain state antiparallel to each other.

As the external magnetic field increases towards the right in the drawing, the combined magnetic moment per unit area of the ferromagnetic sublayers increases with the angle. This is because the external magnetic field is stronger than the antiparallel coupling force operating between the first and the second ferromagnetic sublayers. As a result, the first and second ferromagnetic sublayers no longer maintain the single-magnetic-domain state, and the combined magnetic moment per unit area which is the sum of the vectors starts to increase.

In an external magnetic field region B in which the combined magnetic moment per unit area is large, the ferromagnetic sublayers are no longer antiparallel to each other. The magnitude of the external magnetic field at the point at which the combined magnetic moment per unit area starts to increase is known as spin-flop magnetic field $H_{sf}$.

If the external magnetic field is further increased towards the right in the drawing, the first and second ferromagnetic sublayers reverts to a single-magnetic-domain state. Unlike in the external magnetic field region A, the ferromagnetic sublayers are magnetized to the right in the drawing, and the combined magnetic moment per unit area in an external magnetic field region C is constant. The magnitude of the external magnetic field at the point which the combined magnetic moment per unit area becomes constant is known as the saturation magnetic field (Hs).

When a CoFeNi alloy is used in the first and second ferromagnetic sublayers, the spin-flop magnetic field Hsf can be sufficiently made larger than when a NiFe alloy is used.

The spin-flop magnetic fields of the first and second ferromagnetic sublayers composed of a NiFe alloy and those composed of a CoFeNi alloy were compared using the following layer arrangement and thickness: substrate/nonmagnetic material layer (Cu)/first ferromagnetic sublayer (2.4 nm)/nonmagnetic layer (Ru)/second ferromagnetic sublayer (1.4 nm).

In the first case, the first and second ferromagnetic sublayers were composed of a NiFe alloy containing about 80 atomic percent Ni and about 20 atomic percent Fe. The spin-flop magnetic field $H_{sf}$ was approximately 59 kA/m.

In the second case, the first and second ferromagnetic sublayers were composed of a CoFeNi alloy containing about 87 atomic percent Co, about 11 atomic percent Fe, and about 2 atomic percent Ni. The spin-flop magnetic field $H_{sf}$ was approximately 293 kA/m.

Test results show that the spin-flop magnetic field can be effectively improved using a CoFeNi alloy in the first and second ferromagnetic sublayers instead of a NiFe alloy.

Thus, preferably at least one, more preferably both, of the ferromagnetic layer and the free magnetic layer comprises a CoFeNi alloy in order to effectively increase the spin-flop magnetic field of these layers.

The relative superiority of the CoFeNi alloy may be explained as follows. When the CoFeNi alloy comes into contact with the nonmagnetic Ru layer, the magnetostriction is known to shift toward the positive side by about $1 \times 6^{-6}$ to about $6 \times 10^{-6}$ compared to when a NiFe alloy is used. Preferably, the magnetostriction is in the range of about $-3 \times 10^{-6}$ to about $3 \times 10^{-6}$ and the coercive force is about 790 A/m or less. A large magnetostriction gives rise to significant adverse effects from stress caused by torsion during deposition and the difference in thermal coefficient between layers. The coercive force is preferably small since the magnetization direction of the free magnetic layer easily rotates in response to an external magnetic field.

In the present invention, when the layers are deposited in the order of nonmagnetic layer/free magnetic layer/nonmagnetic layer/ferromagnetic layer, the CoFeNi alloy preferably contains from about 9 to about 17 atomic percent Fe and from about 0.5 to about 10 atomic percent Ni, the balance being Co. If the Fe content exceeds about 17 atomic percent, the magnetostriction becomes smaller than about $-3 \times 10^{-6}$, and the soft magnetic property is degraded.

When the Fe content is less than about 9 atomic percent, the magnetostriction becomes larger than about $3 \times 10^{-6}$, and the soft magnetic property is degraded.

When the Ni content exceeds about 10 atomic percent, the magnetostriction becomes larger than about $3 \times 10^{-6}$, and a change in resistance (ΔR) and a rate of change in resistance (ΔR/R) are degraded due to Ni diffusion. When the Ni content is less than about 0.5 atomic percent, the magnetostriction becomes smaller than about $-3 \times 10^{-6}$, which is undesirable.

The coercive force can be adjusted at about 790 A/m or less if the composition of the layer is within the above ranges.

When the intermediate layer composed of a CoFe alloy or elemental Co is formed between the free magnetic layer and the nonmagnetic material layer, i.e., when the layers are deposited in the order of nonmagnetic layer/intermediate layer (a CoFeNi alloy)/free magnetic layer/nonmagnetic layer/ferromagnetic layer, the CoFeNi alloy preferably contains from about 7 to about 15 atomic percent Fe and from about 5 to about 15 atomic percent Ni, the balance being Co.

At an Fe content exceeding about 15 atomic percent, the magnetostriction becomes smaller than about $-3 \times 10^{-6}$, and the soft magnetic property is degraded.

At an Fe content of less than about 7 atomic percent, the magnetostriction becomes larger than about $3 \times 10^{-6}$, and the soft magnetic property is also degraded.

At a Ni content exceeding about 15 atomic percent, the magnetostriction becomes larger than about $3 \times 10^{-6}$, which is undesirable.

At a Ni content less than about 5 atomic percent, the magnetostriction becomes smaller than about $-3 \times 10^{-6}$, which again is undesirable.

The coercive force can be decreased to about 790 A/m or less if the above composition ranges are satisfied.

Since the intermediate layer composed of CoFe or Co has a negative magnetostriction, the Fe content in the CoFeNi alloy is lower and the Ni content is higher compared to the structure in which no intermediate layer is formed.

When the intermediate layer composed of a CoFe alloy or elemental Co is provided between the nonmagnetic material layer and the free magnetic layer, diffusion of metals between the free magnetic layer and the nonmagnetic material layer can be more effectively prevented. According to this structure, the magnetization direction of the first antiferromagnetic layer can be easily oriented in a direction substantially orthogonal to that of the second antiferromagnetic layer even if these layers are formed of the same antiferromagnetic material. Thus, the magnetization direction of the free magnetic layer can be substantially orthogonal to that of the pinned magnetic layer when no external magnetic field is applied.

At least one of the first and second antiferromagnetic layers is preferably formed of a PtMn alloy, a X—Mn alloy, and a Pt—Mn—X' alloy, wherein X is at least one element selected from the group consisting of Pd, Ir, Rh, Ru, Os, Ni, and Fe and X' is at least one element selected from the group consisting of Pd, Ir, Rh, Ru, Au, Ag, Os, Cr, Ni, Ar, Ne, Xe, and Kr.

In the PtMn alloy or the X—Mn alloy described above, the Pt or X content is preferably in the range of from about 37 to 63 atomic percent.

In the Pt—Mn—X' alloy, the X'+Pt content is preferably in the range of from about 37 to 63 atomic percent, and the X' content is in the range of from about 0.2 to about 10 atomic percent. However, when the X' is at least one of Pd, Ir, Rh, Ru, Os, Ni, and Fe, the X' content is preferably in the range of from about 0.2 to about 40 atomic percent.

By annealing the first and second antiferromagnetic layers composed of the above-described alloy, a large exchange coupling magnetic field can be generated between the first and second antiferromagnetic layers. Especially when a PtMn alloy is used, the first and second antiferromagnetic layers produces an exchange coupling magnetic field of about 48 kA/m or more, for example, about 64 kA/m, and exhibits a significantly high blocking temperature of about 380° C. The blocking temperature is a temperature at which the exchange coupling magnetic field vanishes.

These alloys have disordered face-centered cubic (fcc) structure after deposition and before annealing. Annealing transforms this structure into a CuAuI-type ordered face-centered tetragonal (fct) structure. Preferably, step (a) above is performed in the same vacuum deposition apparatus.

DESCRIPTION OF THE PREFERRED EMBODIMENTS

First Embodiment

FIGS. 1–5 are diagrams that illustrate a method for manufacturing a magnetic sensing element according to a first embodiment of the present invention. FIGS. 1–5 are cross-sectional views of the magnetic sensing element in the course of manufacture, as viewed from the opposing face of the element.

If the magnetic sensing element is to be incorporated into a floating head, a lower shield layer is formed on a trailing end face of a ceramic slider with an insulating film, such as an $Al_2O_3$ film, therebetween.

Figure 1:
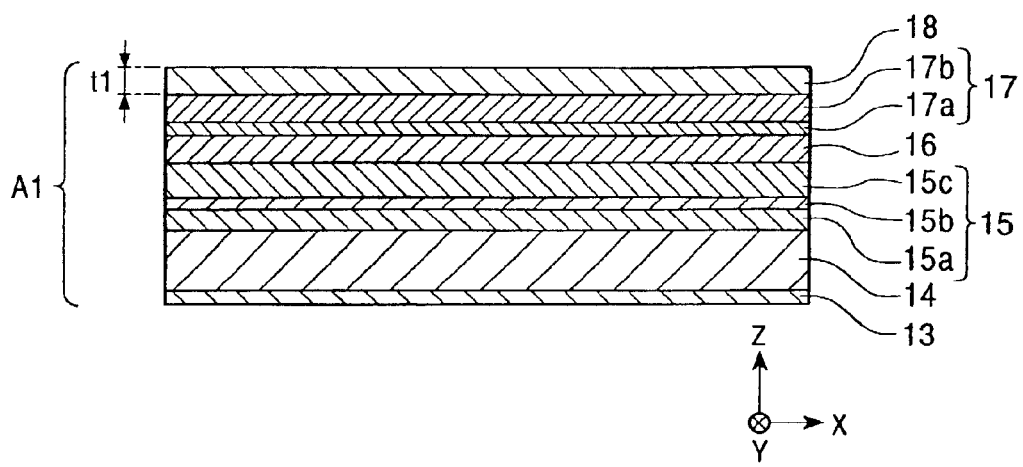
FIG. 1 is a cross-sectional view of a magnetic sensing element prepared according to a first embodiment of the present invention.

In the step shown in FIG. 1, a first antiferromagnetic layer 14 is deposited on a base layer 13. A pinned magnetic layer 15 of a synthetic ferrimagnetic pinned type is then deposited on the first antiferromagnetic layer 14. The pinned magnetic layer 15 is constituted from a first pinned magnetic sublayer 15a, a nonmagnetic intermediate sublayer 15b, and a second pinned magnetic sublayer 15c. A nonmagnetic material layer 16, a free magnetic layer 17, and a nonmagnetic layer 18 are deposited on the pinned magnetic layer 15 in that order. The layers from the base layer 13 to the nonmagnetic layer 18 constitute a composite A1. These layers are sequentially deposited using the same vacuum deposition apparatus by a thin-film forming process such as sputtering or vapor deposition.

The base layer 13 is made of Ta, for example. Alternatively, a seed layer composed of NiFeCr or Cr may be formed instead of the base layer 13 or between the base layer 13 and the first antiferromagnetic layer 14. The seed layer adjusts the crystal orientation of the first antiferromagnetic layer 14.

The first antiferromagnetic layer 14 is composed of a PtMn alloy, an X—Mn alloy, or a Pt—Mn—X' alloy, wherein X is at least one element selected from the group consisting of Pd, Ir, Rh, Ru, Os, Ni, and Fe and X' is at least one element selected from the group consisting of Pd, Ir, Rh, Ru, Au, Ag, Os, Cr, Ni, Ar, Ne, Xe, and Kr.

These alloys have a disordered face-centered cubic (fcc) structure after deposition and before annealing. The structure of these alloys transforms into a CuAuI-type ordered face-centered tetragonal (fct) structure by annealing.

The thickness of the first antiferromagnetic layer 14 in the vicinity of the center in the track width direction is 8 to 30 nm.

The first pinned magnetic sublayer 15a and the second pinned magnetic sublayer 15c are made of a ferromagnetic material. Examples of ferromagnetic materials include a NiFe alloy, elemental Co, a CoNiFe alloy, a CoFe alloy, and CoNi alloy. A NiFe alloy, a CoFe alloy and elemental Co are particularly preferable. The first pinned magnetic sublayer 15a and the second pinned magnetic sublayer 15c are preferably made of the same material.

Preferably, the nonmagnetic intermediate sublayer 15b is made of a nonmagnetic material and preferably comprises at least one element selected from the group consisting of Ru, Rh, Ir, Os, Cr, Re, and Cu. The nonmagnetic intermediate sublayer 15b is more preferably made of Ru.

The nonmagnetic material layer 16 prevents magnetic coupling of the pinned magnetic layer 15 and the free magnetic layer 17. Since a sense current mainly flows in the nonmagnetic material layer 16, the nonmagnetic material layer 16 is preferably made of a conductive nonmagnetic material such as Cu, Cr, Au, or Ag, and more preferably, made of Cu.

The free magnetic layer 17 is constituted from an anti-diffusion sublayer (intermediate sublayer) 17a and a magnetic sublayer 17b. The anti-diffusion sublayer 17a is made of a ferromagnetic material such as Co or CoFe. The anti-diffusion sublayer 17a prevents interdiffusion between the magnetic sublayer 17b and the nonmagnetic material layer 16. The magnetic sublayer 17b is made of a ferromagnetic material such as a NiFe alloy, elemental Co, a CoFeNi alloy, a CoFe alloy, or a CoNi alloy. Alternatively, the free magnetic layer 17 may be formed as a single magnetic layer.

When the anti-diffusion sublayer 17a is formed as in this embodiment, the magnetic sublayer 17b of the free magnetic layer 17 is preferably made of a magnetic CoFeNi alloy containing from about 7 to about 15 atomic percent Fe, and from 5 to about 15 atomic percent Ni, the balance being Co. In this manner, an exchange coupling magnetic field generated by the Ruderman-Kittel-Kasuya-Yosida (RKKY) interaction between the free magnetic layer 17 and ferromagnetic layers 19 shown in FIG. 5 can be increased. As a result, the spin-flop magnetic field $H_{sf}$ can be increased to as much as approximately 293 kA/m.

Figure 5:
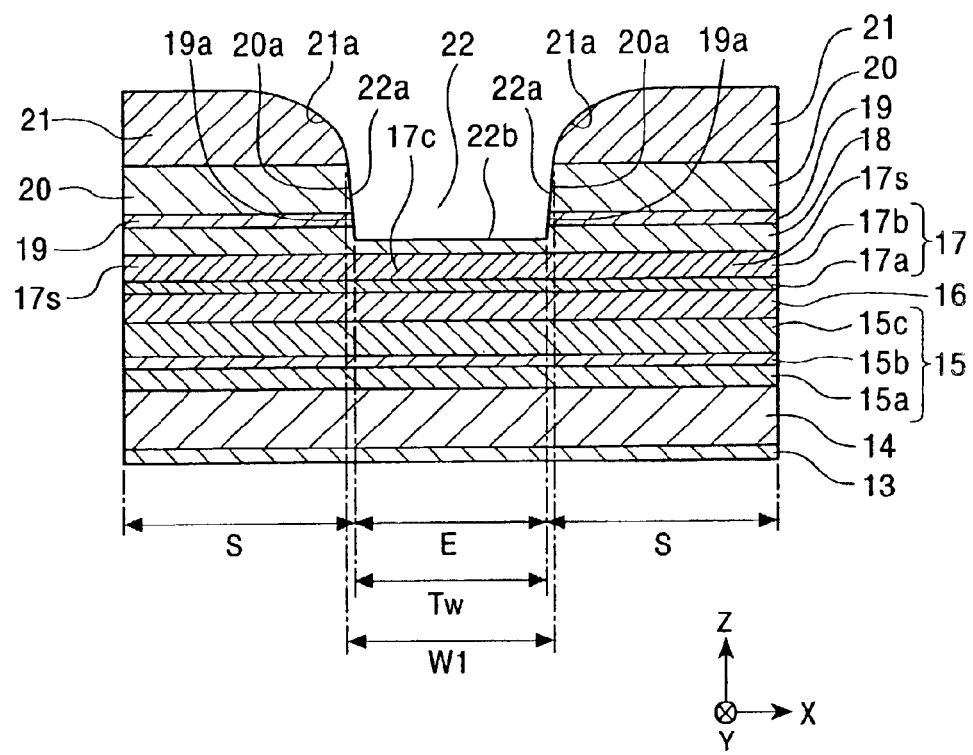
FIG. 5 is a cross-sectional view of a magnetic sensing element prepared using a step following the one performed in FIG. 4.

Further, with the above composition, the magnetostriction of the ferromagnetic layers 19 shown in FIG. 5 and the magnetic sublayer 17b of the free magnetic layer 17 can be controlled in the range of from about $-3 \times 10^{-6}$ to about $3 \times 10^{-6}$ and the coercive force can be decreased to about 790 A/m or less. Moreover, the soft magnetic property of the free magnetic layer 17 can be improved, and a change in resistance ($\Delta R$) and a rate of change in resistance ($\Delta R/R$) due to diffusion of Ni contained in the magnetic sublayer 17b into the anti-diffusion sublayer 17a and the nonmagnetic material layer 16 can be suitably controlled.

When the free magnetic layer 17 is formed as a single layer, the free magnetic layer 17 is preferably composed of a ferromagnetic material represented by CoFeNi containing from about 9 to about 17 atomic percent Fe, and from about 0.5 to about 10 atomic percent Ni, the balance being Co.

The nonmagnetic layer 18 is composed of at least one element selected from the group consisting of Ru, Rh, Ir, Re, and Os. When the nonmagnetic layer 18 is made of Ru, the thickness $t_1$ of the nonmagnetic layer 18 is preferably adjusted to about 0.8 to about 1.1 nm, and more preferably, from about 0.85 to about 0.9 nm, so as to enhance the RKKY interaction between the ferromagnetic layers 19 and the free magnetic layer 17.

Next, the composite A1 is subjected to a first field annealing at a first annealing temperature using a magnetic field of a first magnitude in the Y direction to generate an exchange anisotropic magnetic field between the first antiferromagnetic layer 14 and the first pinned magnetic sublayer 15a, and to pin the magnetization direction of the pinned magnetic layer 15 in the Y direction in the drawing. In this embodiment, the first annealing temperature is about 270° C., and the first magnitude of the magnetic field is about 800 kA/m.

Figure 2:
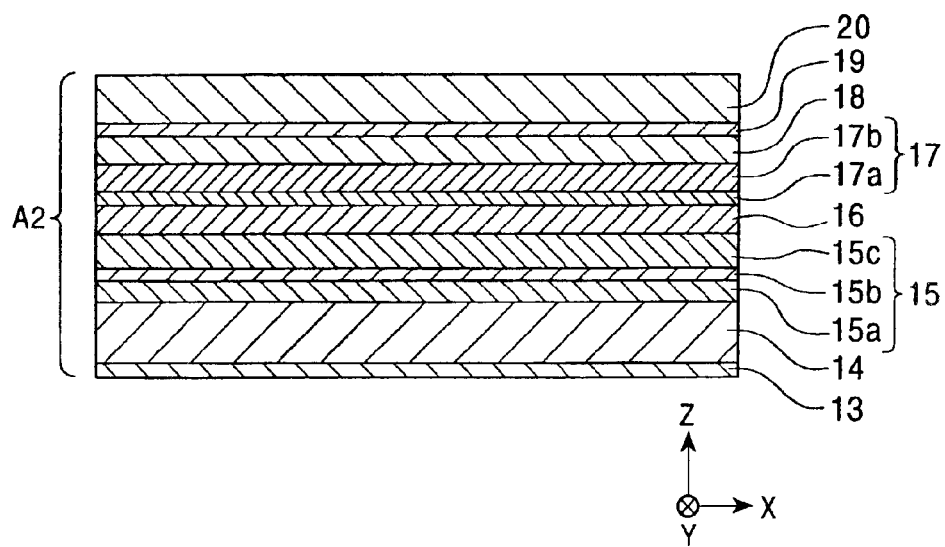
FIG. 2 is a cross-sectional view of a magnetic sensing element prepared using a step following the one performed in FIG. 1.

As shown in FIG. 2, a ferromagnetic layer 19 and a second antiferromagnetic layer 20 are sequentially deposited by sputtering to make a composite A2 including the layers from the base layer 13 to the second antiferromagnetic layer 20.

The ferromagnetic layer 19 is made of the same material as that of the magnetic sublayer 17b of the free magnetic layer 17. The ferromagnetic layer 19 is made of a NiFe alloy, Co, a CoNiFe alloy, a CoFe alloy, a CoNi alloy, or the like. The ferromagnetic layer 19 is preferably made of a ferromagnetic material represented by CoFeNi containing from about 9 to about 17 atomic percent of Fe, and from about 0.5 to about 10 atomic percent of Ni, the balance being Co.

The second antiferromagnetic layer 20 is made of the same material as that of the first antiferromagnetic layer 14.

When the nonmagnetic layer 18 is composed of at least one element selected from the group consisting of Ru, Rh, Ir, Re, and Os, as in this embodiment, the surface of the nonmagnetic layer 18 is rarely oxidized during the first field annealing. Thus, an RKKY interaction can arise between the free magnetic layer 17 and the ferromagnetic layer 19 separated by the nonmagnetic layer 18 without milling the surface of the nonmagnetic layer 18 prior to the deposition of the ferromagnetic layer 19 on the nonmagnetic layer 18 by sputtering. For example, when the free magnetic layer 17 and the ferromagnetic layer 19 are made of a NiFe alloy and the nonmagnetic layer 18 is made of Ru, a unidirectional anisotropic magnetic field of about 42 kA/m can be generated without having to mill the surface of the nonmagnetic layer 18.

Because the resulting interfaces between the nonmagnetic layer 18 and the ferromagnetic layers 19 shown in FIG. 5 are not subjected to milling, a reduction in the unidirectional anisotropic magnetic field for magnetizing the free magnetic layer 17 in a particular direction can be prevented.

It should be noted here that because the ferromagnetic layer 19 and the free magnetic layer 17 are magnetically coupled by the RKKY interaction through the nonmagnetic layer 18 therebetween, a sufficient unidirectional anisotropic magnetic field for magnetizing the free magnetic layer 17 in a particular direction can still be obtained even when the surface of the nonmagnetic layer 18 is milled.

The magnetostriction of the free magnetic layer 17 can be completely removed by forming the nonmagnetic layer 18 of Ru and the free magnetic layer 17 of CoFe.

In the magnetic sensing element of this embodiment, the first antiferromagnetic layer 14 and the second antiferromagnetic layer 20 can be made of the same antiferromagnetic material.

Next, the composite A2 is subjected to a second field annealing at a second annealing temperature using a magnetic field of a second magnitude in the X direction to generate an exchange anisotropic magnetic field between the second antiferromagnetic layer 20 and the ferromagnetic layer 19 and to pin the magnetization direction of the ferromagnetic layer 19 in the X direction in the drawing. In this embodiment, the second annealing temperature is about 250° C., and the second magnitude of the magnetic field is about 8 kA/m.

The exchange anisotropic magnetic field between the second antiferromagnetic layer 20 and the ferromagnetic layer 19 is generated during the second field annealing. To orient the exchange anisotropic magnetic field between the second antiferromagnetic layer 20 and the ferromagnetic layer 19 in the X direction while sustaining the exchange anisotropic magnetic field between the first antiferromagnetic layer 14 and the first pinned magnetic sublayer 15a in the Y direction.

The second field annnealing is performed under the following conditions. The second annealing temperature is set lower than the blocking temperature, and the second magnitude of the magnetic field is set smaller than that of the exchange anisotropic magnetic field between the first antiferromagnetic layer 14 and the first pinned magnetic sublayer 15a. The blocking temperature is the temperature at which the exchange coupling magnetic field generated by the first antiferromagnetic layer 14 vanishes.

When the second field annealing is performed under these conditions, the exchange anisotropic magnetic field between the second antiferromagnetic layer 20 and the ferromagnetic layer 19 can be oriented in the X direction. At the same time, the exchange anisotropic magnetic field between the first antiferromagnetic layer 14 and the first pinned magnetic sublayer 15a in the Y direction can be sustained, even when the first antiferromagnetic layer 14 and the second antiferromagnetic layer 20 are made of the same material. Thus under these conditions, the free magnetic layer 17 can be easily magnetized in a direction substantially orthogonal to the magnetization direction of the pinned magnetic layer 15.

The second magnitude of the magnetic field during the second field annealing is preferably larger than the saturation magnetization field of the free magnetic layer 17 and the ferromagnetic layer 19, and also preferably larger than the demagnetizing field of the free magnetic layer 17 and the ferromagnetic layer 19. The second magnitude of the magnetic field during the second field annealing is preferably smaller than the spin-flop magnetic field which causes the antiparallel coupling between the free magnetic layer 17 and the ferromagnetic layer 19 to break.

Figure 3:
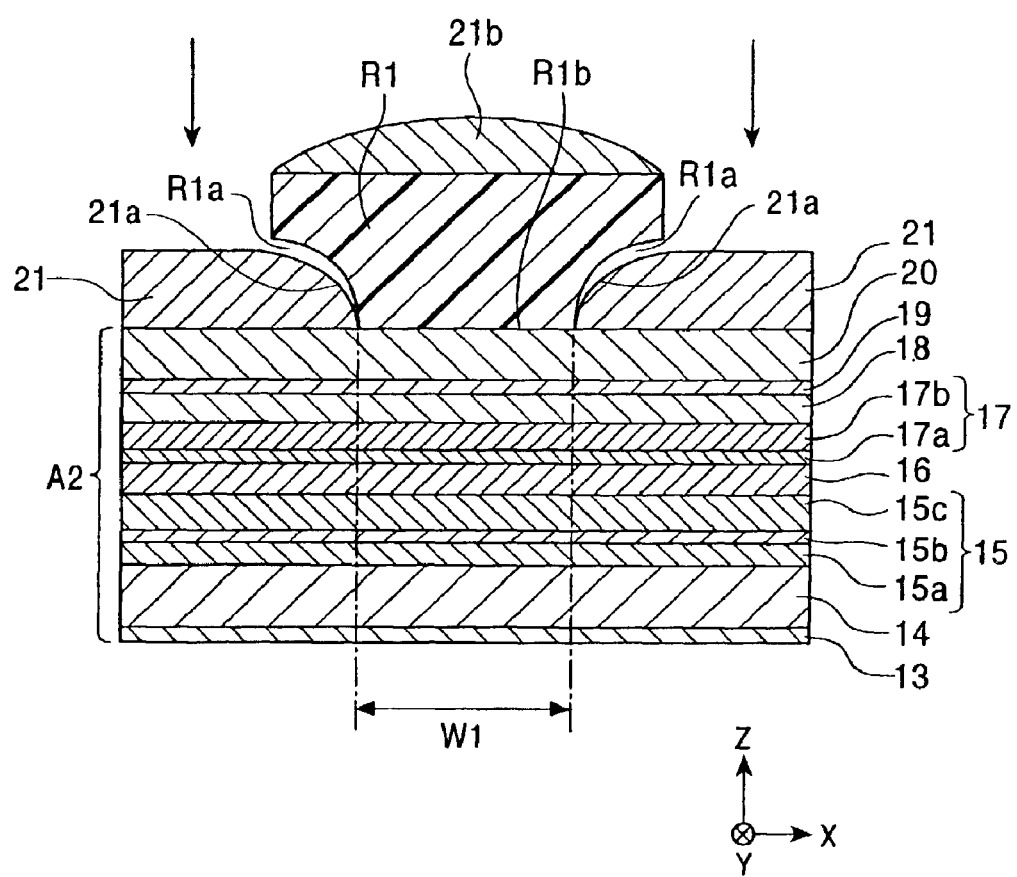
FIG. 3 is a cross-sectional view of a magnetic sensing element prepared using a step following the one performed in FIG. 2.

Next, in the step shown in FIG. 3, a lift-off resist layer R1 covering a region slightly wider than the track width is deposited. The resist layer R1 has undercut sections R1a on the lower face. Although not shown in the drawing, a protective layer composed of Ta, Cr, or the like may be formed on the second antiferromagnetic layer 20.

Next, in the step shown in FIG. 3, electrode layers 21 are formed on the second antiferromagnetic layer 20. In this embodiment, the electrode layers 21 are preferably formed by one of the sputtering method selected from an ion beam sputtering method, a long-throw sputtering method, and a collimated sputtering method. If the second antiferromagnetic layer 20 or the protective layer formed on the second antiferromagnetic layer 20 is oxidized during the second field annealing, the surface of the second antiferromagnetic layer 20 or the protective layer is milled with ions or the like to remove the oxidized portions.

In this embodiment, the substrate, i.e., the wafer, having the composite A2 thereon is placed perpendicular to the target having the composition of the electrode layers 21 to deposit the electrode layers onto the surface of the composite A2 by ion beam-sputtering in the perpendicular direction, for example.

Figure 4:
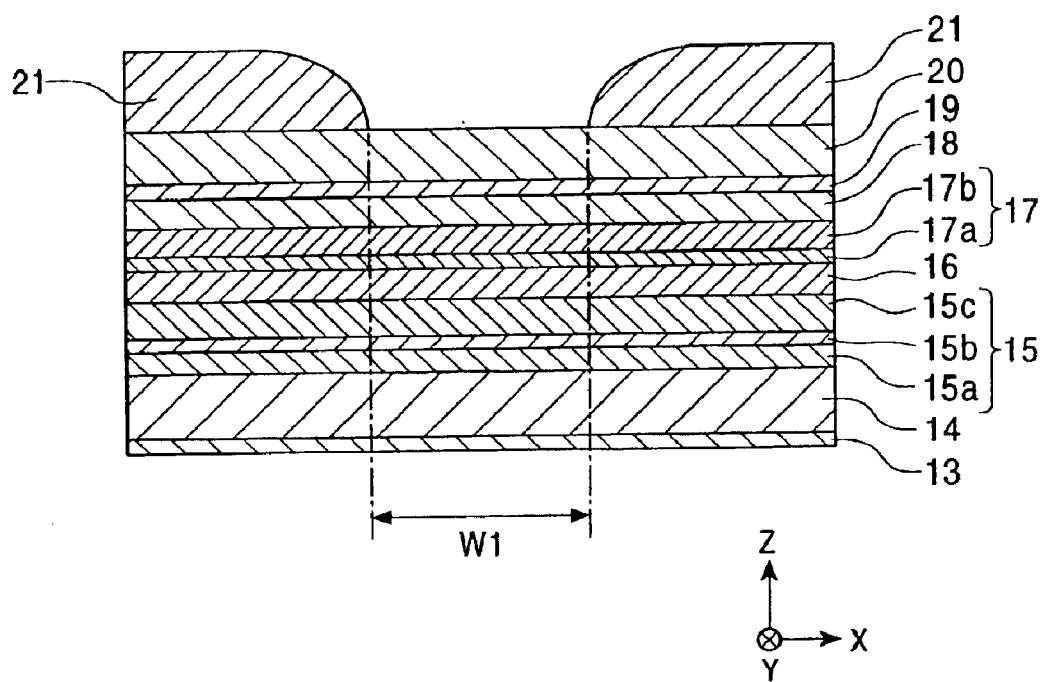
FIG. 4 is a cross-sectional view of a magnetic sensing element prepared using a step following the one performed in FIG. 3.

Sputtered particles are rarely deposited in the vicinity of the undercut sections R1a. The thickness of each electrode layer 21 is small at the vicinity of the undercut section R1a, thereby forming a curved end face 21a of the electrode layer 21. The electrode layers 21 are formed from an element such as Au, Rh, W, Cr, or Ta. On the resist layer R1, a layer 21b made of the same material as that of the electrode layers 21 is formed. After the deposition of the electrode layers 21, the resist layer R1 is removed. The state after the removal is shown in FIG. 4.

In the step shown in FIG. 5, using the electrode layers 21 as a mask, the portion of the second antiferromagnetic layer 20 not covered by the electrode layer 21 is removed to form an indent 22 using techniques such as ion milling or reactive ion etching. The indent 22 has side faces 22a penetrating the second antiferromagnetic layer 20 and the ferromagnetic layer 19. The indent 22 has a bottom portion 22b lying in the nonmagnetic layer 18 and having a width equal to the track width $T_w$. The two side faces 22a are tilted or curved to form continuous planes with the two end faces 21a of the electrode layers 21.

Figure 6:
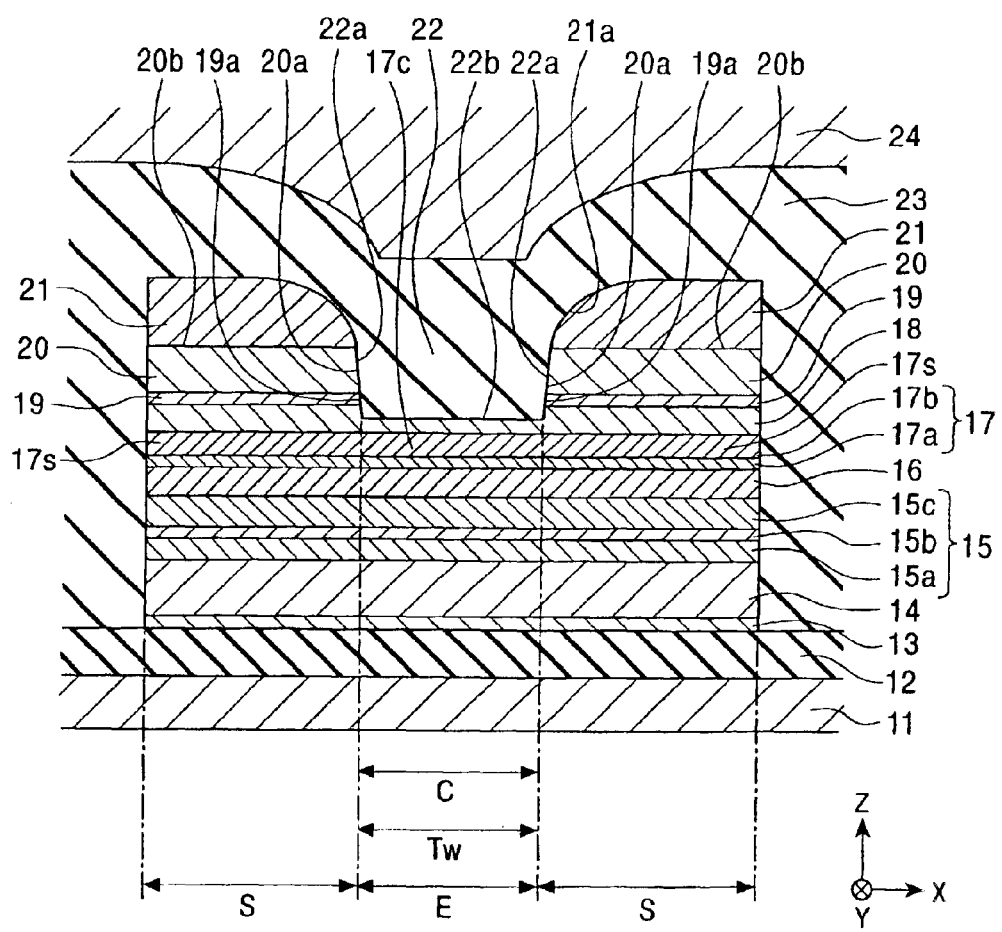
FIG. 6 is a cross-sectional view of a magnetic sensing element made by the method of the first embodiment of the present invention, as viewed from an air-bearing surface (ABS)

After forming the indent 22, an upper gap layer 23 and an upper shield layer 24 are formed to form the magnetic sensing element shown in FIG. 6.

A lower shield layer 11 and the upper shield layer 24 shown in FIG. 6 are formed using a ferromagnetic material such as NiFe. Alternatively, they may be formed by plating.

The easy magnetization axes of the lower shield layer 11 and the upper shield layer 24 are preferably oriented in the track width direction. A lower gap layer 12 and the upper gap layer 23 shown in FIG. 6 are made of an insulating material such as $Al_2O_3$, $SiO_2$, or Al—Si—O.

As shown in FIG. 6, in this embodiment the electrode layers 21 are formed on the second antiferromagnetic layers 20. The end faces 21a of the electrode layers 21 at the track width region C and end faces 20a of the second antiferromagnetic layers 20 at the track width region C form a continuous plane. End faces 19a of the ferromagnetic layer 19 at the track width region C, the end faces 21a of the electrode layers 21, and the end faces 20a of the second antiferromagnetic layers 20 also form a continuous plane.

In FIG. 6, the track width region C is the region covered by the bottom portion 22b of the indent 22. The track width region C is equivalent to a sensitive region E in which the magnetization of the free magnetic layer 17 is variable. In this embodiment, the ferromagnetic layers 19 are magnetized in the track width direction, i.e., the X direction in the drawing, as a result of the magnetic coupling with the second antiferromagnetic layers 20.

Two side portions 17s of the free magnetic layer 17 formed under the ferromagnetic layers 19 with the nonmagnetic layer 18 therebetween are magnetized in a direction antiparallel to the magnetization direction of the ferromagnetic layer 19. The magnetization is due to the RKKY interaction with the ferromagnetic layers 19. Thus, the ferromagnetic layers 19, the nonmagnetic layer 18, and the free magnetic layer 17 form a synthetic ferrimagnetic structure under the second antiferromagnetic layers 20. Also, the side portions 17s of the free magnetic layer 17 covered by both the second antiferromagnetic layers 20 and the ferromagnetic layers 19 are magnetized in a direction substantially orthogonal to the magnetization direction of the pinned magnetic layer 15.

When no external magnetic field is applied, a center portion 17c of the free magnetic layer 17 not covered by the second antiferromagnetic layers 20 and the ferromagnetic layers 19 is magnetized in a direction antiparallel to the track width direction, i.e., antiparallel to the X direction in the drawing, due to the magnetization of the side portions 17s. The term "antiparallel" means that the directions differ by about 180°. When an external magnetic field is applied in a direction perpendicular to the track width direction, i.e., the height direction which corresponds to the Y direction in the drawing, the magnetization direction of the center portion 17c shifts toward the height direction.

The shift of the magnetization in the center portion 17c of the free magnetic layer 17 relative to the pinned magnetization direction of the pinned magnetic layer 15 changes the electrical resistance. This phenomenon is known as the magnetoresistive effect. An external magnetic field such as a leakage magnetic field from a recording medium is detected as a change in voltage or electrical current based on the change in electrical resistance.

In this embodiment, the width of the bottom portion 22b of the indent 22 regulates the track width $T_w$. The width of the bottom portion 22b of the indent 22 can be regulated by adjusting the dimensions of the resist layer R1 in the step shown in FIG. 3 and by adjusting the depth of the indent 22 in the step shown in FIG. 5.

The side faces 22a of the indent 22 are tilted at an angle of approximately 20° relative to the direction perpendicular to the surface 20b of the second antiferromagnetic layer.

The entirety of the second antiferromagnetic layers 20 outside the track width region C, i.e., at side regions S in the track width direction, has a sufficient thickness for generating antiferromagnetism to securely pin the magnetization directions of the ferromagnetic layers 19 and the free magnetic layer 17 at the side regions S. Hence, while the free magnetic layer 17 is covered by the ferromagnetic layers 19 with the nonmagnetic layers 18 therebetween, only the magnetization direction of the side portions 17s of the free magnetic layer 17 in the track width direction is pinned as a result of the RKKY interaction with the ferromagnetic layers 19.

When no external magnetic field is applied, a region E of the free magnetic layer 17 covered by the bottom portion 22b of the indent 22 is magnetized in a direction antiparallel to the X direction in the drawing due to the pinned magnetization of the side portions 17s. When an external magnetic field is applied, the magnetization direction of the region E shifts from the direction antiparallel to the X direction in the drawing.

The track width $T_w$ of the magnetic sensing element is determined by the width $T_w$ of the bottom portion 22b of the indent 22. Also, the region outside the track width $T_w$ is prevented from reading a recorded signal, i.e., side reading is prevented. As described above, in this embodiment the bottom portion 22b of the indent 22 can be formed with accurate dimensions since the indent 22 is formed by milling the second antiferromagnetic layer 20 having uniform thickness using the electrode layers 21 as a mask. Examples of the milling process include reactive ion etching (RIE) and ion milling. When the bottom portion 22b of the indent 22 has an accurate track width, the optical track width of the magnetic sensing element can be made equal to the magnetic track width to prevent the generation of insensitive regions. Thus, degradation in read output can be prevented even when the optical track width of the magnetic sensing element is minimized to meet demands for higher recording density.

In the magnetic sensing element shown in FIG. 6, the free magnetic layer 17 extends to the regions below the second antiferromagnetic layers 20 and the ferromagnetic layers 19. Thus, the influence of the demagnetizing field generated by the surface magnetic charge at the two end faces of the free magnetic layer 17 can be minimized.

Since the ferromagnetic layers 19, the nonmagnetic layer 18, and the free magnetic layer 17 form a synthetic ferrimagnetic structure under the second antiferromagnetic layers 20, the unidirectional anisotropic magnetic field for orienting the magnetization direction of the side portions 17s of the free magnetic layer 17 in a particular direction can be increased.

Thus, the magnetization direction along the side portions 17s of the free magnetic layer 17 can be prevented from shifting when an external magnetic field is applied, and an increase in the magnetic track width can be prevented.

Moreover, the free magnetic layer 17 can be easily and reliably magnetized in a direction substantially orthogonal to the magnetization direction of the pinned magnetic layer 15 even when the exchange coupling magnetic field with the second antiferromagnetic layers 20 and the ferromagnetic layers 19 is relatively weak. The magnitude of the magnetic field during the second field annealing can therefore be decreased to about 8 kA/m, and the magnetization direction of the pinned magnetic layer 15 can be easily prevented from changing.

At a second magnitude of the magnetic field of about 8 kA/m, a unidirectional anisotropic magnetic field of about 56 kA/m can be generated when the free magnetic layer 17 and the ferromagnetic layer 19 are composed of NiFe and the nonmagnetic layer 18 is composed of Ru. When the free magnetic layer 17 and the ferromagnetic layer 19 are made of CoFe and the nonmagnetic layer 18 is made of Ru, a unidirectional anisotropic magnetic field of about 152 kA/m can be generated.

In this embodiment, the nonmagnetic layer 18 has a predetermined uniform thickness $t_1$ and thus has a flat upper surface 18a. Thus, in the step shown in FIG. 2, the ferromagnetic layer 19 and the second antiferromagnetic layer 20 deposited on the flat nonmagnetic layer 18 can also have flat surfaces. In the resulting synthetic ferrimagnetic structure constituted from the ferromagnetic layers 19, the nonmagnetic layers 18, and the free magnetic layer 17, the RKKY interaction between the ferromagnetic layers 19 and the free magnetic layer 17 can be easily increased.

When the upper surface 18a of the nonmagnetic layer 18 is flat as described above, the deposition step of the ferromagnetic layer 19 and the second antiferromagnetic layer 20 can be easily controlled, and the thickness of the ferromagnetic layer 19 can be decreased. With thin ferromagnetic layers 19, the spin-flop magnetic field between the ferromagnetic layers 19 and the free magnetic layer 17 can be increased in the resulting synthetic ferrimagnetic structure constituted from the ferromagnetic layers 19, the nonmagnetic layer 18, and the free magnetic layer 17. In this embodiment, the thickness of the ferromagnetic layers 19 is from about 1.5 nm to about 4.0 nm, for example. In this manner, the unidirectional anisotropic magnetic field applied to the free magnetic layer 17 can also be increased. For example, when the ferromagnetic layers 19 and the free magnetic layer 17 are made of NiFe, a unidirectional anisotropic magnetic field of about 56 kA/m can be obtained. When the ferromagnetic layers 19 and the free magnetic layer 17 are made of CoFe, a unidirectional anisotropic magnetic field of about 152 kA/m can be obtained.

In the step shown in FIG. 1, a conductive material such as Ru may be used to form the nonmagnetic layer 18 so that the nonmagnetic layer 18 functions as a back layer contributing to the spin filter effect described below. This improves the magnetic sensitivity of the magnetic sensing element.

The spin-filter effect will now be described.

Figure 19:
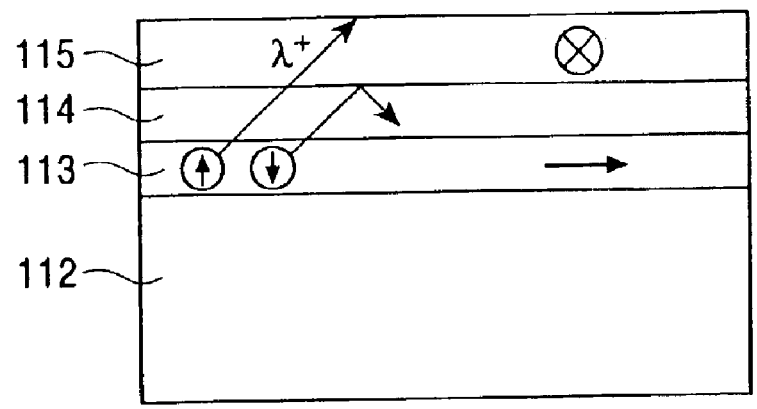
FIG. 19 illustrates the spin-filter effect by a back layer.
Figure 20:
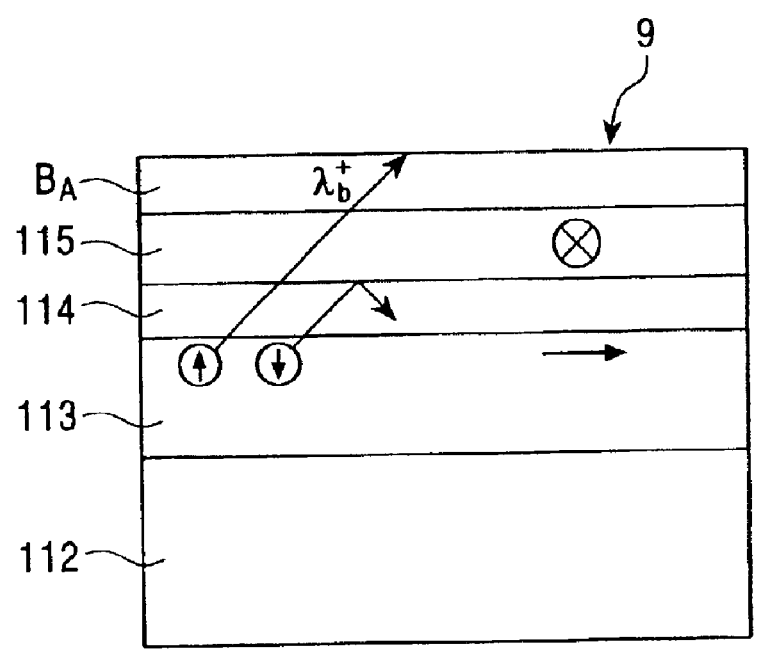
FIG. 20 illustrates the spin-filter effect by a back layer.

FIGS. 19 and 20 are schematic diagrams for explaining the spin-filter effect using a back layer in a spin-valve magnetic sensing element. FIG. 19 is a schematic diagram showing an exemplary structure without a back layer. FIG. 20 is a schematic diagram showing an exemplary structure having a back layer.

The giant magnetoresistive (GMR) effect is mainly caused by the spin-dependent scattering of electrons. In other words, the GMR effect is due to the difference between the mean free path $\lambda^+$ of the conduction electrons having a spin parallel to the magnetization direction of the free magnetic layer (for example, an up-spin), and the mean free path $\lambda^-$ of the conduction electrons having a spin antiparallel to the magnetization direction of the free magnetic layer (for example, a down-spin).

In FIGS. 19 and 20, the conduction electrons having an up-spin, i.e., spin-up electrons, are represented by arrows pointing upward, and the conduction electrons having a down spin, i.e., spin-down electrons, are represented by arrows pointing downward in the drawings.

The electrons attempting to pass through a free magnetic layer 115 travel freely if they have an up-spin but are readily scattered, i.e., filtered out, if they have a down-spin. This is because the mean free path $\lambda^-$ of the spin-down electrons is quite small compared to the mean free path $\lambda^+$ of the spin-up electrons. For example, whereas the mean free path $\lambda^+$ of the spin-up electrons is approximately 50 Å, the mean free path $\lambda^-$ of the spin-down electrons is approximately 6 Å, which is about one tenth of the mean free path $\lambda^+$ of the spin-up electrons. The thickness of the free magnetic layer 115 is adjusted to be larger than the mean free path $\lambda^-$ of the spin-down electrons, which is approximately 6 Å, and smaller than the mean free path $\lambda^+0$ of the spin-up electrons, which is approximately 50 Å.

The spin-down electrons generated in a pinned magnetic layer 113 rarely reach the free magnetic layer 115 and are scattered in the vicinity of the interface between the free magnetic layer 115 and the nonmagnetic material layer 114, or the interface between the pinned magnetic layer 113 and the nonmagnetic material layer 114.

The spin-down electrons do not experience a change in the mean free path even when the magnetization direction of the free magnetic layer 115 is rotated, and thus do not affect the rate of change in resistance caused by the GMR effect. Thus, only the behavior of the spin-up electrons affects the GMR effect.

The spin-up electrons generated in the pinned magnetic layer 113 travel through the nonmagnetic material layer 114 having a thickness smaller than the mean free path $\lambda^+$, reach the free magnetic layer 115, and freely travel through the free magnetic layer 115. This is because the spin-up electrons have a spin parallel to the magnetization direction of the free magnetic layer 115.

When the magnetization direction of the pinned magnetic layer 113 is antiparallel to the magnetization direction of the free magnetic layer 115, the spin-up electrons do not have a spin parallel to the magnetization direction of the free magnetic layer 115. The spin-up electrons are then scattered at the vicinity of the interface between the free magnetic layer 115 and the nonmagnetic material layer 114. This scattering results in a drastic decrease in the effective mean free path of the spin-up electrons, which in turn results in an increase in resistance. The rate of change in resistance has a positive correlation with the change in the effective mean free path of the spin-up electrons.

As shown in FIG. 20, when a back layer $B_A$ is provided, the spin-up electrons, after passing through the free magnetic layer 115, travel in the back layer $B_A$ for an additional mean free path $\lambda^+_b$ determined by the material of the back layer $B_A$. The spin-up electrons then undergo scattering. The back layer $B_A$ thus extends the mean free path $\lambda^+$ of the spin-up electrons through the additional mean free path $\lambda^+_b$.

In this embodiment, the nonmagnetic layer 18 functions as the back layer to extend the mean free path of the spin-up conduction electrons. With this structure, the change in the mean free path of the spin-up electrons due to the application of an external magnetic field can be increased. In addition, the rate of change in magnetoresistance ($\Delta R/R$) of the spin-valve magnetic sensing element can be further improved.

An increase in difference between the mean free magnetic paths of the spin-up conduction electrons and spin-down conduction electrons due to the spin-filter effect is particularly advantageous when the free magnetic layer 17 is relatively thin. When the thickness of the free magnetic layer 17 is less than about 1.5 nm, the free magnetic layer 17 barely functions as a ferromagnetic layer. Thus, a sufficient magnetoresistive effect cannot be achieved. Moreover, at such a thickness, some conduction electrons may undergo diffusive scattering instead of specular reflection, thereby decreasing the rate of change in resistance.

When the thickness of the free magnetic layer 17 is larger than about 4.5 nm, the number of spin-up conduction electrons that are scattered before reaching the nonmagnetic layer 18 increases. As a result, the percentage change in the rate of change in resistance due to the spin-filter effect decreases, which is undesirable.

As shown in FIG. 6, the first pinned magnetic sublayer 15a (ferromagnetic) and the second pinned magnetic sublayer 15c (ferromagnetic), which have different magnetic moments per unit area, are deposited with the nonmagnetic intermediate sublayer 15b therebetween to function as one pinned magnetic layer 15. The pinned magnetic layer 15 thus comprises a plurality of layers composed of ferromagnetic materials having different magnetic moments per unit area, and at least one nonmagnetic layer disposed between the plurality of layers. The pinned magnetic layer is also set to a ferrimagnetic state in which the adjacent ferromagnetic layers separated by the nonmagnetic interlayer therebetween are magnetized antiparallel to each other.

The first pinned magnetic sublayer 15a is in contact with the first antiferromagnetic layer 14. Through the first field annealing, the first pinned magnetic sublayer 15a and the first antiferromagnetic layer 14 are exchange-coupled at the interface therebetween and thereby generate an exchange anisotropic magnetic field. The generated exchange anisotropic magnetic field pins the magnetization direction of the first pinned magnetic sublayer 15a in the Y direction in the drawing.

When the magnetization direction of the first pinned magnetic sublayer 15a is pinned in the Y direction, the magnetization direction of the second pinned magnetic sublayer 15c, which opposes the first pinned magnetic sublayer 15a with the nonmagnetic intermediate sublayer 15b therebetween, is pinned antiparallel to the magnetization direction of the first pinned magnetic sublayer 15a.

The magnetic moment of the first pinned magnetic sublayer 15a and that of the second pinned magnetic sublayer 15c are combined to define the magnetization direction of the pinned magnetic layer 15.

The above structure is preferred because the first pinned magnetic sublayer 15a and the second pinned magnetic sublayer 15c pin each other's magnetization direction. Thus, the resulting pinned magnetic layer 15 as a whole can be stably magnetized in a predetermined direction.

The first pinned magnetic sublayer 15a and the second pinned magnetic sublayer 15c are made of ferromagnetic material. Examples of ferromagnetic materials include a NiFe alloy, Co, a CoNiFe alloy, a CoFe alloy, and a CoNi alloy. A NiFe alloy, Co, and CoFe are particularly preferable. The first pinned magnetic sublayer 15a and the second pinned magnetic sublayer 15c are preferably made of the same material. In FIG. 1, the first pinned magnetic sublayer 15a and the second pinned magnetic sublayer 15c are composed of the same material but are formed with different thicknesses so that the first pinned magnetic sublayer 15a and the second pinned magnetic sublayer 15c have different magnetic moments per unit area.

The nonmagnetic intermediate sublayer 15b is made of at least one nonmagnetic material selected from Ru, Rh, Ir, Os, Cr, Re, and Cu. Preferably, the nonmagnetic intermediate sublayer 15b is made of Ru.

The pinned magnetic layer 15 is made by depositing the first pinned magnetic sublayer 15a and the second pinned magnetic sublayer 15c above and below the nonmagnetic intermediate sublayer 15b, respectively. As a result, the first pinned magnetic sublayer 15a and the second pinned magnetic sublayer 15c mutually pin the magnetization direction of each other, thereby firmly pinning the magnetization direction of the overall pinned magnetic layer 15 in a particular direction. A large exchange coupling magnetic field $H_{ex}$ of, for example, from about 80 to about 160 kA/m can be obtained between the first antiferromagnetic layer 14 and the pinned magnetic layer 15.

In this embodiment, the demagnetizing field $H_d$, i.e., the dipole magnetic field, caused by the pinned magnetization of the pinned magnetic layer 15 can be cancelled since the static magnetic fields of the first pinned magnetic sublayer 15a and the second pinned magnetic sublayer 15c cancel each other out. Thus, the influence of the demagnetizing field (dipole magnetic field) due to the pinned magnetization of the pinned magnetic layer 15 on the variable magnetization of the free magnetic layer 17 can be reduced.

Thus, the variable magnetization direction of the free magnetic layer 17 can be easily corrected to a desired magnetization direction. In addition, a magnetic sensing element having superior symmetrical properties, i.e., small asymmetry, can be obtained.

The demagnetizing field (dipole magnetic field) $H_d$ due to the pinned magnetization of the pinned magnetic layer 15 has a nonuniform distribution. The demagnetizing field is larger at the end portions and smaller at the central portions, which prevents the free magnetic layer 17 from being set to a single-magnetic-domain state. This problem can be overcome by forming the pinned magnetic layer 15 as above since the dipole magnetic field $H_d$ can be completely removed, and domain walls are not formed in the free magnetic layer 17. Thus, generation of nonuniform magnetization and Barkhausen noise can be prevented.

Alternatively, the pinned magnetic layer 15 may be a single layer composed of a ferromagnetic material. An anti-diffusion layer made of Co or the like may be provided between the second pinned magnetic sublayer 15c and the nonmagnetic material layer 16 to prevent interdiffusion.

In this embodiment, the exchange anisotropic magnetic field of the second antiferromagnetic layers 20 can be oriented in the X direction as shown in the drawing while orienting the exchange anisotropic magnetic field of the first antiferromagnetic layer 14 in the Y direction. This can be done even when the first antiferromagnetic layer 14 and the second antiferromagnetic layers 20 are made of the same antiferromagnetic material. In this embodiment, the free magnetic layer 17 is magnetized in a direction substantially orthogonal to the magnetization direction of the pinned magnetic layer 15.

The magnitude of the magnetic moment per unit area of the free magnetic layer 17 must differ from that of the ferromagnetic layers 19. The magnitude of the magnetic moment is determined by multiplying the saturation magnetization $M_s$ of the ferromagnetic material layer and the layer thickness t. In this embodiment, the thickness of the ferromagnetic layers 19 is smaller than the thickness of the free magnetic layer 17. At such a thickness, the unidirectional anisotropic magnetic field of the ferromagnetic layers 19 can increase, and a sufficient longitudinal bias can be applied to the free magnetic layer 17.

Second Embodiment

Figure 7:
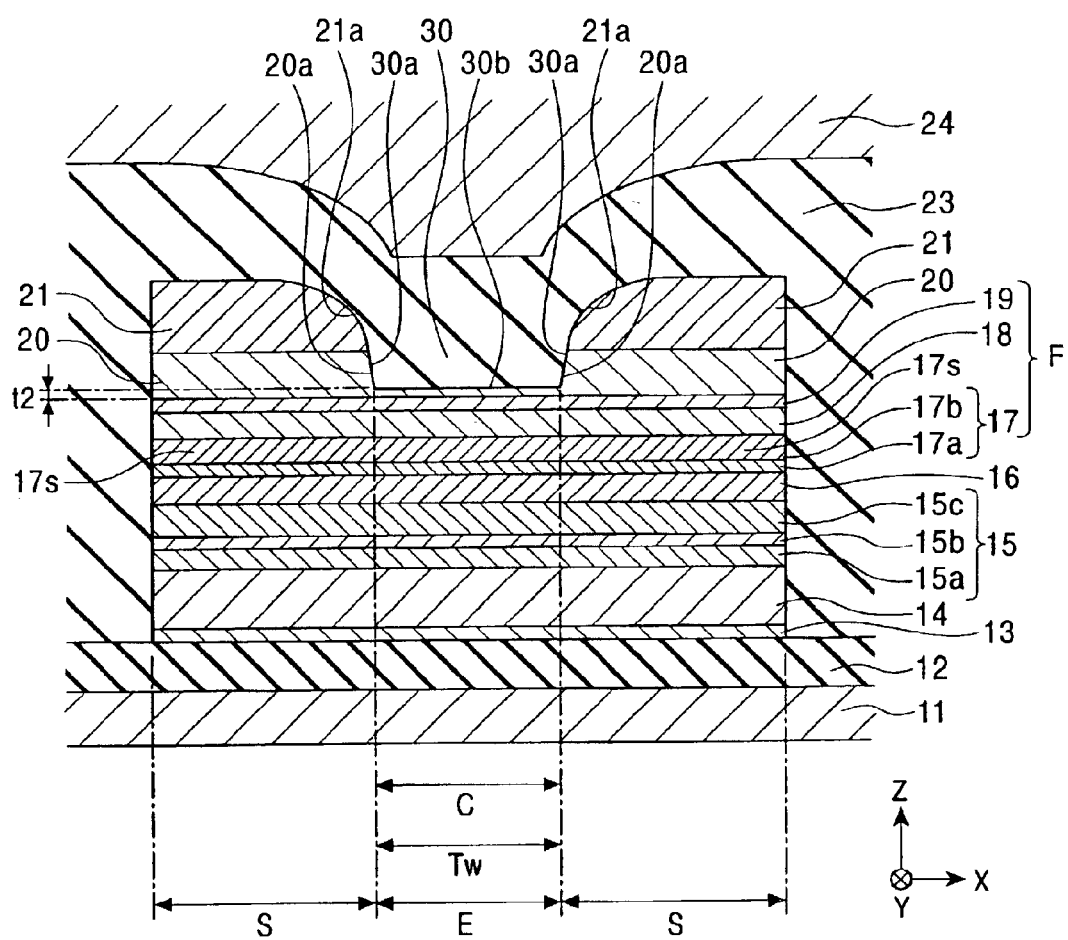
FIG. 7 is a cross-sectional view of a magnetic sensing element made by a method of a second embodiment of the present invention, as viewed from an air-bearing surface (ABS)

After the step shown in FIG. 4, the second antiferromagnetic layer 20 is milled partway using the electrode layers 21 as a mask to make a magnetic sensing element having an indent 30 as shown in FIG. 7. The indent 30 has a bottom portion 30b lying in the second antiferromagnetic layer 20 and having a track width $T_w$.

In the magnetic sensing element shown in FIG. 7, the bottom portion 30b of the indent 30 is located in the second antiferromagnetic layer 20. The free magnetic layer 17 and the ferromagnetic layer 19 are adjacent to each other with the nonmagnetic layer 18 therebetween. The magnetization directions of the free magnetic layer 17 and the ferromagnetic layer 19 are antiparallel to each other, i.e., in a ferrimagnetic state.

The free magnetic layer 17, the nonmagnetic layer 18, and the ferromagnetic layer 19 form a composite F. The composite F functions as one free magnetic layer of a synthetic ferrimagnetic type. This type of free magnetic layer has the same advantages as those obtained by reducing the thickness of the free magnetic layer. That is, the magnetization of the free magnetic layer changes more easily, and the magnetic field sensitivity of the magnetoresistive element can be improved.

The magnitude of the magnetic moment per unit area of the free magnetic layer 17 must differ from that of the ferromagnetic layer 19. The magnitude of the magnetic moment per unit area of the free magnetic layer 17 is determined by adding the product of the saturation magnetization $M_s$ and the layer thickness t of the magnetic sublayer 17b and the product of the saturation magnetization $M_s$ and the layer thickness t of the anti-diffusion sublayer 17a. The magnitude of the magnetic moment per unit area of the ferromagnetic layer 19 is determined by multiplying the saturation magnetization $M_s$ and the layer thickness t of the ferromagnetic layer 19.

A thickness t2 of the portion of the second antiferromagnetic layer 20 covered by the bottom portion 30b of the indent 30 is preferably larger than about 0 Å but not larger than about 50 Å. Such a thickness is preferred because no exchange coupling magnetic field is generated between the ferromagnetic layer 19 and the portion of the second antiferromagnetic layer 20 covered by the bottom portion 30b of the indent 30.

Third Embodiment

Figure 8:
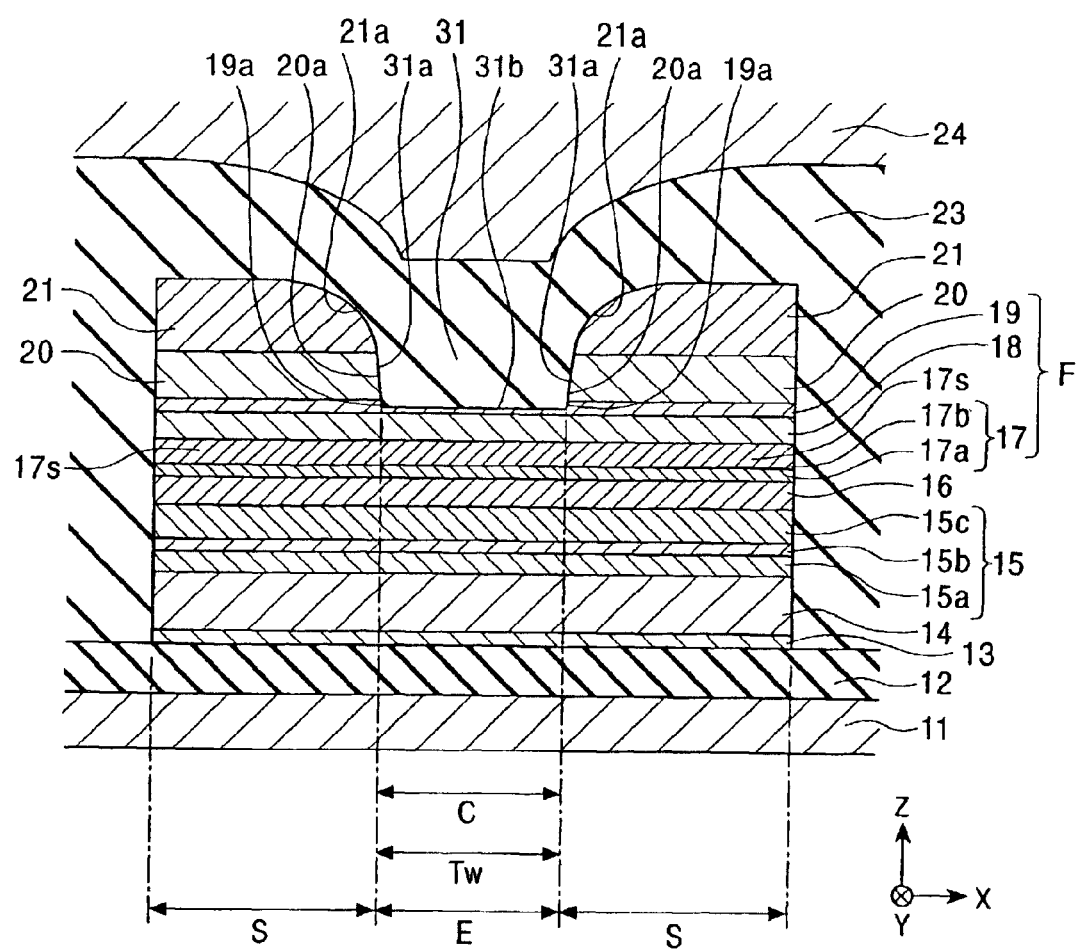
FIG. 8 is cross-sectional view of a magnetic sensing element made by a method of a third embodiment of the present invention, as viewed from an air bearing surface (ABS)

After the step shown in FIG. 4, the second antiferromagnetic layer 20 and the ferromagnetic layer 19 are milled using the electrode layers 21 as a mask to obtain a magnetic sensing element having an indent 31 as shown in FIG. 8. The indent 31 has side faces 31a penetrating the second antiferromagnetic layer 20. A bottom portion 31b of the indent 31 lies in the ferromagnetic layer 19 and has a width the same as the track width $T_w$.

In the magnetic sensing element shown in FIG. 8 also, the free magnetic layer 17, the nonmagnetic layer 18, and the ferromagnetic layer 19 form a composite F, and the composite F functions as one free magnetic layer of a synthetic ferrimagnetic type. In the present invention, no second antiferromagnetic layer 20 is provided above the sensitive region E of the free magnetic layer 17 in which the magnetization changes in response to an external magnetic field. As a result, the sensitivity of the sensitive region E to an external magnetic field can be improved. In addition, the magnetic field sensitivity of the resulting magnetic sensing element can also be improved.

Fourth Embodiment

If the magnetic sensing element is to be incorporated into a floating head, a lower shield layer and a lower gap layer are formed on a trailing end face of a ceramic slider, with an insulating film such as an $Al_2O_3$ film therebetween.

As shown by the step in FIG. 1, the first antiferromagnetic layer 14, the pinned magnetic layer 15, the nonmagnetic material layer 16, the free magnetic layer 17, and the nonmagnetic layer 18 are sequentially deposited on the base layer 13 in a vacuum deposition apparatus by a thin-film forming process such as sputtering or vapor deposition to form the composite A1. The pinned magnetic layer 15 is of a synthetic ferrimagnetic type and comprises the first pinned magnetic sublayer 15a, the nonmagnetic intermediate sublayer 15b, and the second pinned magnetic sublayer 15c.

The resulting composite A1 is subjected to a first field annealing at a first annealing temperature in a magnetic field of a first magnitude in the Y direction to generate an exchange anisotropic magnetic field between the first antiferromagnetic layer 14 and the first pinned magnetic sublayer 15a. This step is also performed to pin the magnetization direction of the pinned magnetic layer 15 in the Y direction as shown in the drawing. In this embodiment, the first annealing temperature is about 270° C., and the first magnitude of the magnetic field is about 800 kA/m.

Next, as shown in FIG. 2, the ferromagnetic layer 19 and the second antiferromagnetic layer 20 are sequentially deposited by sputtering to make a composite A2 including layers from the base layer 13 to the second antiferromagnetic layer 20.

The following materials are the same as those described in the first embodiment and will not be described again in this section: the materials of the base layer 13; the first antiferromagnetic layer 14; the pinned magnetic layer 15 comprising the first pinned magnetic sublayer 15a, the nonmagnetic intermediate sublayer 15b, and the second pinned magnetic sublayer 15c; the nonmagnetic material layer 16; the free magnetic layer 17; the nonmagnetic layer 18; the ferromagnetic layer 19; and the second antiferromagnetic layer 20.

In this embodiment also, when the nonmagnetic layer 18 is composed of at least one element selected from the group consisting of Ru, Rh, Ir, Re, and Os, the surface of the nonmagnetic layer 18 is rarely oxidized during the first field annealing. Thus, an RKKY interaction can arise between the free magnetic layer 17 and the ferromagnetic layer 19 separated by the nonmagnetic layer 18 without milling the surface of the nonmagnetic layer 18 prior to the deposition of the ferromagnetic layer 19 on the nonmagnetic layer 18 by sputtering. As a result, the interfaces between the nonmagnetic layer 18 and the ferromagnetic layers 19 are not subjected to milling. In addition, the unidirectional anisotropic magnetic field for magnetizing the free magnetic layer 17 in a particular direction can be prevented from decreasing.

Since the ferromagnetic layer 19 and the free magnetic layer 17 are magnetically coupled by the RKKY interaction due to the nonmagnetic layer 18 therebetween, a sufficient unidirectional anisotropic magnetic field for magnetizing the free magnetic layer 17 in a particular direction can still be obtained even when the surface of the nonmagnetic layer 18 is milled.

In this embodiment, the first antiferromagnetic layer 14 and the second antiferromagnetic layer 20 may be composed of the same antiferromagnetic material.

Next, the composite A2 is subjected to a second field annealing at a second annealing temperature using a magnetic field of a second magnitude in the X direction to generate an exchange anisotropic magnetic field between the second antiferromagnetic layer 20 and the ferromagnetic layer 19 and to pin the magnetization direction of the ferromagnetic layer 19 in the X direction as shown in the drawing. In this embodiment, the second annealing temperature is about 250° C., and the second magnitude of the magnetic field is about 8 kA/m.

The exchange anisotropic magnetic field between the second antiferromagnetic layer 20 and the ferromagnetic layer 19 is generated in the second field annealing step. To orient the exchange anisotropic magnetic field between the second antiferromagnetic layer 20 and the ferromagnetic layer 19 in the X direction while sustaining the exchange anisotropic magnetic field between the first antiferromagnetic layer 14 and the first pinned magnetic sublayer 15a in the Y direction, the second annealing temperature is adjusted to be lower than the blocking temperature, and the second magnitude of the magnetic field is adjusted to be smaller than that of the exchange anisotropic magnetic field between the first antiferromagnetic layer 14 and the first pinned magnetic sublayer 15a. The blocking temperature is the temperature at which the exchange coupling magnetic field caused by the first antiferromagnetic layer 14 vanishes. When the second field annealing is performed under these conditions, the exchange anisotropic magnetic field between the second antiferromagnetic layer 20 and the ferromagnetic layer 19 can be oriented in the X direction while sustaining the exchange anisotropic magnetic field between the first antiferromagnetic layer 14 and the first pinned magnetic sublayer 15a in the Y direction even when the first antiferromagnetic layer 14 and the second antiferromagnetic layer 20 are made of the same material. Thus, under these conditions, the free magnetic layer 17 can be easily magnetized in a direction substantially orthogonal to the magnetization direction of the pinned magnetic layer 15.

The second magnitude of the magnetic field during the second field annealing is preferably larger than the saturation magnetization field of the free magnetic layer 17 and the ferromagnetic layer 19 and the demagnetizing field of the free magnetic layer 17 and the ferromagnetic layer 19. The second magnitude of the magnetic field during the second field annealing is preferably smaller than the spin-flop magnetic field which causes the antiparallel coupling between the free magnetic layer 17 and the ferromagnetic layer 19 to break.

Figure 9:
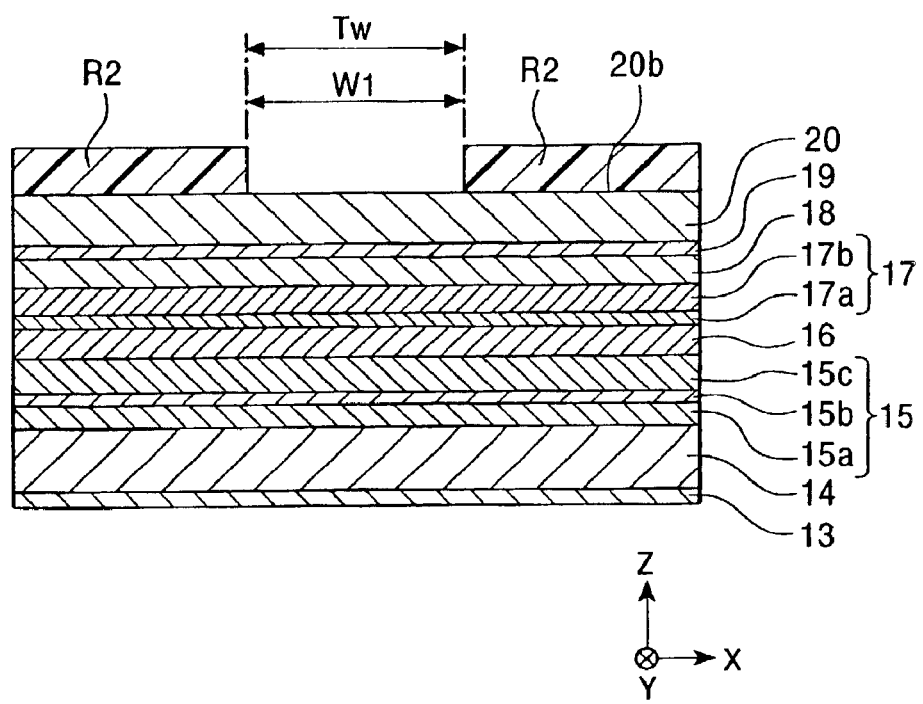
FIG. 9 is a cross-sectional view showing a step of a method for manufacturing a magnetic sensing element according to a fourth embodiment of the present invention.

Next, in the step shown in FIG. 9, a pair of first resist layers R2 are deposited on the second antiferromagnetic layer 20. The first resist layers R2 are separated from each other by a gap W1 corresponding to the track width $T_w$.

Figure 10:
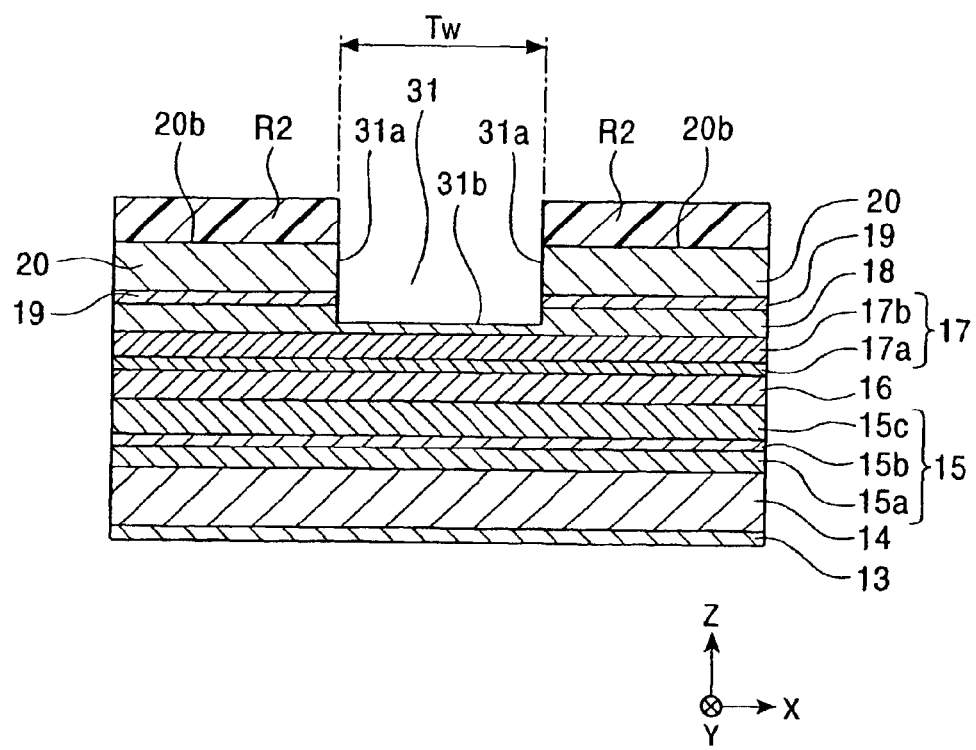
FIG. 10 is a cross-sectional view of a magnetic sensing element prepared using a step following the one performed in FIG. 9.

To form the indent 31, as shown in FIG. 10, the portion of the second antiferromagnetic layer 20 not covered by the first resist layers R2 is milled in a direction perpendicular to the surface 20b of the second antiferromagnetic layer 20, i.e., along the Z direction as shown in the drawing, which is perpendicular to the track width direction (the X direction in the drawing). Examples of milling processes include ion milling and reactive ion etching (RIE). The indent 31 has side faces 31a and penetrates the second antiferromagnetic layer 20 and the ferromagnetic layer 19. The bottom portion 31b of the indent 31 lies in the nonmagnetic layer 18 and has a width corresponding to the track width $T_w$. The side faces 31a of the indent 31 are perpendicular to the track width direction. In FIG. 10, the first resist layers R2 are removed after the indent 31 having the bottom portion 31b lying in the nonmagnetic layer 18 is formed.

Figure 11:
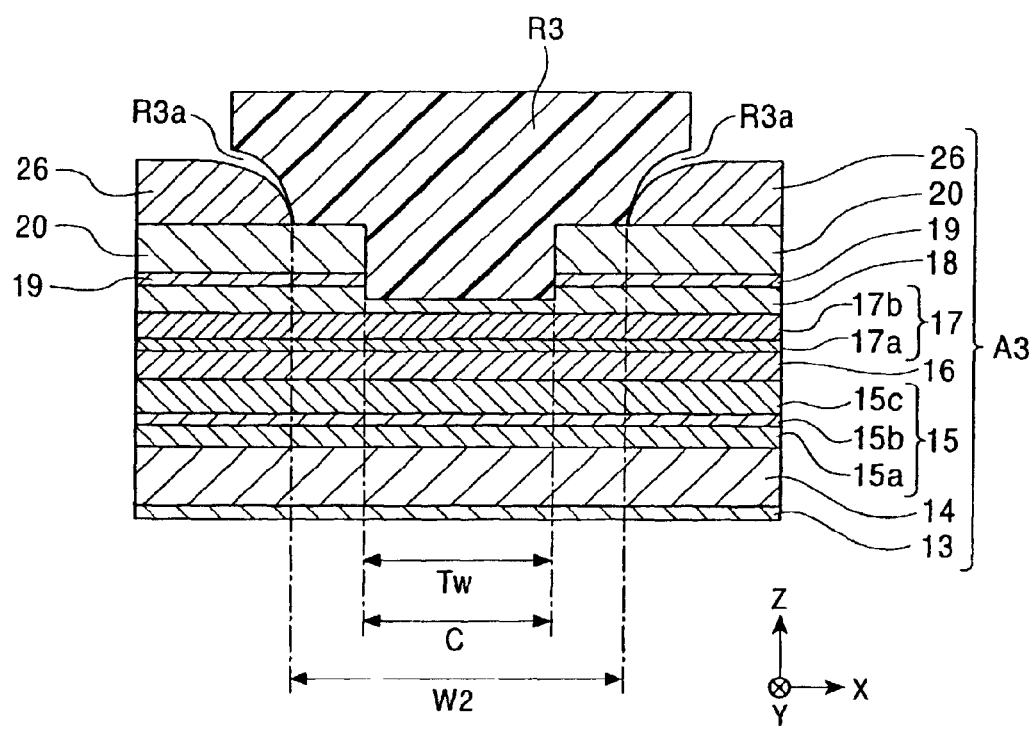
FIG. 11 is a cross-sectional view of a magnetic sensing element prepared using a step following the one performed in FIG. 10.

Next, as shown in FIG. 11, a second resist layer R3 is formed in the indent 31 and on part of the second antiferromagnetic layers 20. The second resist layer R3 covers a region having a width W2 in the track width direction, as shown in FIG. 11. The second resist layer R3 is a lift-off resist layer and has undercut sections R3a at the lower face.

As shown in FIG. 11, electrode layers 26 are then formed on the regions of the second antiferromagnetic layers 20 not covered by the second resist layer R3 by sputtering using a conductive material to form a composite A3. After forming the electrode layers 26, the second resist layer R3 is removed, and a magnetic sensing element shown in FIG. 12 is obtained.

Figure 12:
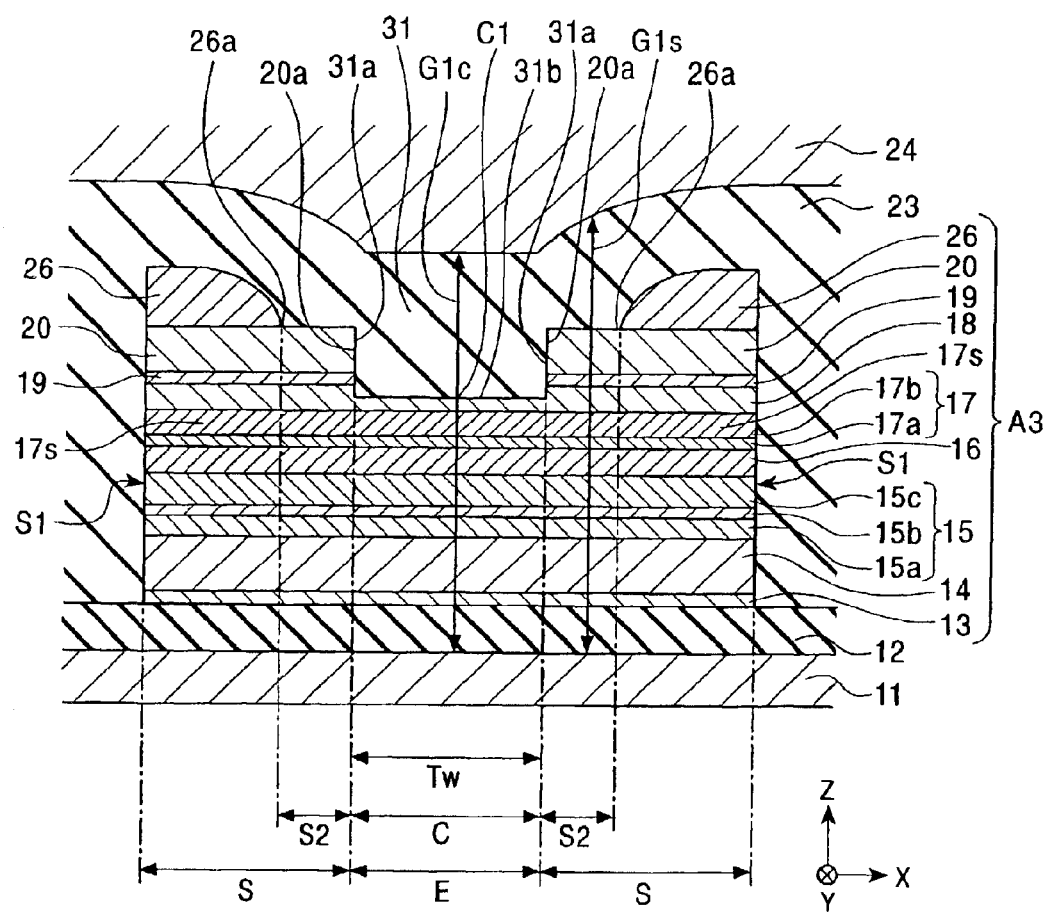
FIG. 12 is a cross-sectional view of a magnetic sensing element made by the method of the fourth embodiment of the present invention, as viewed from an air-bearing surface (ABS)

In the magnetic sensing element shown in FIG. 12, edges 26a of the electrode layers 26 opposing the track width region C are closer to outer edges S1 of the composite A3 than the end faces 20a of the second antiferromagnetic layer 20 opposing the track width region C are to the outer edges S1 of the composite A3. Here, the term "track width region C" refers to the region in the composite A3 covered by the bottom portion 31b of the indent 31. Hence, the width of the track width region C is equal to the track width $T_w$. The width of the track width region C is also equal to the width of the sensitive region E in which the magnetization direction of the free magnetic layer 17 changes.

As shown in FIG. 12, when the edges 26a of the electrode layers 26 and the end faces 20a of the second antiferromagnetic layers 20 are arranged as above, the step differences formed by the bottom portion 31b of the indent 31, the electrode layers 26, and the second antiferromagnetic layers 20 can be made smaller. As a result, a thin upper gap layer 23 can be reliably formed on these step differences. Thus, short-circuiting between the upper shield layer 24 and the electrode layers 26, the second antiferromagnetic layers 20, the ferromagnetic layers 19, and the nonmagnetic layer 18 can be securely prevented. A magnetic sensing element which can sufficiently meet the need for narrow gaps can be obtained.

As shown in FIG. 12, if the distance between the upper shield layer 24 and the lower shield layer 11 is large at the two side regions of the track width region C in the composite A3, a magnetic field from a recording medium generated from the tracks adjacent to the target recording track readily enters the magnetic sensing element through the region between the upper shield layer 24 and the lower shield layer 11. This increases the effective track width and generates cross-talks between recording tracks.

The step differences formed by the indent 31, the electrode layers 26 and the second antiferromagnetic layers 20 can be made smaller. Thus, the distance between the lower shield layer 11 and the upper shield layer 24 at two side portions of the track width region C can be minimized, and the effective track width can be reduced.

As shown in FIG. 12, the distance between the lower shield layer 11 and the upper shield layer 24 at regions S2 covered by the ferromagnetic layers 19 and the second antiferromagnetic layers 20, but not by the electrode layers 26, is represented by G1s, and the distance between the lower shield layer 11 and the upper shield layer 24 at a center C1 of the composite A3 is represented by G1c. The values of G1s and G1c preferably satisfy the relationship ~G1c≦G1s≦G1c+about 90 nm, more preferably, ~G1c≦G1s≦G1c+about 70 nm, and yet more preferably, ~G1c≦G1s≦G1c+about 30 nm.

Alternatively, the values of G1s and G1c preferably satisfy the relationship ~1.00≦G1s/G1c≦~2.50, more preferably, ~1.00≦G1s/G1c≦~2.17, and even more preferably, ~1.00≦G1s/G1c≦~1.50.

Fifth Embodiment

If the magnetic sensing element is to be incorporated into a floating head, a lower shield layer and a lower gap layer are formed on a trailing end face of a ceramic slider with an insulating film, such as an $Al_2O_3$ film, therebetween.

In the step shown in FIG. 1, the base layer 13, the first antiferromagnetic layer 14, the pinned magnetic layer 15, the nonmagnetic material layer 16, the free magnetic layer 17, and the nonmagnetic layer 18 are sequentially deposited in a vacuum deposition apparatus to form the composite A1 using a thin-film forming process such as sputtering or vapor deposition. The pinned magnetic layer 15 is of a synthetic ferrimagnetic type and comprises the first pinned magnetic sublayer 15a, the nonmagnetic intermediate sublayer 15b, and the second pinned magnetic sublayer 15c.

Next, the resulting composite A1 is subjected to a first field annealing at a first annealing temperature in a magnetic field of a first magnitude in the Y direction to generate an exchange anisotropic magnetic field between the first antiferromagnetic layer 14 and the first pinned magnetic sublayer 15a. The first filed annealing is also performed to pin the magnetization direction of the pinned magnetic layer 15 in the Y direction in the drawing. In this embodiment, the first annealing temperature is about 270° C., and the first magnitude of the magnetic field is about 800 kA/m.

The ferromagnetic layer 19 and the second antiferromagnetic layer 20 are sequentially deposited on the composite A1 by sputtering to make a composite A2 including layers from the base layer 13 to the second antiferromagnetic layer 20, as shown in FIG. 2.

The following materials have been described in the first embodiment and will thus not be described again in this section: the materials of the base layer 13; the first antiferromagnetic layer 14; the pinned magnetic layer 15 comprising the first pinned magnetic sublayer 15a, the nonmagnetic intermediate sublayer 15b, and the second pinned magnetic sublayer 15c; the nonmagnetic material layer 16; the free magnetic layer 17; the nonmagnetic layer 18; the ferromagnetic layer 19; and the second antiferromagnetic layer 20.

In this embodiment, when the nonmagnetic layer 18 is composed of at least one element selected from the group consisting of Ru, Rh, Ir, Re, and Os, the surface of the nonmagnetic layer 18 is rarely oxidized during the first field annealing. Thus, an RKKY interaction can arise between the free magnetic layer 17 and the ferromagnetic layer 19, which are separated by the nonmagnetic layer 18, without milling the surface of the nonmagnetic layer 18 prior to the deposition of the ferromagnetic layer 19 on the nonmagnetic layer 18 by sputtering. In other words, the resulting interfaces between the nonmagnetic layer 18 and the ferromagnetic layers 19 are not subjected to milling. Thus, a reduction in the unidirectional anisotropic magnetic field for magnetizing the free magnetic layer 17 in a particular direction can be prevented.

Even when the surface of the nonmagnetic layer 18 is milled, a sufficient unidirectional anisotropic magnetic field for magnetizing the free magnetic layer 17 in a particular direction can still be obtained. This is because the ferromagnetic layer 19 and the free magnetic layer 17 are magnetically coupled by the RKKY interaction due to the nonmagnetic layer 18 therebetween.

In this embodiment also, the first antiferromagnetic layer 14 and the second antiferromagnetic layer 20 may be composed of the same antiferromagnetic material.

Next, the composite A2 is subjected to a second field annealing at a second annealing temperature using a magnetic field of a second magnitude in the X direction to generate an exchange anisotropic magnetic field between the second antiferromagnetic layer 20 and the ferromagnetic layer 19 and to pin the magnetization direction of the ferromagnetic layer 19 in the X direction in the drawing. In this embodiment, the second annealing temperature is about 250° C., and the second magnitude of the magnetic field is about 8 kA/m.

The exchange anisotropic magnetic field between the second antiferromagnetic layer 20 and the ferromagnetic layer 19 is generated in the second field annealing step. To orient the exchange anisotropic magnetic field between the second antiferromagnetic layer 20 and the ferromagnetic layer 19 in the X direction while sustaining the exchange anisotropic magnetic field between the first antiferromagnetic layer 14 and the first pinned magnetic sublayer 15a in the Y direction, the second annealing temperature is adjusted to be lower than the blocking temperature. In addition, the second magnitude of the magnetic field is adjusted to be smaller than that of the exchange anisotropic magnetic field between the first antiferromagnetic layer 14 and the first pinned magnetic sublayer 15a. The blocking temperature is the temperature at which the exchange coupling magnetic field caused by the first antiferromagnetic layer 14 vanishes. When the second field annealing is performed under these conditions, the exchange anisotropic magnetic field between the second antiferromagnetic layer 20 and the ferromagnetic layer 19 can be oriented in the X direction. This can be done while also sustaining the exchange anisotropic magnetic field between the first antiferromagnetic layer 14 and the first pinned magnetic sublayer 15a in the Y direction, even when the first antiferromagnetic layer 14 and the second antiferromagnetic layer 20 are made of the same material. Thus, under these conditions, the free magnetic layer 17 can be easily magnetized in a direction substantially orthogonal to the magnetization direction of the pinned magnetic layer 15.

The second magnitude of the magnetic field during the second field annealing is preferably larger than the saturation magnetization field of the free magnetic layer 17 and the ferromagnetic layer 19 and the demagnetizing field of the free magnetic layer 17 and the ferromagnetic layer 19. The second magnitude of the magnetic field during the second field annealing is preferably smaller than the spin-flop magnetic field which causes the antiparallel coupling between the free magnetic layer 17 and the ferromagnetic layer 19 to break.

In the step shown in FIG. 9, the pair of first resist layers R2 are deposited on the second antiferromagnetic layer 20. The first resist layers R2 are separated from each other by the gap W1 corresponding to the track width $T_w$.

As shown in FIG. 10, to form the indent 31 having the side faces 31a, the portion of the second antiferromagnetic layer 20 not covered by the first resist layers R2 is milled in a direction perpendicular to a surface 20b of the second antiferromagnetic layer 20, i.e., the Z direction as shown in the drawing, which is perpendicular to the track width direction (the X direction in the drawing). Examples of milling processes include ion milling and reactive ion etching (RIE). The side faces 31a are perpendicular to the track width direction, and the bottom portion 31b of the indent 31 lies in the nonmagnetic layer 18. The first resist layers R2 are removed after the indent 31 is formed.

Figure 13:
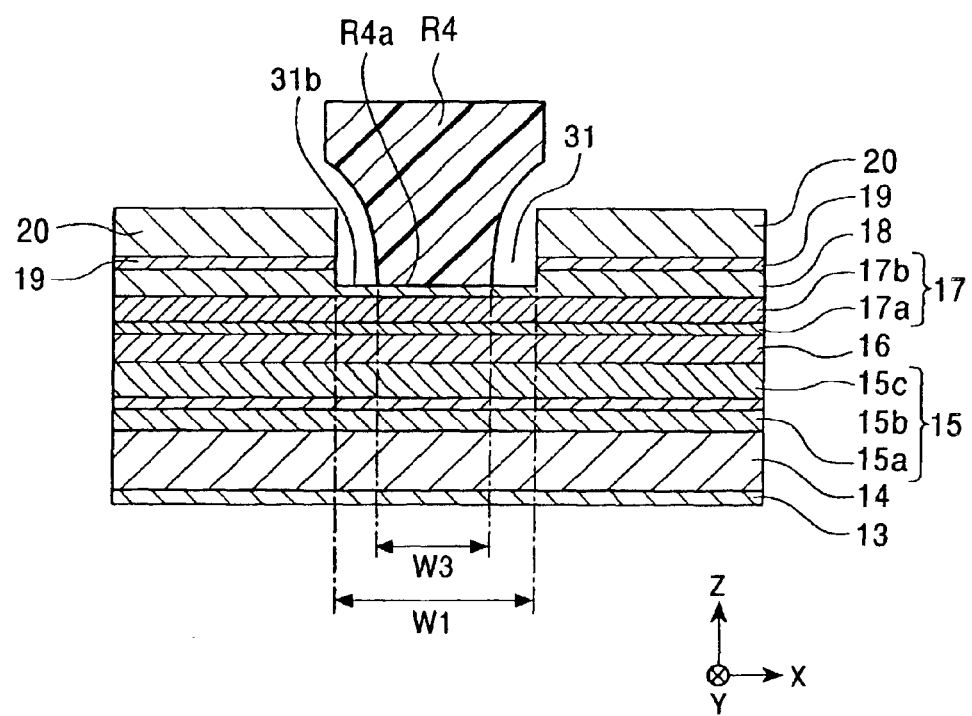
FIG. 13 is a cross-sectional view showing a step of a method for manufacturing a magnetic sensing element according to a fifth embodiment of the present invention.

As shown in FIG. 13, a second resist layer R4 is formed on the bottom portion 31b of the indent 31. The second resist layer R4 is of a lift-off type and has a bottom portion R4a having a width W3 in the track width direction. The width W3 is smaller than the width W1 of a bottom portion R1b of the resist layer R1.

Figure 14:
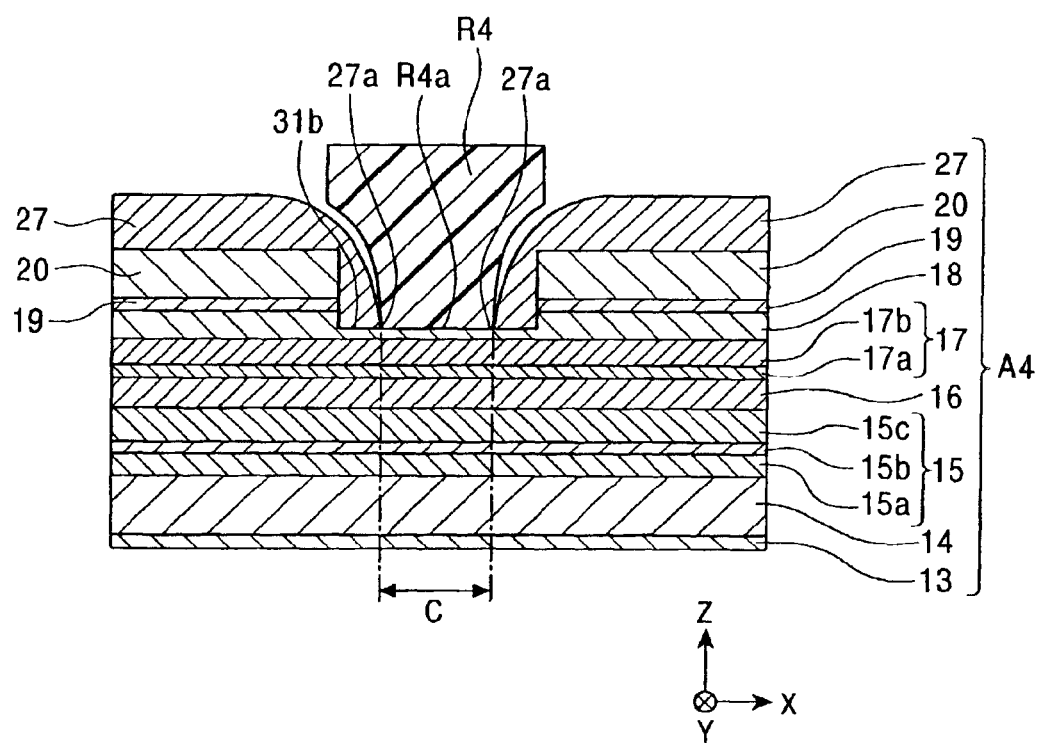
FIG. 14 is a cross-sectional view of a magnetic sensing element prepared using a step following the one performed in FIG. 13.

Electrode layers 27 are then deposited by sputtering on the second antiferromagnetic layers 20 and on the portions of the bottom portion 31b of the indent 31 not covered by the second resist layer R4 to form a composite A4, as shown in FIG. 14.

The incidence angle of the sputtering is controlled so that edges 27a of the electrode layers 27 reach the junctions where the second resist layer R4 and the bottom portion 31b of the indent 31 are joined. In this manner, the edges 27a of the electrode layers 27 are closer to the center C1 of the composite A4 than the end faces 19a of the ferromagnetic layers 19 and the end faces 20a of the second antiferromagnetic layers 20 are to the center C1. Note that in FIG. 14, the track width region C is the region between the edges 27a of the electrode layers 27.

The width W3 of the bottom portion R4a of the second resist layer R4 in the track width direction is equal to the distance between the edges 27a of the electrode layers 27. This distance defines the track width $T_w$ of the magnetic sensing element. The region having the track width $T_w$, i.e., the track width region C, functions as the sensitive region E which exhibits the magnetoresistive effect.

Figure 15:
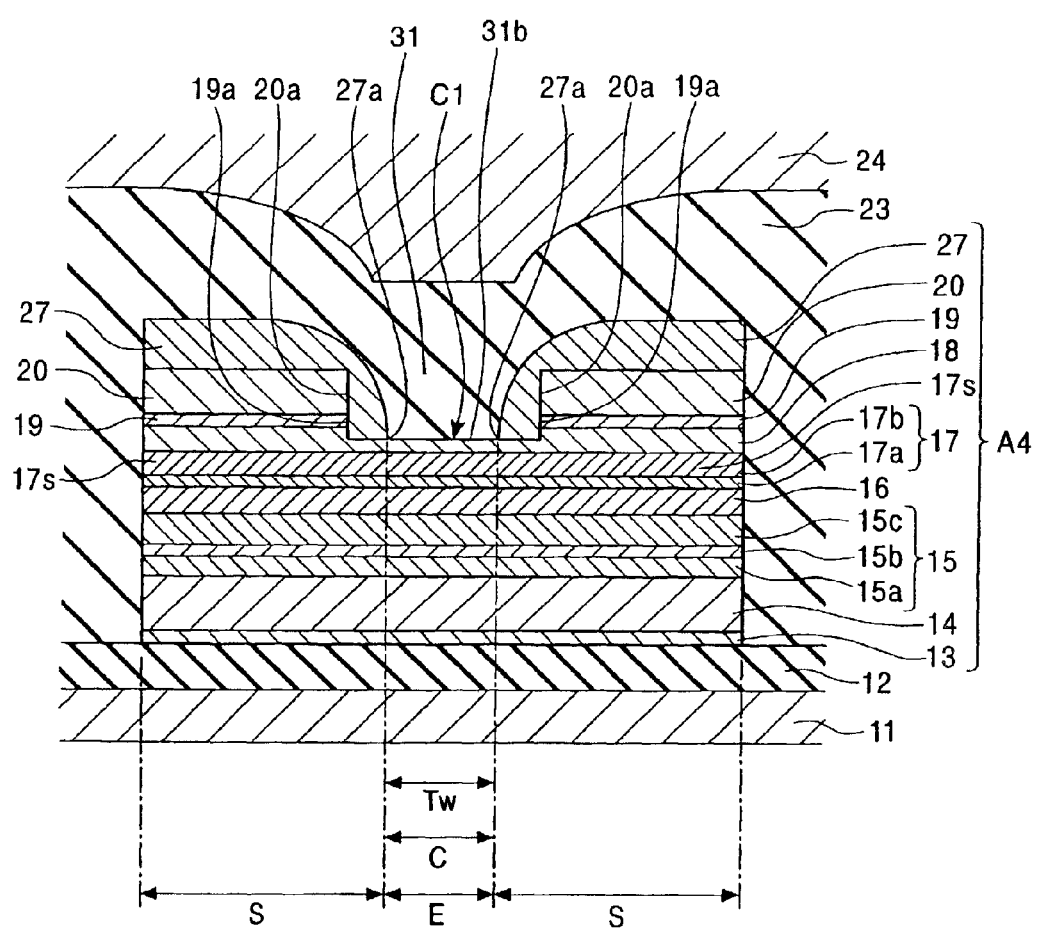
FIG. 15 is a cross-sectional view of a magnetic sensing element made by the method of the fifth embodiment of the present invention, as viewed from an air-bearing surface (ABS)

After forming the electrode layers 27, the second resist layer R4 is removed to obtain the composite A4 shown in FIG. 15. The first antiferromagnetic layer 14 and the second antiferromagnetic layer 20 may be composed of the same antiferromagnetic material.

Alternatively, protective layers composed of a nonmagnetic material such as tantalum may be provided between the second antiferromagnetic layers 20 and the electrode layers 27.

The upper gap layer 23 and the upper shield layer 24 are deposited on the composite A4 to obtain the magnetic sensing element shown in FIG. 15.

The ferromagnetic layers 19 and the second antiferromagnetic layers 20 are composed of a material having a higher specific resistance compared with the material of the electrode layers 27. If the electrode layers 27 are formed only on the ferromagnetic layers 19 and the second antiferromagnetic layers 20, a direct current fed to the electrode layers 27 flows into the nonmagnetic layer 18, the free magnetic layer 17, the nonmagnetic material layer 16, and the pinned magnetic layer 15. The direct current flow occurs via the ferromagnetic layers 19 and the second antiferromagnetic layers 20. This results in an increase in the DC resistance of the magnetic sensing element.

If the edges 27a of the lower sublayer 27 are extended onto the nonmagnetic layer 18 toward the center C1 of the composite A4, and the edges of the electrode layers 27 are closer to the center C1 than the end faces 19a of the ferromagnetic layers 19 and the end faces 20a of the second antiferromagnetic layer 20 are to the center C1, a direct current from the electrode layers 27 can flow to the magnetic sensing element. The direct current flow can occur without having to pass through the ferromagnetic layers 19 and the second antiferromagnetic layers 20. As a result, the DC resistance of the magnetic sensing element can be reduced.

The track width $T_w$ of the magnetic sensing element shown in FIG. 15 is regulated by the distance between the edges 27a of the electrode layers 27. Thus, the track width $T_w$ can remain substantially unaffected even if the magnetization direction of the side portions 17s of the free magnetic layer 17 becomes readily rotatable as a result of changes in their compositions or sagging of layers in the vicinity of the end faces 20a of the second antiferromagnetic layers 20.

In the step shown in FIG. 10, the bottom portion 31b of the indent 31 is formed in the nonmagnetic layer 18. Alternatively, the bottom portion 31b may be formed in the second antiferromagnetic layer 20 or in the ferromagnetic layer 19.

Sixth Embodiment

A sixth embodiment of a method for making a magnetic sensing element according to the present invention is described with reference to FIG. 16.

Figure 16:
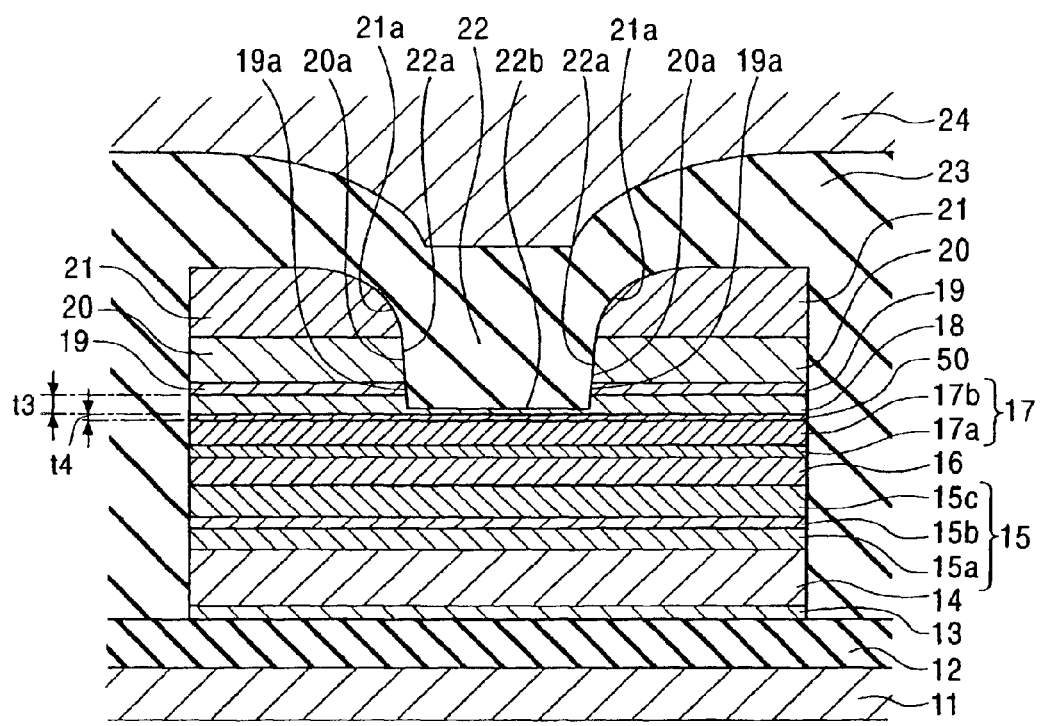
FIG. 16 is a cross-sectional view of a magnetic sensing element made by the method of a sixth embodiment of the present invention, as viewed from an air bearing surface (ABS)

As shown in FIG. 1, in forming the composite A1, a conductive layer 50 composed of a material having a specific resistance lower than the material of the nonmagnetic layer 18, for example, copper, is formed between the nonmagnetic layer 18 and the free magnetic layer 17 to eventually form a magnetic sensing element shown in FIG. 16.

The conductive layer 50 composed of a conductive material having a specific resistance lower than that of the material of the nonmagnetic layer 18 contributes to generating a larger spin filter effect compared to the case in which only the nonmagnetic layer 18 is provided. Thus, with the conductive layer 50, the magnetic sensitivity of the magnetic sensing element can be further improved. When the conductive layer 50 is formed using copper, the difference between the crystal lattice constant of the conductive layer 50 and that of the free magnetic layer 17 composed of NiFe or CoFeNi can be narrowed. This narrowed difference generates a large spin filter effect.

In forming the conductive layer 50, the nonmagnetic layer 18 may be formed using Ru to a thickness t3 of about 0.4 to about 1.1 nm. The conductive layer 50 may then be formed using Cu to a thickness t4 of about 0.3 to about 0.5 nm.

Seventh Embodiment

A seventh embodiment of a method for making a magnetic sensing element according to the present invention is described with reference to FIGS. 1 and 17.

As shown in FIG. 1, in forming the composite A1, a free magnetic layer 40 is formed between the nonmagnetic layer 18 and the nonmagnetic material layer 16 to replace the free magnetic layer 17. The free magnetic layer 40 is made of a synthetic ferrimagnetic type and comprises a first free magnetic sublayer (a first ferromagnetic sublayer) 40a, a second free magnetic sublayer (a second ferromagnetic sublayer) 40c, and a nonmagnetic intermediate sublayer 40b disposed between the first and second free magnetic sublayers 40a and 40c. The magnetic moments per unit area of the first free magnetic sublayer 40a and the second free magnetic sublayer 40c differ from each other. The resulting magnetic sensing element is shown in FIG. 17.

Figure 17:
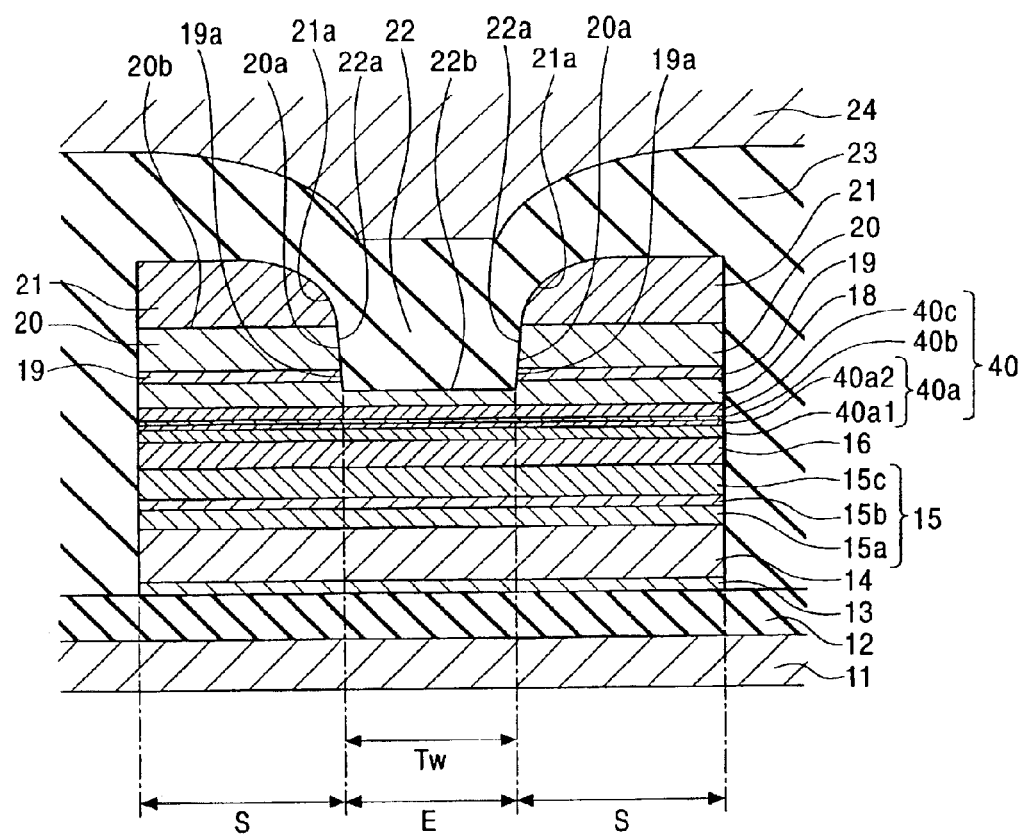
FIG. 17 is a cross-sectional view of a magnetic sensing element made by the method of a seventh embodiment of the present invention, as viewed from an air bearing surface (ABS)

The magnetic sensing element shown in FIG. 17 has a free magnetic layer of a ferrimagnetic type in which a plurality of ferromagnetic sublayers having different magnitudes of the magnetic moment per unit area is deposited with a nonmagnetic sublayer therebetween. In this case, the magnetization directions of the ferromagnetic sublayers are oriented antiparallel to each other.

The first free magnetic sublayer 40a is constituted from an anti-diffusion film (intermediate film) 40a1 and a magnetic film 40a2. The anti-diffusion film 401a is composed of, for example, Co or CoFe and prevents the interdiffusion between the magnetic film 40a2 and the nonmagnetic material layer 16.

The first and second free magnetic sublayers 40a and 40c are formed of a ferromagnetic material. Examples of ferromagnetic materials include a NiFe alloy, Co, a CoNiFe alloy, a CoFe alloy, and CoNi alloy. A NiFe alloy is particularly preferred.

The nonmagnetic intermediate sublayer 40b is formed of at least one nonmagnetic material selected from the group consisting of Ru, Rh, Ir, Os, Cr, Re, and Cu. The nonmagnetic intermediate sublayer 40b is preferably made of Ru.

The first and second free magnetic sublayers 40a and 40c are formed such that the magnitude of the magnetic moment per unit area of each layer is different from the other. The magnitude of the magnetic moment is determined by multiplying the saturation magnetization $M_s$ and the layer thickness t.

The anti-diffusion film 40a1 formed between the first free magnetic sublayer 40a and the nonmagnetic material layer 16 makes the magnetic moment per unit area of the second free magnetic sublayer 40c different from the sum of the magnetic moments per unit area of the magnetic film 40a2 and the anti-diffusion film 40a1.

The thickness of the second free magnetic sublayer 40c is preferably in the range of about 0.5 to about 2.5 nm. The thickness of the first free magnetic sublayer 40a is preferably in the range of from about 2.5 to about 4.5 nm, more preferably, from about 3.0 to about 4.0, and most preferably, from about 3.5 to about 4.0 nm. The rate of change in magnetic resistance of the resulting spin-valve magnetic sensing element cannot be increased if the thickness of the first free magnetic sublayer 40a is not within the above ranges.

In FIG. 17, the first free magnetic sublayer 40a, the second free magnetic sublayer 40c, and the nonmagnetic intermediate sublayer 40b function as one free magnetic layer 40. The magnetic moment per unit area of the first free magnetic sublayer 40a differs from that of the second free magnetic sublayer 40c.

The magnetization directions of the first free magnetic sublayer 40a and the second free magnetic sublayer 40c are 180 degrees different from each other, i.e., in a ferrimagnetic state. Here, the first free magnetic sublayer 40a is magnetized in the direction of the magnetic field generated form the ferromagnetic layer 19. The second free magnetic sublayer 40c is magnetized in a direction 180 degrees opposite of this direction.

The advantages achieved by reducing the thickness of the free magnetic layer 40 can be also achieved by allowing the first free magnetic sublayer 40a and the second free magnetic sublayer 40c to enter a ferrimagnetic state described above. The ferrimagnetic state reduces an effective magnetic layer thickness $M_s \times t$, and allows the magnetization direction of the free magnetic layer 40 to readily rotate, thereby improving the magnetic sensitivity of the magnetoresistive element.

The magnetization direction of the free magnetic layer 40 is determined by the sum of the magnetic moment per unit area of the first free magnetic sublayer 40a and that of the second free magnetic sublayer 40c.

Only the magnetization direction of the first free magnetic sublayer 40a contributes to output. This is due to the relationship with the magnetization direction of the pinned magnetic layer 15.

When the magnetic thickness of the first free magnetic sublayer 40a differs from that of the second free magnetic sublayer 40c, the spin-flop magnetic field of the free magnetic layer 40 can be increased.

The spin-flop magnetic field refers to a magnitude of an external magnetic field at which the magnetic layers formerly having antiparallel magnetization directions no longer sustain such an antiparallel state due to the application of the external field.

Figure 18:
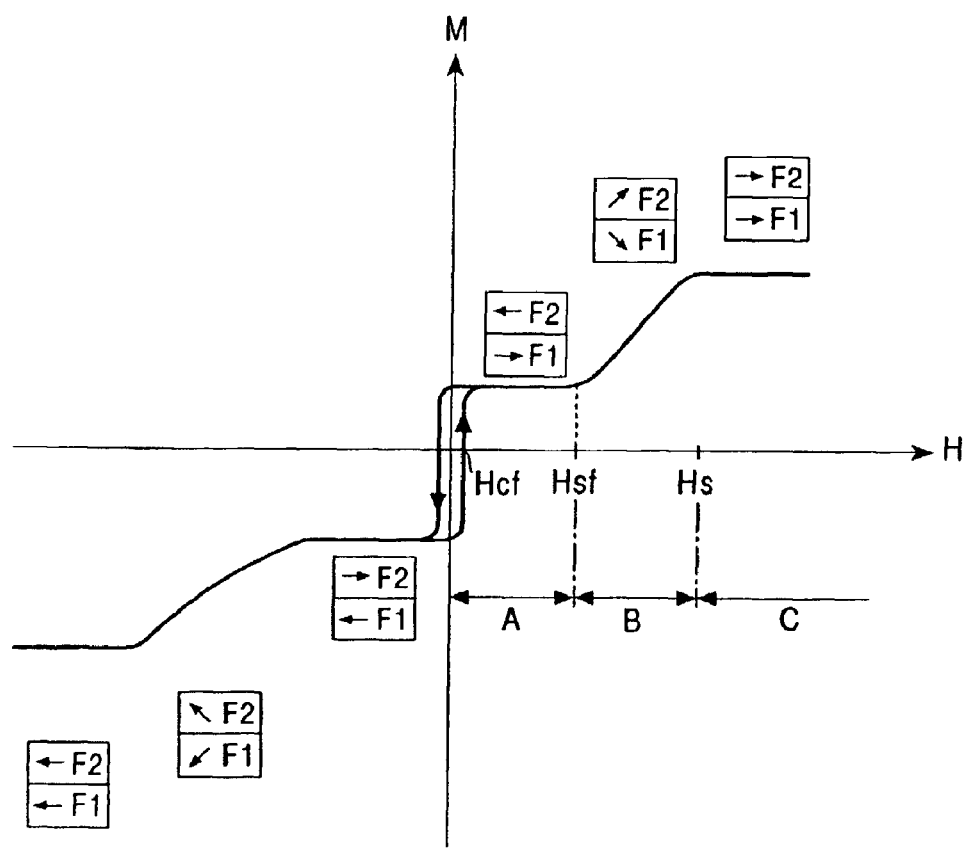
FIG. 18 is a graph schematically showing the hysteresis loop of the free magnetic layer of a synthetic ferrimagnetic type.

FIG. 18 is a graph that shows a hysteresis loop of the free magnetic layer 40. The M-H curve in the graph shows changes in magnetization M of the free magnetic layer 40 when an external magnetic field is applied to the free magnetic layer 40, as shown in FIG. 17, in the track width direction.

In FIG. 18, arrows F1 show the magnetization direction of the first free magnetic sublayer 40a. Arrows F2 show the magnetization direction of the second free magnetic sublayer 40c.

As shown in FIG. 18, when the external magnetic field is small, the first free magnetic sublayer 40a and the second free magnetic sublayer 40c are in a ferrimagnetic state. The arrows F1 and F2 are thus antiparallel to each other. However, when the external magnetic field H exceeds a certain value, the RKKY coupling between the first free magnetic sublayer 40a and the second free magnetic sublayer 40c can no longer be maintained. This phenomenon is the spin flop transition. The magnitude of the external magnetic field at which this spin flop transition occurs is defined as the spin-flop magnetic field. In FIG. 18, the spin-flop magnetic field is represented by $H_{sf}$ and the coercive force of the free magnetic layer 40 is represented by Hcf.

When the magnetic moment per unit area of the first free magnetic sublayer 40a differs from that of the second free magnetic sublayer 40c, the spin flop magnetic field $H_{sf}$ of the free magnetic layer 40 can be increased. As a result, the range of the magnetic field which allows the ferrimagnetic state to sustain becomes wider, and the ferrimagnetic state of the free magnetic layer 40 can be made more stable.

When the anti-diffusion film 40a1 is provided as in this embodiment, the first free magnetic sublayer 40a and the second free magnetic sublayer 40c are preferably composed of a magnetic CoFe alloy containing from about 7 to about 15 atomic percent Fe, and from about 5 to about 15 atomic percent Ni, and the balance being Co. With such a material, an exchange coupling magnetic field generated by the RKKY interaction between the first free magnetic sublayer 40a and the second free magnetic sublayer 40c can be increased. In particular, the spin-flop magnetic field $H_{sf}$ can be increased to as much as approximately 293 kA/m.

Further, the magnetization directions of the first free magnetic sublayer 40a and the second free magnetic sublayer 40c can be suitably pinned antiparallel to each other. This prevents side reading.

Preferably, both the first free magnetic sublayer 40a and the second free magnetic sublayer 40c are made of the CoFeNi alloy described above. In this case, a large spin-flop magnetic field can be stably obtained. In addition, the first free magnetic sublayer 40a and the second free magnetic sublayer 40c can be stably and suitably magnetized antiparallel to each other.

Moreover, the magnetostriction of the first free magnetic sublayer 40a and that of the second free magnetic sublayer 40c can be controlled in the range of from about $-3 \times 10^{-6}$ to about $3 \times 10^{-6}$. The coercive force can also be decreased to about 790 A/m or less. The soft magnetic property of the free magnetic layer 40 can be increased, and a change in resistance ($\Delta R$) and a rate of change in resistance ($\Delta R/R$) due to the diffusion of Ni between the free magnetic layer 40 and the nonmagnetic material layer 16 can be suitably controlled.

When the first free magnetic sublayer 40a is constituted from the magnetic film 40a2 without the anti-diffusion film 40a1, the magnetic film 40a2 and the second free magnetic sublayer 40c are preferably made of CoFeNi containing from about 9 to about 17 atomic percent Fe, from about 0.5 to about 10 atomic percent Ni, and the balance being Co.

All of the above-described magnetic sensing elements may include a conductive layer 50 formed between the nonmagnetic layer 18 and the free magnetic layer 17. The conductive layer 50 is preferably composed of a material having a specific resistance lower than that of the nonmagnetic layer 18. The free magnetic layer 17 in the above-described magnetic sensing elements may be of a synthetic ferrimagnetic type.

In the magnetic sensing elements shown in FIGS. 12, 15, 16, and 17, the side faces 22a of the indent 22 and the side faces 31a of the indent 31 can be made perpendicular to the track width direction. In this manner, the entire second antiferromagnetic layers 20 outside the track width region C can have a thickness sufficient for achieving the required antiferromagnetic property. This allows secure pinning of the magnetization direction of the portions of the free magnetic layer 17 outside the track width region C.

In this manner, the magnetization direction of the free magnetic layer 17 is rotatable only in the track width region C. Thus, the sensitive region E and side reading in the vicinity of the track width region C can be prevented.

Further, since the free magnetic layer 17 are extended to the regions covered by the second antiferromagnetic layers 20 and the ferromagnetic layers 19, the magnetization of the free magnetic layer 17 can be prevented from being influenced by the demagnetizing field caused by the surface magnetic charges of the two end faces of the free magnetic layer 17.

Since the ferromagnetic layers 19, the nonmagnetic layer 18, and the side portions 17s of the free magnetic layer 17 form a synthetic ferrimagnetic structure below the second antiferromagnetic layers 20, the unidirectional anisotropic magnetic field for orienting the magnetization direction of the side portions 17s in a particular direction can be increased. Thus, the magnetization direction of the side portions 17s of the free magnetic layer 17 is prevented from changing, thereby preventing an increase in the magnetic track width.

Moreover, the free magnetic layer 17 can be easily and reliably magnetized in a direction substantially orthogonal to the magnetization direction of the pinned magnetic layer 15. This can be done even when an exchange coupling magnetic field with the second antiferromagnetic layers 20 and the ferromagnetic layers 19 is relatively weak. Thus, the magnitude of the magnetic field during the second field annealing can be decreased to about 8000 A/m, and the magnetization direction of the pinned magnetic layer 15 can be easily prevented from changing.

As shown in FIG. 2, the ferromagnetic layer 19 and the second antiferromagnetic layer 20 are deposited on the nonmagnetic layer 18 having a flat upper surface 18a. Thus, the ferromagnetic layer 19 and the second antiferromagnetic layer 20 also have flat surfaces. With this structure, the RKKY interaction between the ferromagnetic layer 19 and the free magnetic layer 17 in the synthetic ferrimagnetic structure comprising the ferromagnetic layer 19, the nonmagnetic layer 18, and the free magnetic layer 17 can be further increased.

When the upper surface 18a of the nonmagnetic layer 18 is flat as described above, the deposition step of the ferromagnetic layer 19 and the second antiferromagnetic layer 20 can be easily controlled. In addition, the thickness of the ferromagnetic layer 19 can be decreased. With thin ferromagnetic layers 19, the spin-flop magnetic field between the ferromagnetic layers 19 and the free magnetic layer 17 can be increased in the resulting synthetic ferrimagnetic structure constituted from the ferromagnetic layers 19, the nonmagnetic layer 18, and the free magnetic layer 17.

The thickness of the ferromagnetic layers 19 can be from about 1.5 nm to about 4.0 nm, for example. In this manner, the unidirectional anisotropic magnetic field applied to the free magnetic layer 17 can also be increased. For example, when the ferromagnetic layers 19 and the free magnetic layer 17 are made of NiFe, a unidirectional anisotropic magnetic field of about 56 kA/m can be obtained. When the ferromagnetic layers 19 and the free magnetic layer 17 are made of CoFe, a unidirectional anisotropic magnetic field of about 152 kA/m can be obtained.

When the nonmagnetic layer 18 is made of a conductive material such as Ru, the nonmagnetic layer 18 also exhibits the spin-filter effect. This further improves the magnetic sensitivity of the resulting magnetic sensing element.

In the above first to seventh embodiments shown in FIGS. 1 to 17, methods for manufacturing a current-in-plane (CIP)

type magnetic sensing element are described. In a CIP type magnetic sensing element, electrode layers (for example, the electrode layers 21, the electrode layers 26, and the electrode layers 27) are formed on the side regions S of a composite in the track width direction (the X direction in the drawing). In this case, the composite comprises a pinned magnetic layer, a nonmagnetic material layer, and a free magnetic layer. An electrical current flows in a direction parallel to the surfaces of layers constituting the composite.

In contrast, methods of eighth to fourteenth embodiments described below with reference to FIGS. 21 to 34 are for manufacturing a current-perpendicular-to-plane (CPP) type magnetic sensing element in which electrode layers are formed above and below the composite. In addition, an electrical current from the electrode layers flows into the composite in a direction perpendicular to the surface of the layers constituting the composite.

Eighth Embodiment

An eighth embodiment of a method for making a magnetic sensing element of the present invention is described with reference to FIGS. 21 to 28.

Figure 21:
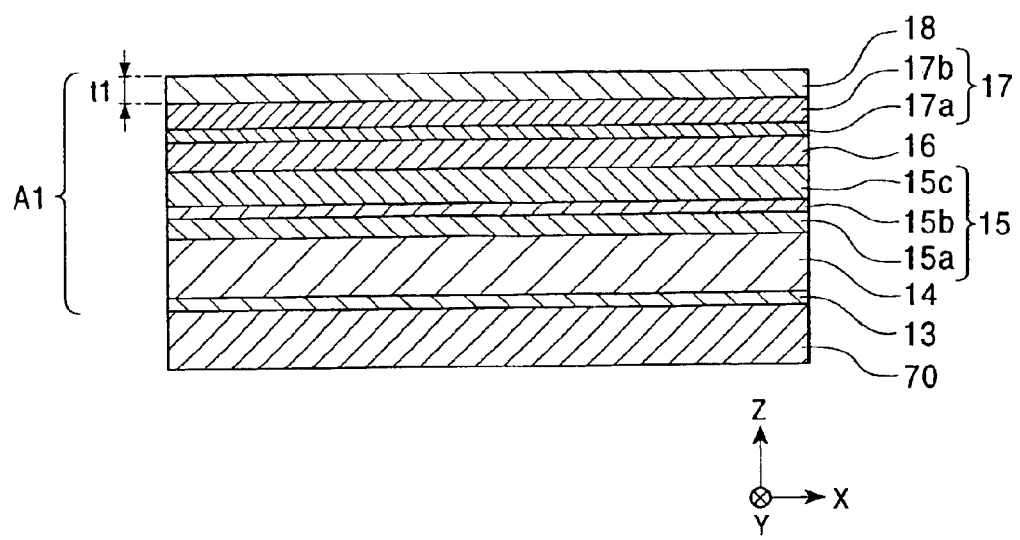
FIG. 21 is cross-sectional view showing a step of a method for manufacturing a magnetic sensing element according to a eighth embodiment of the present invention.

In the step shown in FIG. 21, a lower electrode layer 70, which also functions as a lower shield layer, is deposited on a substrate (not shown) using a magnetic material such as NiFe. The composite A1 which is the same as that formed in the step shown in FIG. 1 is formed on the lower electrode layer 70.

Subsequently, the composite A1 is subjected to a first field annealing at a first annealing temperature using a magnetic field of a first magnitude in the Y direction. This is done to generate an exchange anisotropic magnetic field between the first antiferromagnetic layer 14 and the first pinned magnetic sublayer 15a, and to pin the magnetization direction of the pinned magnetic layer 15 in the Y direction in the drawing. In this embodiment, the first annealing temperature is about 270° C., and the first magnitude of the magnetic field is about 800 kA/m.

As previously described with reference to FIG. 1, the nonmagnetic layer 18 is made of at least one element selected from the group consisting of Ru, Rh, Ir, Re, and Os. When the nonmagnetic layer 18 is made of Ru, the thickness $t_1$ of the nonmagnetic layer 18 is preferably adjusted to about 0.8 to about 1.1 nm, and more preferably, from about 0.85 to about 0.9 nm to enhance the RKKY interaction between the ferromagnetic layers 19 and the free magnetic layer 17.

Figure 22:
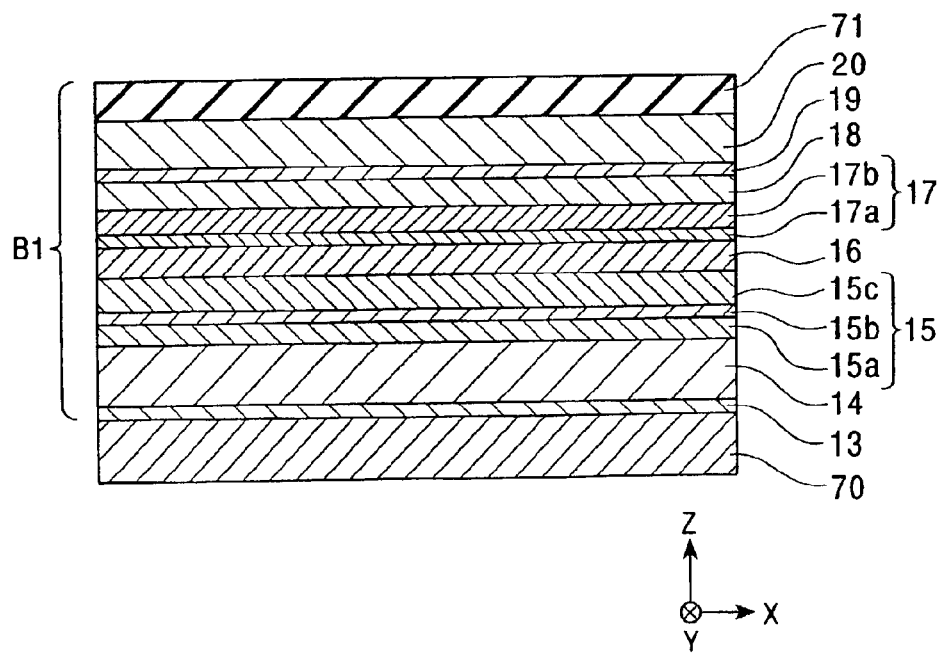
FIG. 22 is a cross-sectional view of a magnetic sensing element prepared using a step following the one performed in FIG. 21.

Next, in the step shown in FIG. 22, the ferromagnetic layer 19 is deposited on the nonmagnetic layer 18, and the second antiferromagnetic layer 20 and an insulating layer 71 are sequentially deposited on the ferromagnetic layer 19 to form a composite B1 on the lower electrode layer 70. The insulating layer 71 is composed of an insulating material such as $Al_2O_3$, $SiO_2$, AlN, $Ti_2O_3$, $Ti_3O_5$, or Al—Si—O.

The composite B1 is subjected to a second field annealing at a second annealing temperature using a magnetic field of a second magnitude in the X direction. This is done to generate an exchange anisotropic magnetic field between the second antiferromagnetic layer 20 and the ferromagnetic layer 19 and to pin the magnetization direction of the ferromagnetic layer 19 in a direction about 180° different from the X direction in the drawing. This pins the magnetization direction of the free magnetic layer 17 in the X direction in the drawing as a result of the RKKY interaction between the free magnetic layer 17 and the ferromagnetic layer 19 with the nonmagnetic layer 18 therebetween. In this embodiment, the second annealing temperature is about 250° C., and the second magnitude of the magnetic field is about 24 kA/m.

The free magnetic layer 17 and the ferromagnetic layer 19 are magnetized in opposite directions because the magnetic moment per unit area of the free magnetic layer 17 is larger than that of the ferromagnetic layer 19, and the second magnitude of the magnetic field is smaller than the spin-flop magnetic field between the free magnetic layer 17 and the ferromagnetic layer 19.

The exchange anisotropic magnetic field between the second antiferromagnetic layer 20 and the ferromagnetic layer 19 is generated in the second field annealing step. To orient the exchange anisotropic magnetic field generated by the second antiferromagnetic layer 20 in a direction about 180° different from the X direction (as shown in the drawing), the second annealing temperature must be lower than the blocking temperature at which the exchange anisotropic magnetic field caused by the first antiferromagnetic layer 14 vanishes. Also, the second magnitude of the magnetic field must be smaller than the exchange anisotropic magnetic field caused by the first antiferromagnetic layer 14. Under these conditions, the exchange anisotropic magnetic field generated by the first antiferromagnetic layer 14 in the Y direction (as shown in the drawing) can be sustained.

When the second field annealing is performed under the above conditions, the exchange anisotropic magnetic field generated by the second antiferromagnetic layer 20 can be oriented in a direction antiparallel to the X direction (as shown in the drawing). At the same time, the exchange anisotropic magnetic field caused by the first antiferromagnetic layer 14 in the Y direction in the drawing can be sustained, even when the first and second antiferromagnetic layers 14 and 20 are composed of the same antiferromagnetic material. Thus, the magnetization direction of the free magnetic layer 17 can be easily pinned in a direction substantially perpendicular to the magnetization direction of the pinned magnetic layer 15.

Preferably, the second magnitude of the magnetic field during the second field annealing is larger than the saturation magnetization of the free magnetic layer 17 and the ferromagnetic layer 19, and the demagnetizing field of the free magnetic layer 17 and the ferromagnetic layer 19. Preferably, the second magnitude is smaller than the spin-flop magnetic field at which the antiparallel coupling breaks.

Figure 23:
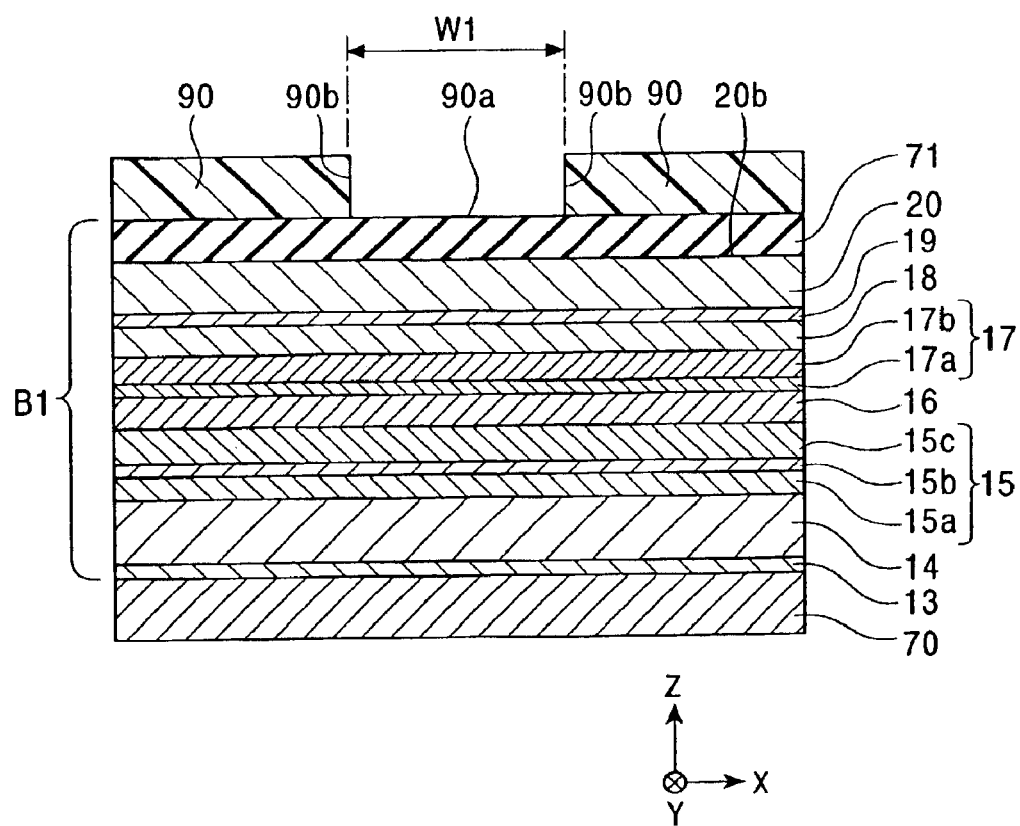
FIG. 23 is a cross-sectional view of a magnetic sensing element prepared using a step following the one performed in FIG. 22.

Next, in the step shown in FIG. 23, a resist layer 90 having an opening 90a at the center in the track width direction (the X direction in the drawing) is formed on the insulating layer 71 by exposure and development. The resist layer 90 has inner side faces 90b perpendicular to the surface of the insulating layer 71 (or the substrate). Alternatively, the inner side faces 90b may be formed as flat or curved slopes wherein a gap W1 between the inner side faces 90b gradually increases toward upper surface of the resist layer 90.

Figure 24:
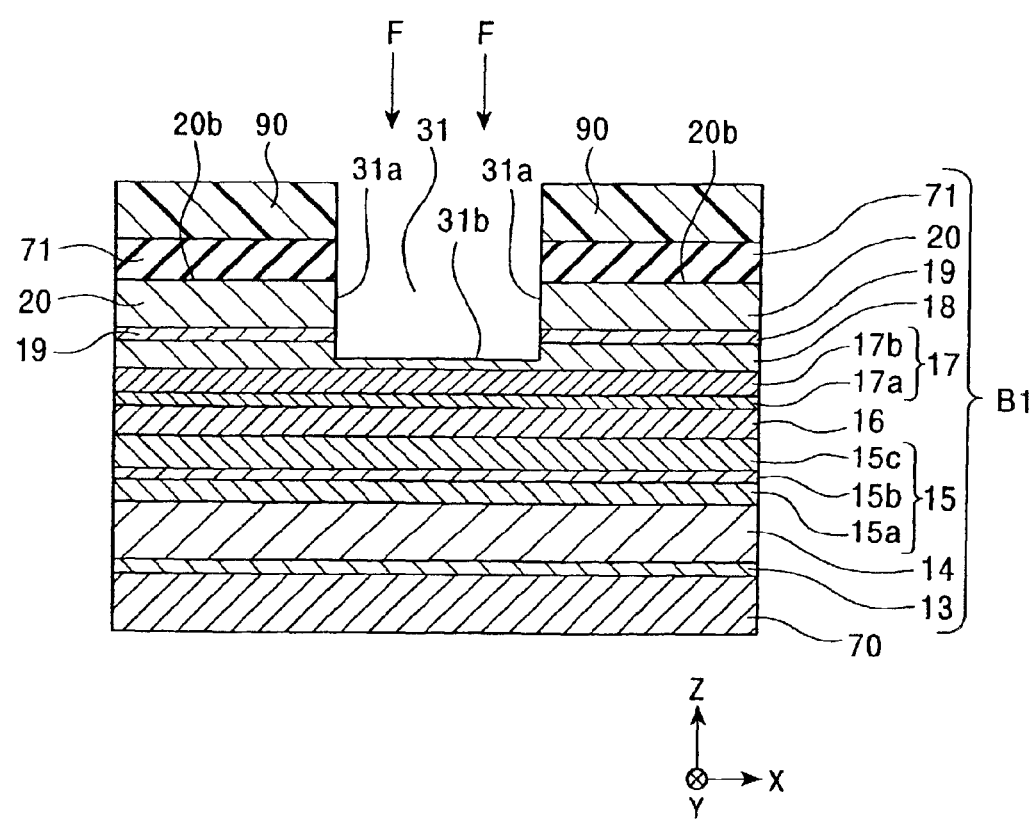
FIG. 24 is a cross-sectional view of a magnetic sensing element prepared using a step following the one performed in FIG. 23.

In the subsequent step shown in FIG. 24, the portions of the insulating layer 71, the second antiferromagnetic layer 20, and the ferromagnetic layer 19 not covered by the resist layer 90 are completely milled by techniques such as ion milling or reactive ion etching (RIE) in the direction of the arrow F as shown in FIG. 24. The nonmagnetic layer 18 is milled partway. In FIG. 24, the side faces 31a of the indent 31 formed in the composite is perpendicular to the surface of the insulating layer 71 (or surface of the substrate). The resist layer is then removed.

If the inner side faces 90b of the resist layer 90 are formed as flat or curved slopes, or if the incidence angle of the ion beam during ion milling is tilted with respect to a direction perpendicular to the surface of the resist layer 90, the side faces 31a of the indent 31 are also formed as a flat or curved slopes.

In this embodiment, the resist layer 90 is deposited on an unworked insulating layer 71 and ion milling or the reactive ion etching is performed using the resist layer 90 as a mask. Alternatively, during the step shown in FIG. 22, a lift-off resist layer may be formed on the second antiferromagnetic layer 20 and at the center in the track width direction (the X direction in the drawing).

A lift-off resist layer may also be formed on a protective layer, composed of Ta or the like, on the second antiferromagnetic layer 20 and at the center in the track width direction. Using the lift-off resist layer, the insulating layer 71 may be sputtered using the same insulating material. The resist layer may then be removed to form an insulating layer 71 having an opening at the center. The indent 31 is formed by milling the ferromagnetic layer 19 while using the insulating layer 71 having an opening as a mask. Examples of milling processes include ion milling and reactive ion etching (RIE). The second field annealing is preferably performed after formation of the indent 31 in the composite B1.

Figure 25:
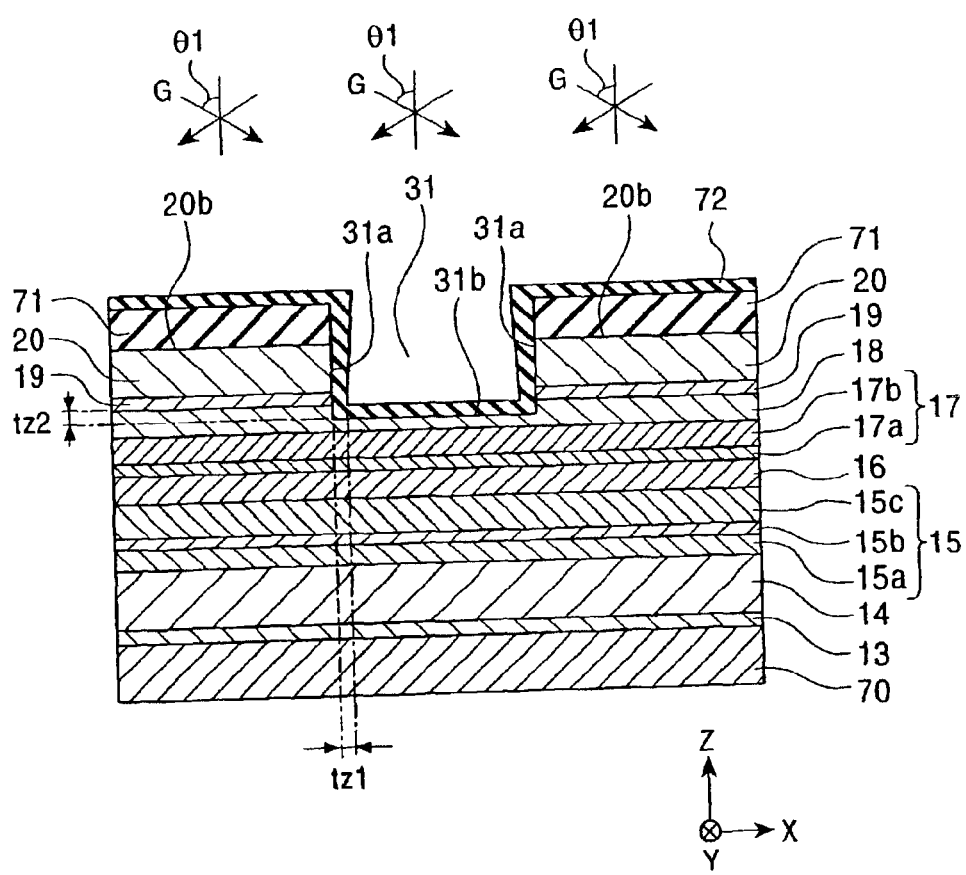
FIG. 25 is a cross-sectional view of a magnetic sensing element prepared using a step following the one performed in FIG. 24.

In the step shown in FIG. 25, another insulating layer 72 (second insulating layer) is deposited on the insulating layer 71, the side faces 31a, and the bottom portion 31b of the indent 31 by sputtering using an insulating material such as $Al_2O_3$, $SiO_2$, AlN, TiC, or the like. Examples of sputtering processes include ion beam sputtering, long-throw sputtering, and collimation sputtering.

In the step shown in FIG. 25, the sputter angle θ1 during the formation of the second insulating layer 72 is critical. As shown in FIG. 25, a sputtering direction G preferably has a sputtering angle θ1 as large as possible with respect to a direction perpendicular to the surface of each layer of the composite. At such an angle, the second insulating layer 72 can be easily deposited on the side faces 31a of the indent 31. The sputtering angle θ1 is preferably in the range of from about 50° to about 70°, for example. At such a sputtering angle θ1, the thickness tz1 of the second insulating layer 72 deposited on the side faces 31a can be made larger than the thickness tz2 of the second insulating layer 72 deposited on the insulating layers 71 and the bottom portion 31b of the indent 31. (In this case, the thickness tz1 is measured along the track width direction which corresponds to the X direction as shown in the drawing.)

If the thickness of the second insulating layer 72 is not adjusted as above, the second insulating layer 72 on the side faces 31a of the indent 31 would be completely removed or milled to such a small thickness during ion milling that the second insulating layer 72 cannot function as an insulating layer for reducing shunt losses.

Figure 26:
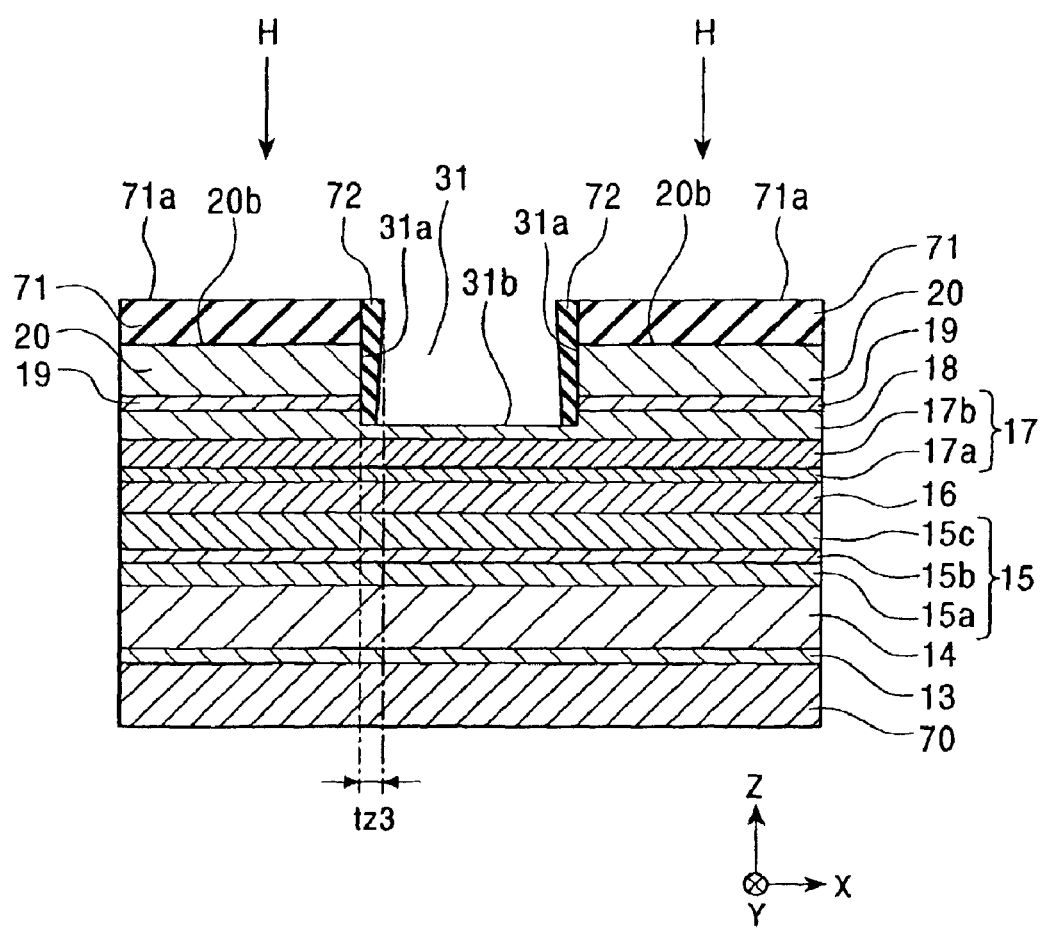
FIG. 26 is a cross-sectional view of a magnetic sensing element prepared using a step following the one performed in FIG. 25.
Figure 27:
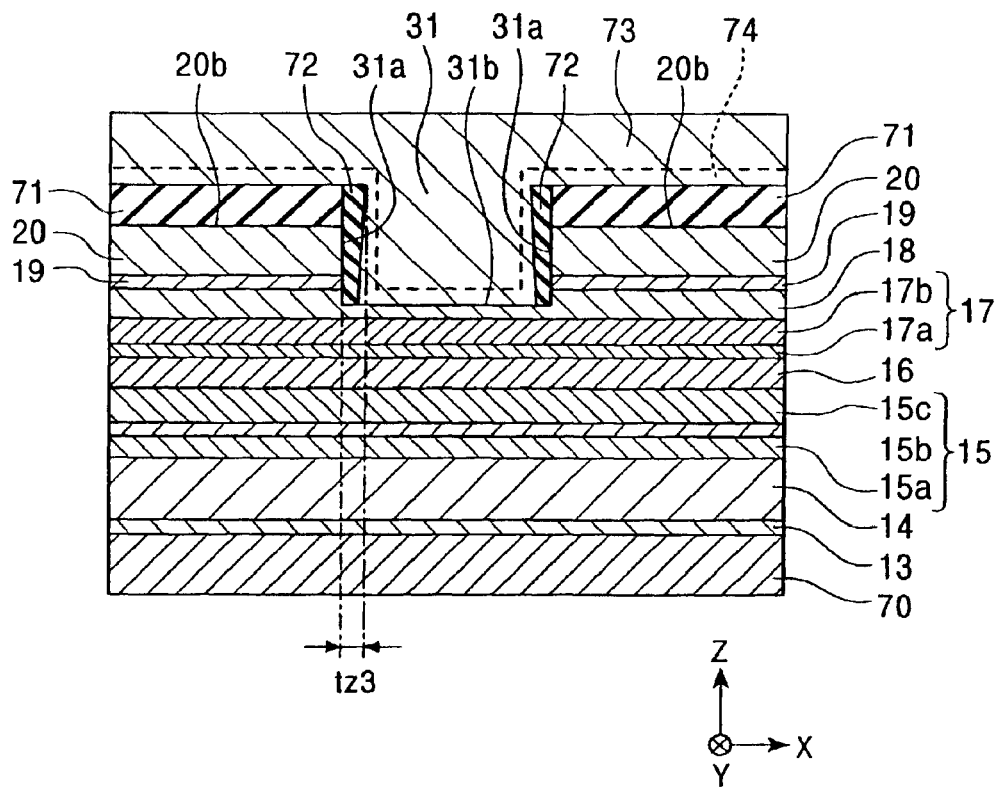
FIG. 27 is a cross-sectional view of a magnetic sensing element prepared using a step following the one performed in FIG. 26.

Next, in the step shown in FIG. 26, ion milling is performed at an angle perpendicular to or approximately perpendicular, i.e., at an angle of from about 0° to about 20° with respect to an angle perpendicular, to the surface of each layer in the composite. Ion milling is performed until the second insulating layer 72 deposited on the bottom portion 31b of the indent 31 is properly removed. During ion milling, the second insulating layer 72 deposited on the surfaces 71a of the insulating layers 71 is also removed. Some amount of the second insulating layer 72 deposited on the side faces 31a of the indent 31 is also removed.

The second insulating layer 72 deposited on the side faces 31a of the indent 31 has a thickness tz1 larger than the thickness of the second insulating layer 72 formed on the bottom portion 31b. In addition, the milling direction H enters the second insulating layer 72 on the side faces 31a at a low incidence angle when viewed from the second insulating layer 72 on the side faces 31a. Thus, the second insulating layer 72 on the side faces 31a of the indent 31 is more difficult to mill than the second insulating layer 72 deposited on the bottom portion 31b. A second insulating layer 72 which has a sufficient thickness therefore remains on the side faces 31a of the indent 31.

The thickness tz3 (which is measured along the track width direction) of the second insulating layer 72 which remains on the side faces 31a of the indent 31 is preferably in the range of from about 5 nm to about 10 nm.

As shown in FIG. 26, the second antiferromagnetic layers 20 are covered with the insulating layers 71, and the side faces 31a of the indent 31 are covered with the second insulating layer 72. In the subsequent step shown in FIG. 27, an upper electrode layer 73 is formed by plating on the insulating layer 71, the second insulating layer 72, and the bottom portion 31b of the indent 31. The upper electrode layer 73 is composed of a magnetic material such as NiFe and also functions as an upper shield layer. The resulting magnetic sensing element is shown in FIG. 28.

Figure 28:
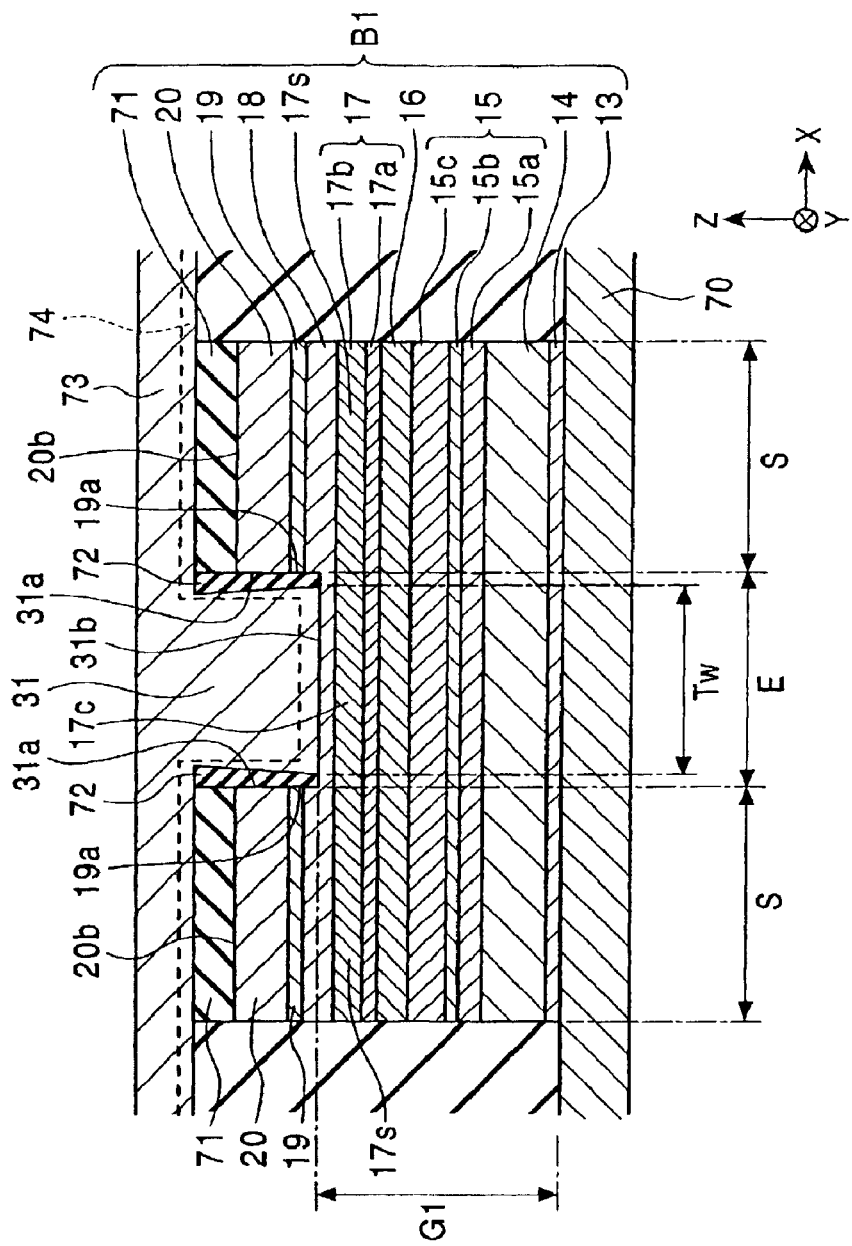
FIG. 28 is a cross-sectional view of a magnetic sensing element made by the method of the eighth embodiment of the present invention, as viewed from an air-bearing surface (ABS)

The magnetic sensing element shown in FIG. 28 has the insulating layers 71 covering the second antiferromagnetic layers 20 and the second insulating layers 72 covering the side faces 31a of the indent 31. In this structure, shunting of an electrical current supplied from the shield layer into the second antiferromagnetic layer 20 and the like can be prevented. The electrical current properly flows into the track width $T_w$ determined by the gap on the bottom portion 31b of the indent 30 between the second insulating layers 72. Thus, the magnetic sensing element shown in FIG. 28 exhibits an increased read output. This is because the path of electrical current can be prevented from being extended beyond the track width $T_w$, wherein $T_w$ is determined from the gap in the track width direction between the second insulating layers 72. Thus, a CPP-type magnetic sensing element having a small effective track width can be manufactured according to the present invention.

Moreover, the path of electrical current in the composite comprising layers from the free magnetic layer 17 to the base layer 13 is narrowed by the indent 31. As a result, shunting of an electrical current to the side portions of the composite can be effectively prevented, and a magnetic sensing element having a large read output can be effectively manufactured.

Ninth Embodiment

Figure 29:
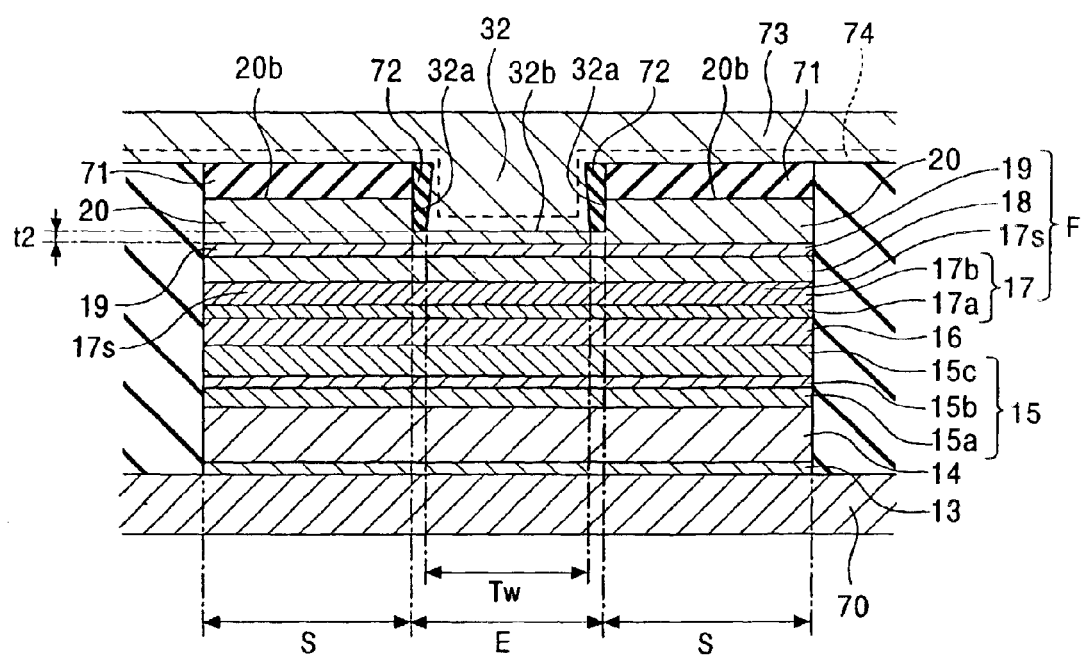
FIG. 29 is a cross-sectional view of a magnetic sensing element made by the method of a ninth embodiment of the present invention, as viewed from an air bearing surface (ABS)

In a manufacturing method of the ninth embodiment, the second antiferromagnetic layer 20 is milled partway after the step shown in FIG. 23. The resulting magnetic sensing element is shown in FIG. 29. The magnetic sensing element shown in FIG. 29 has an indent 32 having a bottom portion 32b lying in the second antiferromagnetic layer 20.

In the magnetic sensing element shown in FIG. 29, the bottom portion 32b of the indent 32 lies in the second antiferromagnetic layer 20. The free magnetic layer 17 and the ferromagnetic layer 19 are adjacent to each other with the nonmagnetic layer 18 therebetween. The magnetization directions of the free magnetic layer 17 and the ferromagnetic layer 19 are antiparallel to each other to enter a ferrimagnetic state. A composite F comprising the free magnetic layer 17, the nonmagnetic layer 18, and the ferromagnetic layer 19 functions as one free magnetic layer of a synthetic ferrimagnetic type.

In this embodiment, the thickness t2 of the second antiferromagnetic layer 20 covered by the bottom portion 32b of the indent 32 is larger than about 0 Å but not larger than about 50 Å. At such a thickness, no exchange coupling magnetic field is generated in the region of the second antiferromagnetic layer 20 covered by the bottom portion 32b of the indent 32. At the side regions S in the track width direction outside the indent 32, an exchange coupling magnetic field is generated between the second antiferromagnetic layer 20 and the ferromagnetic layer 19.

The magnetization direction of the ferromagnetic layer 19 is pinned by the exchange coupling magnetic field with the second antiferromagnetic layer 20 only at the side regions S outside the region covered by the bottom portion 32b of the indent 32. Also, the magnetization direction of the free magnetic layer 17 deposited on the ferromagnetic layer 19 with the nonmagnetic layer 18 therebetween is pinned only at the side regions S in the track width direction as a result of the RKKY interaction with the ferromagnetic layer 19.

When no external field is applied, the sensitive region E of the free magnetic layer 17 covered by the bottom portion 32b of the indent 32 is magnetized in the X direction (as shown in the drawing) because of the side regions S having a pinned magnetization. The magnetization direction of the sensitive region E changes when an external magnetic field is applied.

Tenth Embodiment

Figure 30:
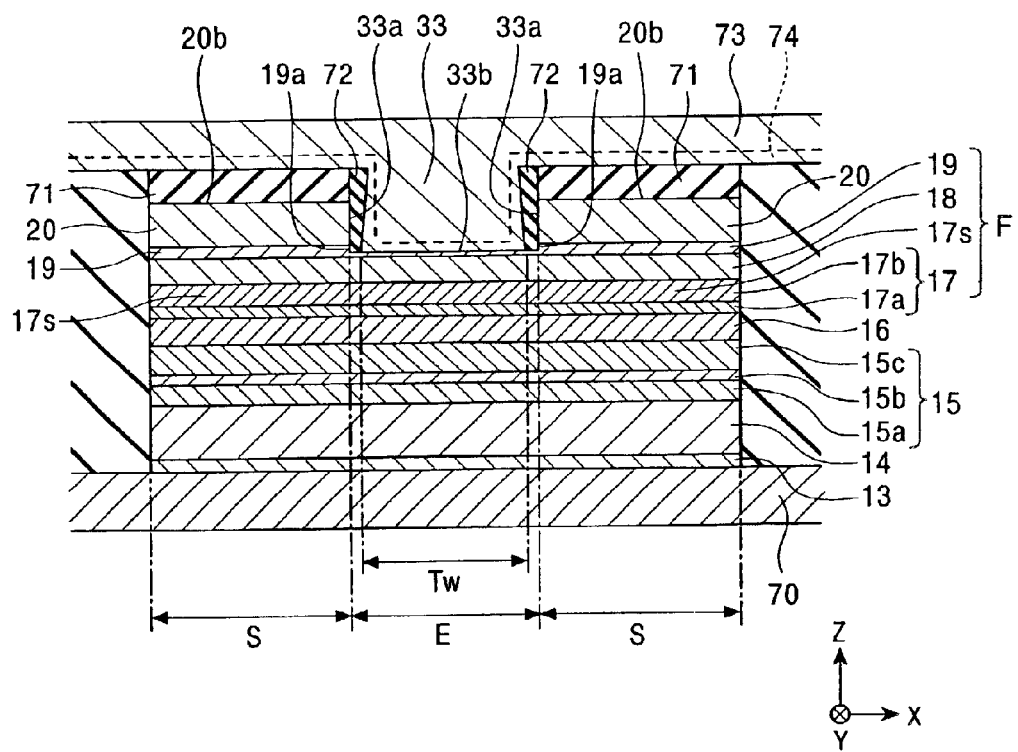
FIG. 30 is a cross-sectional view of a magnetic sensing element made by the method of a tenth embodiment of the present invention, as viewed from an air bearing surface (ABS)

In the tenth embodiment, the ferromagnetic layer 19 is milled partway after the step shown in FIG. 23 to form an indent 33 as shown in FIG. 30. The resulting magnetic sensing element is shown in FIG. 30. The indent 33 has side faces 33a penetrating the second antiferromagnetic layer 20. The indent 33 has a bottom portion 33b lying in the ferromagnetic layer 19.

In the magnetic sensing element shown in FIG. 30, the composite F comprising the free magnetic layer 17, the nonmagnetic layer 18, and the ferromagnetic layer 19 functions as one free magnetic layer of a synthetic ferrimagnetic type. In this embodiment, no second antiferromagnetic layer 20 is provided on the sensitive region E in which the magnetization direction of the free magnetic layer changes in response to an external magnetic field. Thus, the magnetization direction of the sensitive region E in the composite F is highly responsive to an external magnetic field. In addition, the resulting magnetic sensing element has an improved magnetic field sensitivity.

Eleventh Embodiment

Figure 31:
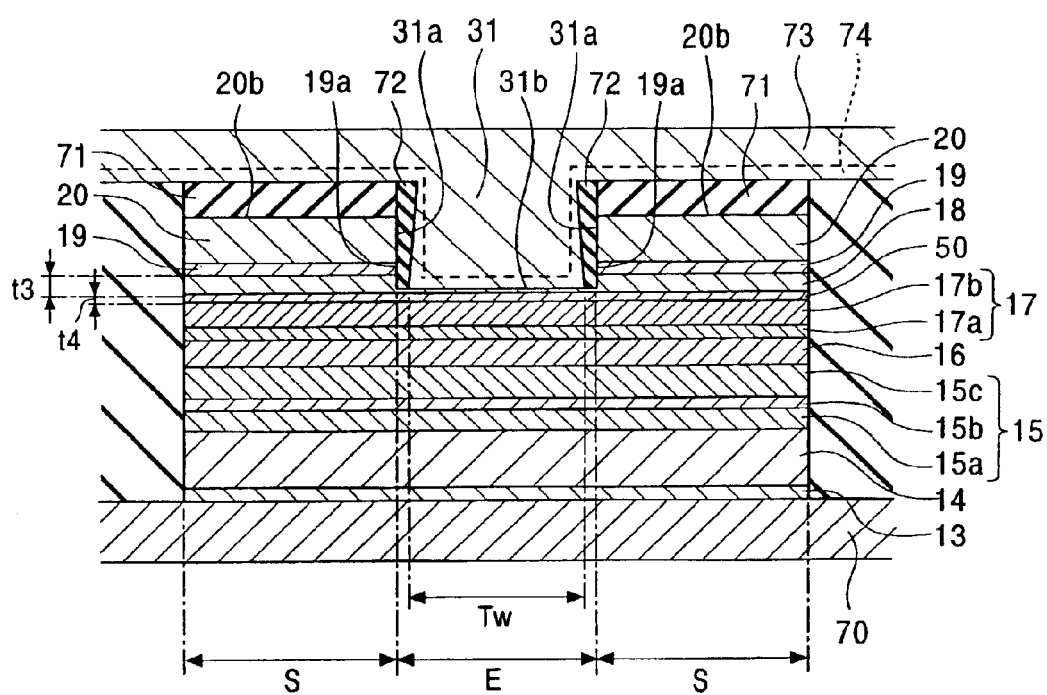
FIG. 31 is a cross-sectional view of a magnetic sensing element made by the method of a eleventh embodiment of the present invention, as viewed from an air bearing surface (ABS)

In forming the composite A1 as shown in FIG. 21, a conductive layer 50 is provided between the nonmagnetic layer 18 and the free magnetic layer 17 for the manufacture of a magnetic sensing element shown in FIG. 31. The conductive lyare 50 may be composed of a material, such as Cu, that has a specific resistance lower than that of the nonmagnetic layer 18.

The conductive layer 50 composed of such a material enhances the spin filter effect compared to when only a nonmagnetic layer 18 is provided. The resulting magnetic sensing element has an improved magnetic field sensitivity.

When the conductive layer 50 is formed using copper, the difference between the crystal lattice constant of the conductive layer 50 and that of the free magnetic layer 17 composed of NiFe or CoFeNi can be minimized. This generates a large spin filter effect.

In forming the conductive layer 50, the nonmagnetic layer 18 may be formed using Ru to a thickness t3 of from about 0.4 to 1.1 nm. The conductive layer 50 may then be formed using Cu to a thickness t4 of from about 0.3 to about 0.5 nm.

Twelfth Embodiment

Figure 32:
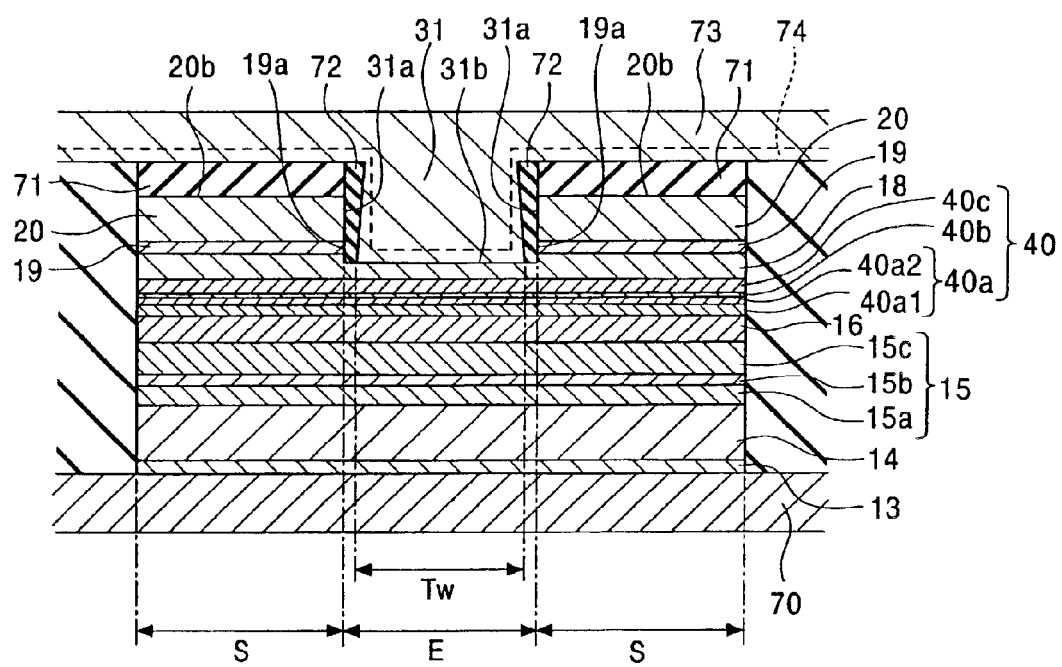
FIG. 32 is a cross-sectional view of a magnetic sensing element made by the method of a twelfth embodiment of the present invention, as viewed from an air bearing surface (ABS)

In this embodiment, during the step shown in FIG. 21 of forming the composite A1, a free magnetic layer 40 of a synthetic ferrimagnetic type is formed instead of the free magnetic layer 17. The free magnetic layer 40 comprises a first free magnetic sublayer (a first ferromagnetic sublayer) 40a, a second free magnetic sublayer (a second ferromagnetic sublayer) 40c, and a nonmagnetic intermediate sublayer 40b disposed between the first and second free magnetic sublayers 40a and 40c. The magnetic moments per unit area of the first free magnetic sublayer 40a and the second free magnetic sublayer 40c differ from each other. The resulting magnetic sensing element is shown in FIG. 32. The thickness and the material of the first free magnetic sublayer 40a, the second free magnetic sublayer 40c, and the nonmagnetic intermediate sublayer 40b are preferably the same as those in the seventh embodiment shown in FIG. 17.

The magnetic sensing element shown in FIG. 32 comprises the free magnetic layer 40 of a synthetic ferrimagnetic type. The free magnetic layer 40 comprises a plurality of ferromagnetic layers having different magnetic moments per unit area and stacked with a nonmagnetic layer therebetween. The magnetization direction of the plurality of ferromagnetic layers are antiparallel to each other.

In each of the magnetic sensing elements shown in FIGS. 29 to 32, the lower electrode layer 70, which functions as a lower shield layer, is provided under the first antiferromagnetic layer 14. The insulating layer 71 is provided on the second antiferromagnetic layers 20. The second insulating layer 72 is formed on the side faces 31a, 32a, and 33a of the indents 31, 32, and 33, respectively. The upper electrode layer 73, which also functions as an upper shield layer, is provided on the second insulating layer 72 and the bottom faces 31b, 32b, and 33b of the indents 31, 32, and 33, respectively.

When the nonmagnetic layer 18 is composed of at least one element selected from the group consisting of Ru, Rh, Ir, Re, and Os, the surface of the nonmagnetic layer 18 is hardly oxidized during the first field annealing. Hence, the RKKY interaction between the free magnetic layer 17 and the ferromagnetic layer 19 with the nonmagnetic layer 18 therebetween can occur even if the surface of the nonmagnetic layer 18 is no treated, i.e., milled, prior to sputter-deposition of the ferromagnetic layer 19 on the nonmagnetic layer 18. For example, when the free magnetic layer 17 and the ferromagnetic layer 19 are made of NiFe, and the nonmagnetic layer 18 is made of Ru, a unidirectional anisotropic magnetic field of about 42 kA/m can be generated without having to treat the surface of the nonmagnetic layer 18 using techniques such as milling.

The resulting interfaces between the nonmagnetic layer 18 and the ferromagnetic layers 19 are therefore not subjected to milling. As a result, the unidirectional anisotropic magnetic field for magnetizing the free magnetic layer 17 in a particular direction, as well as the antiparallel coupling magnetic field between the free magnetic layer 17 and the ferromagnetic layer 19, can be prevented from decreasing.

Because the ferromagnetic layer 19 and the free magnetic layer 17 are magnetically coupled as a result of the RKKY interaction through the nonmagnetic layer 18, the exchange coupling magnetic field between the second antiferromagnetic layer 20 and the ferromagnetic layer 19 can still be sufficiently supplied to the free magnetic layer 17 even when the surface of the nonmagnetic layer 18 is milled. Thus, a unidirectional anisotropic magnetic field sufficient for orienting the magnetization direction of a free magnetic layer in a particular direction can still be obtained.

The magnetostriction of the free magnetic layer 17 can be completely removed by forming the nonmagnetic layer 18 with Ru and the free magnetic layer 17 with CoFe.

In the magnetic sensing element of this embodiment, the first antiferromagnetic layer 14 and the second antiferromagnetic layer 20 can be made of the same antiferromagnetic material.

Thirteenth and Fourteenth Embodiments

Figure 33:
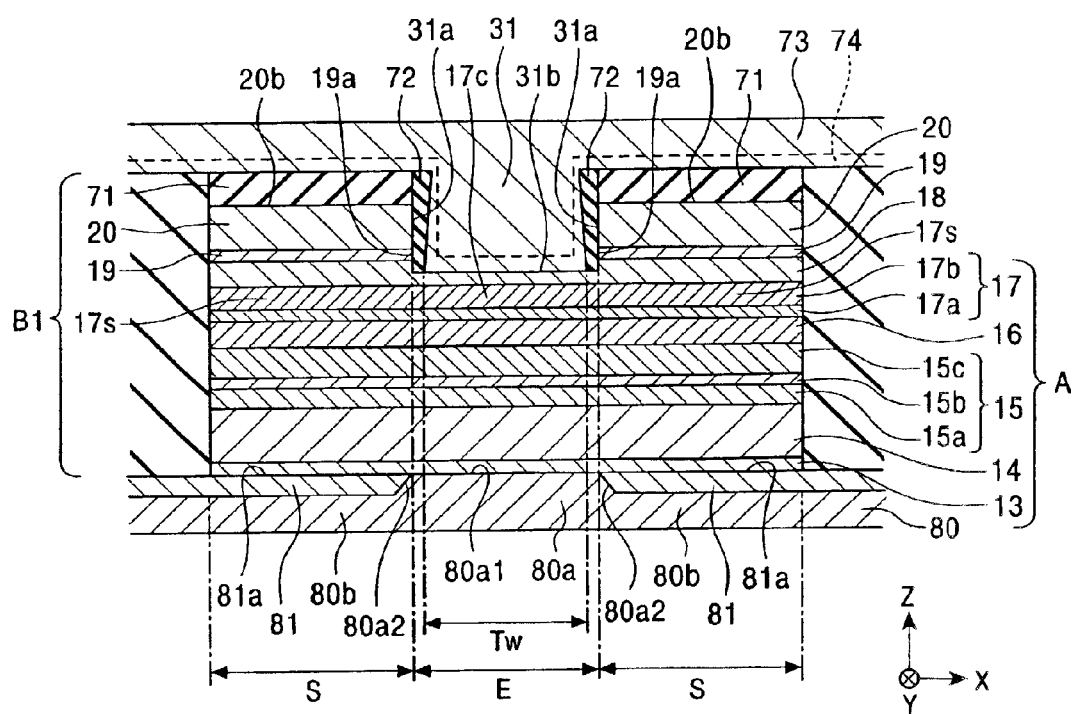
FIG. 33 is a cross-sectional view of a magnetic sensing element made by the method of a thirteenth embodiment of the present invention, as viewed from an air bearing surface (ABS)
Figure 34:
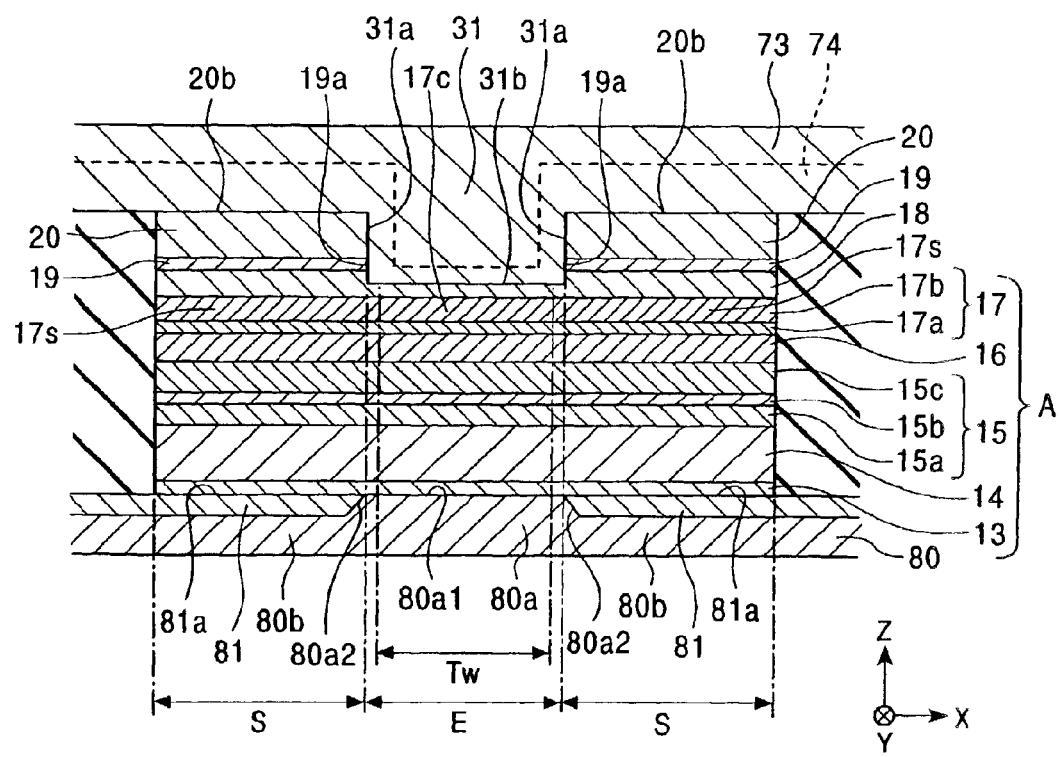
FIG. 34 a cross-sectional view of a magnetic sensing element made by the method of a fourteenth embodiment of the present invention, as viewed from an air-bearing surface (ABS)

Thirteenth and fourteenth embodiments of a manufacturing method of the present invention are now explained with reference to FIGS. 33 and 34. FIGS. 33 and 34 show the resulting CPP-type magnetic sensing elements. These differ from that shown in FIG. 28 in the shape of a lower electrode layer 80 which also functions as a lower shield layer.

A magnetic sensing element of the thirteenth embodiment shown in FIG. 33 comprises a composite A having a layer configuration identical to that shown in FIG. 28. The insulating layers 71 are formed on the second antiferromagnetic layers 20. The second insulating layers 72 are formed on the side faces 31a of the indent 31. The upper electrode layer 73, which also functions as an upper shield layer, is formed on the insulating layer 71 and the bottom portion 31b of the indent 31. This structure is identical to that shown in FIG. 28.

This embodiment differs from the eighth embodiment shown in FIG. 28 in that the lower electrode layer 80 composed of a magnetic material such as NiFe, which also functions as a lower shield layer, has a protrusion 80a protruding in the composite A direction (the Z direction in the drawing) formed at the center of the lower electrode layer 80 in the track width direction (the X direction in the drawing). The protrusion 80a has an upper surface 80a1 which comes into contact with the lower surface of the composite A such that an electrical current flows from the protrusion 80a into the composite A or from the composite A into the protrusion 80a.

In the magnetic sensing element shown in FIG. 33, the lower electrode layer 80 has side portions 80b in the track width direction (the X direction in the drawing) beside the protrusion 80a. Insulating layers 81 are provided between the side portions 80b and the composite A. The insulating layers 81 are composed of an insulating material such as $Al_2O_3$, $SiO_2$, AlN, $Ti_2O_3$, $Ti_3O_5$, or Al—Si—O.

In the magnetic sensing element shown in FIG. 33, the path of electrical current from the lower electrode layer 80 to the composite A is narrowed by the formation of the protrusion 80a. Moreover, since the insulating layers 81 are provided between the side portions 80b and the composite A, an electrical current is suitably prevented from shunting into the composite A from the side portions 80b. Thus, a magnetic sensing element exhibiting a large read output can be effectively manufactured.

In the magnetic sensing element shown in FIG. 33, the width of the lower electrode layer upper surface 80a1 of the protrusion 80a in the track width direction (the X direction in the drawing) is equal to the width of the sensitive region E in the track width direction (the X direction in the drawing). Alternatively, the width of the upper surface 80a1 may be larger than the width of the sensitive region E. Preferably, the width of the upper surface 80a1 is the same as the track width $T_w$. In this manner, an electrical current can be fed only to the region of the composite A within the track width $T_w$. Thus, a magnetic sensing element exhibiting a large read output can be manufactured.

In the embodiment shown in FIG. 33, the protrusion 80a of the lower electrode layer 80 has side faces 80a2 in the track width direction (the X direction in the drawing). The side faces 80a2 are formed as flat or curved slopes so that the width of the protrusion 80a in the track width direction gradually increases as the side faces 80a2 extend in a direction opposite to the Z direction in the drawing, i.e., the direction away from the composite A. Alternatively, the side faces 80a2 may be perpendicular to the track width direction (the X direction in the drawing).

The fourteenth embodiment shown in FIG. 34 has the same lower electrode layer 80 as that of the thirteenth embodiment shown in FIG. 33. That is, the lower electrode layer 80 has a protrusion 80a protruding in the composite A direction (the Z direction in the drawing) formed at the center of the lower electrode layer 80 in the track width direction (the X direction in the drawing). The protrusion 80a has an upper surface 80a1 which comes in contact with the lower surface of the composite A such that an electrical current flows from the protrusion 80a into the composite A or from the composite A into the protrusion 80a. Insulating layers are formed between the side portions 80b in the track width direction (the X direction in the drawing) and the composite A.

Unlike the thirteenth embodiment shown in FIG. 34, no insulating layer 71 is provided on the second antiferromagnetic layers 20. Also, no second insulating layer 72 is provided on the side faces 31a of the indent 31. The upper electrode layer 73 composed of a magnetic material such as NiFe, which also functions as an upper shield layer, is directly joined to the second antiferromagnetic layer 20, the side faces 31a, and the bottom portion 31b of the indent 31.

In the fourteenth embodiment shown in FIG. 34, no insulation is provided between the upper electrode layer 73 and the second antiferromagnetic layer 20. Also, no insulation is provided between the side faces 31a and the upper electrode layer 73. Thus, the fourteenth embodiment is inferior to the thirteenth embodiment in the read output since the path of an electrical current tends to expand from the track width T2. However, since the protrusion 80a is provided at the lower surface of the composite A, the path of the electrical current can be narrowed down and prevented from being spread. This prevents degradation in the read output.

In the magnetic sensing elements shown in FIGS. 33 and 34, the upper surface 80a1 of the protrusion 80a and upper surfaces 81a of the insulating layers 81 formed at the two sides of the protrusion 80a are preferably flush with each other. In this manner, the surface of each layer constituting the composite A formed on the protrusion 80a and the insulating layers 81 can be made parallel to the surface in the track width direction. Thus, a magnetic sensing element exhibiting excellent read characteristics can be manufactured.

The following explains a method for manufacturing the lower electrode layer 80 and the insulating layers 81 of the magnetic sensing elements shown in FIGS. 33 and 34.

Figure 35:
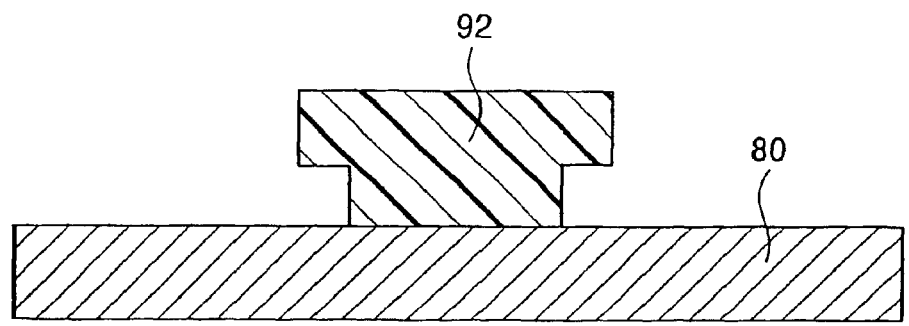
FIG. 35 is a cross sectional view showing a step of manufacturing the magnetic sensing element according to thirteenth and fourteenth embodiments.

First, in the step shown in FIG. 35, the lower electrode layer 80 is deposited using a magnetic material such as NiFe by plating or sputtering. The surface of the resulting lower electrode layer 80 is planarized by polishing or the like. A resist layer 92 is then formed at the center of the lower electrode layer 80 in the track width direction (the X direction in the drawing).

Figure 36:
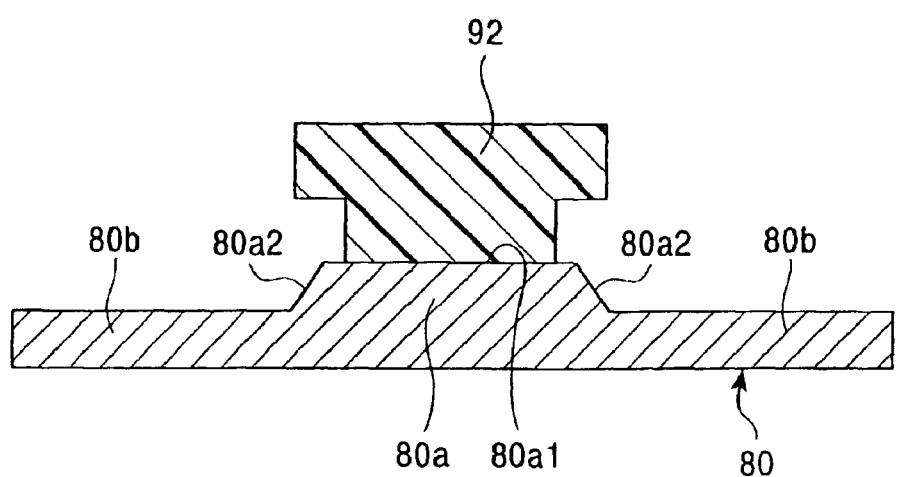
FIG. 36 is a cross-sectional view of a magnetic sensing element prepared using a step following the one performed in FIG. 35.

Next, in the step shown in FIG. 36, the side portions 80b of the lower electrode layer 80 not covered by the resist layer 92 is milled partway with ions. This produces the protrusion 80a at the center of the lower electrode layer 80 in the track width direction.

Figure 37:
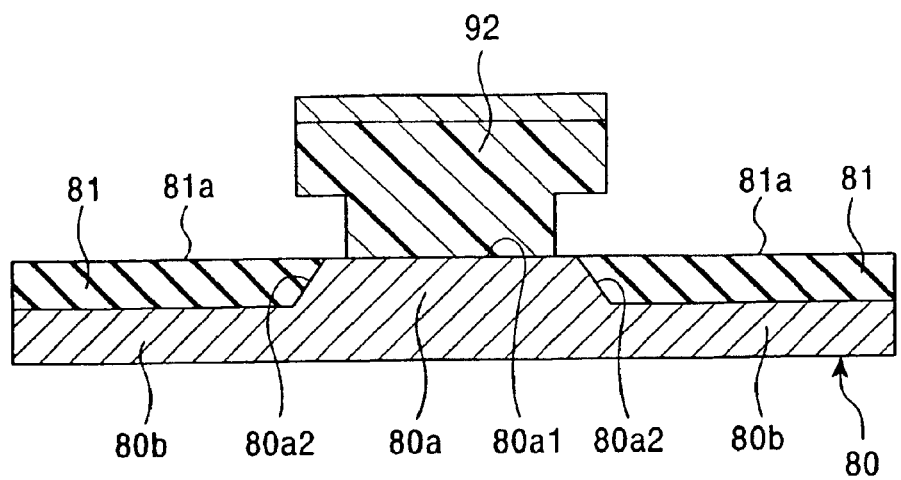
FIG. 37 is a cross-sectional view of a magnetic sensing element prepared using a step following the one performed in FIG. 36.
Figure 38:
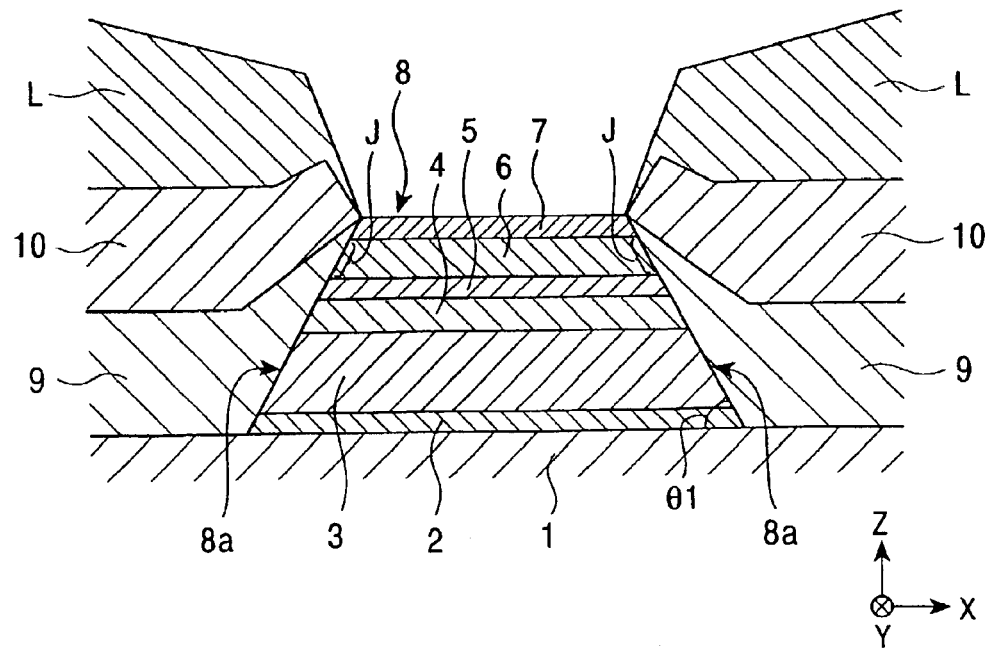
FIG. 38 is a cross sectional view of a conventional magnetic sensing element.

In the subsequent step shown in FIG. 37, the insulating layers 81 are deposited on the side portions 80b of the lower electrode layer 80 not covered by the resist layer 92 by sputtering. Sputtering is performed until the upper surfaces 81a of the insulating layers 81 are substantially flush with the upper surface 80a1 of the protrusion 80a. Subsequently, the resist layer 92 is removed.

After removing the resist layer 92, the upper surface 80a1 of the protrusion 80a and the upper surfaces 81a of the insulating layers 81 may be polished using techniques such as chemical mechanical polishing (CMP). This procedure makes the upper surface 80a1 of the protrusion 80a and the upper surfaces 81a of the insulating layers 81 precisely flush with each other. In this case, the preceding planarization treatment such as polishing may be omitted.

After removing the resist layer 92, the composite A is deposited on the lower electrode layer 80 and the insulating layers 81.

In manufacturing the CPP-type magnetic sensing elements shown in FIGS. 28 to 34, the lower electrode layer 70 or 80 and the upper electrode layer 73 which also function as an upper shield layer are formed to come into contact with the composite under and over the composite, respectively. With such a structure, no separate process is necessary to form the electrode layer and the shield layer, thereby simplifying the manufacturing process of the CPP-type magnetic sensing element.

When the electrode layer functions as the shield layer, the gap length G1 determined by the gap between two shield layers can be dramatically decreased. As a result, a magnetic sensing element which can meet demand for higher recording density can be manufactured.

If required, a nonmagnetic layer 74 shown by dotted lines in FIGS. 28 to 34 may be deposited on the insulating layers 71 and 72 and the bottom portions 31b, 32b, and 33b of the indents 31, 32, and 33, respectively. After depositing the nonmagnetic layer 74, the upper electrode layer 73 may be deposited. The nonmagnetic layer 74 is preferably composed of a nonmagnetic conductive material such as Ta, Ru, Rh, Ir, Cr, Re, and Cu.

The nonmagnetic layer 74 functions as an upper gap layer. The nonmagnetic layer 74 also functions as a layer through which an electrical current may enter or exit. Since the nonmagnetic layer 74 is formed on the bottom portions 31b, 32b, and 33b of the indents 31, 32, and 33, respectively, the current is obstructed from flowing into the composite if the bottom portion of the indent is covered with a nonmagnetic layer 74 composed of an insulating material. Thus, the nonmagnetic layer 74 is preferably composed of a nonmagnetic conductive material.

In this invention, an electrode layer composed of Au, W, Cr, Ta, or the like may be provided on the upper and/or lower surface of the composite. A shield layer composed of magnetic material may be provided on a surface of the resulting electrode layer opposite the surface in contact with the composite with a gap layer therebetween.

The CPP-type magnetic sensing element shown in FIGS. 28–34 also have the same advantages, as do the CIP-type magnetic sensing elements shown in FIGS. 6, 7, 8, 12, 15, 16, and 17.

Thus, since the indents 31, 32, and 33 are formed by milling the uniform second antiferromagnetic layer in a direction perpendicular to the track width direction (the X direction in the drawing) using techniques such as ion milling or reactive ion etching, the indents 31, 32, and 33 having predetermined widths can be accurately formed. The track width $T_w$ of the magnetic sensing element can thus be accurately defined.

Moreover, since no insensitive region is generated in the region within the track width (the optical track width) $T_w$, the degradation of the read output can be prevented even when the optical track width $T_w$ of the magnetic sensing element is reduced to meet the demand for higher density recording.

Since the two end faces of the magnetic sensing element can be formed perpendicular to the track width direction, the length of the free magnetic layer 17 in the track width direction can be made substantially uniform. Hence, side reading can be effectively prevented.

In the magnetic sensing elements shown in FIGS. 28 to 34, the nonmagnetic material layer 16 for use in the manufacture of a spin-valve GMR magnetoresistive element (CPP-GMR structure) may be composed of a nonmagnetic conductive material such as copper. Alternatively, the nonmagnetic material layer 16 for use in the manufacture of a spin-valve tunneling magnetoresistive element (CPP-TMR structure) may be composed of an insulating material such as $Al_2O_3$, $SiO_2$, or the like.

In the tunneling magnetoresistive element, a change in resistance results from a tunneling effect. When the magnetization directions of the pinned magnetic layer 15 and the free magnetic layer 17 are antiparallel to each other, a tunneling current cannot easily flow through the nonmagnetic material layer 16. This results in maximum resistance value. In contrast, when the magnetization directions of the pinned magnetic layer 15 and the free magnetic layer 17 are parallel to each other, the tunneling current easily flows through the nonmagnetic material layer 16. This gives rise to minimum resistance value.

A leakage magnetic field from a recording medium is detected based on the above principle. When the magnetization direction of the free magnetic layer 17 changes in response to an external magnetic field, the change in electrical resistance is detected as a change in voltage (in the case of constant current operation) or as a change in current (in the case of constant voltage operation).

The CPP-GMR-type magnetic sensing element is particularly effective where an optical track width $T_w$ of about 0.1 $\mu$m or less, more particularly, about 0.06 $\mu$m or less is required, or where reading data recorded at a density of about 200 Gbit/in$^2$ is required.

On each of the above-described CIP or CPP magnetic sensing elements, an inductive element for writing data may be deposited.

What is claimed is:

1. A method for manufacturing a magnetic sensing element, comprising the steps of:
   (1a) forming a first composite comprising a first antiferromagnetic layer, a pinned magnetic layer, a nonmagnetic material layer, a free magnetic layer, and a nonmagnetic layer on a substrate;
   (1b) annealing the first composite at a first annealing temperature in a magnetic field of a first magnitude to pin the magnetization direction of the pinned magnetic layer in a predetermined direction;
   (1c) depositing a ferromagnetic layer and a second antiferromagnetic layer on the annealed first composite to form a second composite;
   (1d) forming an indent having side faces penetrating the second antiferromagnetic layer and the ferromagnetic layer and a bottom portion lying in the nonmagnetic layer; and
   (1e) annealing the second composite at a second annealing temperature in a magnetic field of a second magnitude to pin the magnetization direction of the free magnetic layer in a direction substantially orthogonal to the magnetization direction of the pinned magnetic layer.

2. The method for manufacturing a magnetic sensing element according to claim 1, further comprising depositing a pair of electrode layers on the second antiferromagnetic layer, the pair of electrode layers being separated from each other by a gap in the track width direction.

3. The method for manufacturing a magnetic sensing element according to claim 2, said step (1d) further comprising depositing a pair of electrode layers on the second antiferromagnetic layer, the pair of electrode layers being separated from each other by a gap in the track width direction, and milling the portion of the second antiferromagnetic layer between the pair of electrode layers so that the bottom portion of the indent has the same width as the track width.

4. The method for manufacturing a magnetic sensing element according to claim 2, said step (1d) further comprising depositing a pair of first resist layers on the second antiferromagnetic layer, the pair of first resist layers being separated from each other with a gap in the track width direction, and milling the portion of the second antiferromagnetic layer between the pair of first resist layers to form the indent.

5. The method for manufacturing a magnetic sensing element according to claim 4, further comprising the steps of:
(5a) forming a second resist layer in the indent and on the second antiferromagnetic layers near the opening of the indent;
(5b) depositing electrode layers on the regions of the second antiferromagnetic layers not covered by the second resist layer; and
(5c) removing the second resist layer,
wherein said steps (5a) to (5c) are performed after said step (1d) and after the first resist layer is removed.

6. The method for manufacturing a magnetic sensing element according to claim 4, further comprising the steps of:
(6a) forming a second resist layer on the bottom portion of the indent, the width of the bottom portion of the second resist layer in the track width direction being smaller than that of the bottom portion of the indent;
(6b) depositing electrode layers in the indent and over the second antiferromagnetic layers; and
(6c) removing the second resist layer,
wherein said steps (6a) to (6c) are performed after said step (1d) and after the first resist layer is removed.

7. A method for manufacturing a magnetic sensing element, comprising the steps of:
(7a) forming a first composite comprising a first antiferromagnetic layer, a pinned magnetic layer, a nonmagnetic material layer, a free magnetic layer, and a nonmagnetic layer on a substrate;
(7b) annealing the first composite at a first annealing temperature in a magnetic field of a first magnitude to pin the magnetization direction of the pinned magnetic layer in a predetermined direction;
(7c) depositing a ferromagnetic layer and a second antiferromagnetic layer on the annealed first composite to form a second composite;
(7d) forming an indent in the second antiferromagnetic layer, the indent having a bottom portion lying in the second antiferromagnetic layer; and
(7e) annealing the second composite at a second annealing temperature in a magnetic field of a second magnitude to pin the magnetization direction of the free magnetic layer in a direction substantially orthogonal to the magnetization direction of the pinned magnetic layer.

8. The method for manufacturing a magnetic sensing element according to claim 7, wherein in said step (7d), the thickness of the region of the second antiferromagnetic layer covered by the bottom portion of the indent is more than about 0 Å but not more than about 50 Å.

9. The method for manufacturing a magnetic sensing element according to claim 7, further comprising depositing a pair of electrode layers on the second antiferromagnetic layer, the pair of electrode layers being separated from each other with a gap in the track width direction.

10. The method for manufacturing a magnetic sensing element according to claim 9, the step (7d) further comprising depositing a pair of electrode layers on the second antiferromagnetic layer, the pair of electrode layers being separated from each other with a gap in the track width direction, and milling the portion of the second antiferromagnetic layer between the pair of electrode layers so that the bottom portion of the indent has the same width as the track width.

11. The method for manufacturing a magnetic sensing element according to claim 9, said step (7d) further comprising depositing a pair of first resist layers on the second antiferromagnetic layer, the pair of first resist layers being separated from each other with a gap in the track width direction, and milling the portion of the second antiferromagnetic layer between the pair of electrode layers to form the indent.

12. The method for manufacturing a magnetic sensing element according to claim 11, further comprising the steps of:
(12a) forming a second resist layer in the indent and on the second antiferromagnetic layers near the opening of the indent;
(12b) depositing electrode layers on the regions of the second antiferromagnetic layers not covered by the second resist layer; and
(12c) removing the second resist layer,
wherein said steps (12a) to (12c) are performed after said step (7d) and after the first resist layer is removed.

13. The method for manufacturing a magnetic sensing element according to claim 11, further comprising the steps of:
(13a) forming a second resist layer on the bottom portion of the indent, the width of the bottom portion of the second resist layer in the track width direction being smaller than that of the bottom portion of the indent;
(13b) depositing electrode layers in the indent and over the second antiferromagnetic layers; and
(13c) removing the second resist layer,
wherein said steps (13a) to (13c) are performed after said step (7d) and after the first resist layer is removed.

14. A method for manufacturing a magnetic sensing element, comprising the steps of:
(14a) forming a first composite comprising a first antiferromagnetic layer, a pinned magnetic layer, a nonmagnetic material layer, a free magnetic layer, and a nonmagnetic layer on a substrate;
(14b) annealing the first composite at a first annealing temperature in a magnetic field of a first magnitude to pin the magnetization direction of the pinned magnetic layer in a predetermined direction;
(14c) depositing a ferromagnetic layer and a second antiferromagnetic layer on the annealed first composite to form a second composite;
(14d) forming an indent having side faces penetrating the second antiferromagnetic layer and a bottom portion lying in the ferromagnetic layer; and (14e) annealing the second composite at a second annealing temperature in a magnetic field of a second magnitude to pin the magnetization direction of the free magnetic layer in a direction substantially orthogonal to the magnetization direction of the pinned magnetic layer.

15. The method for manufacturing a magnetic sensing element according to claim 14, further comprising the step of depositing a pair of electrode layers on the second antiferromagnetic layer, the pair of electrode layers being separated from each other by a gap in the track width direction.

16. The method for manufacturing a magnetic sensing element according to claim 15, the step (14d) further comprising depositing a pair of electrode layers on the second antiferromagnetic layer, the pair of electrode layers being separated from each other with a gap in the track width direction, and milling the portion of the second antiferromagnetic layer between the pair of electrode layers so that the bottom portion of the indent has the same width as the track width.

17. The method for manufacturing a magnetic sensing element according to claim 15, the step (14d) further comprising depositing a pair of first resist layers on the second antiferromagnetic layer, the pair of first resist layers separated from each other with a gap in the track width direction, and milling the portion of the second antiferromagnetic layer between the pair of electrode layers to form the indent.

18. The method for manufacturing a magnetic sensing element according to claim 17, further comprising the steps of:
(18a) forming a second resist layer in the indent and on the second antiferromagnetic layers near the opening of the indent;
(18b) depositing electrode layers on the regions of the second antiferromagnetic layers not covered by the second resist layer; and
(18c) removing the second resist layer,
wherein said steps (18a) to (18c) are performed after said step (14d) and after the first resist layer is removed.

19. The method for manufacturing a magnetic sensing element according to claim 17, further comprising the steps of:
(19a) forming a second resist layer on the bottom portion of the indent, the width of the bottom portion of the second resist layer in the track width direction being smaller than that of the bottom portion of the indent;
(19b) depositing electrode layers in the indent and over the second antiferromagnetic layers; and
(19c) removing the second resist layer,
wherein said steps (19a) to (19c) are performed after said step (14d) and after the first resist layer is removed.

20. A method for manufacturing a magnetic sensing element, comprising the steps of:
(20a) forming a lower electrode layer on a substrate;
(20b) forming a first composite comprising a first antiferromagnetic layer, a pinned magnetic layer, a nonmagnetic material layer, a free magnetic layer, and a nonmagnetic layer on the lower electrode layer;
(20c) annealing the first composite at a first annealing temperature in a magnetic field of a first magnitude to pin the magnetization direction of the pinned magnetic layer in a predetermined direction;
(20d) depositing a ferromagnetic layer and a second antiferromagnetic layer on the annealed first composite to form a second composite;
(20e) depositing a first insulating layer on the second antiferromagnetic layer;
(20f) depositing a resist layer having an opening at the center in the track width direction on the first insulating layer and milling the portion of the first insulating layer and the second antiferromagnetic layer exposed by the opening to form an indent;
(20g) depositing an upper electrode layer on a bottom portion of the indent to form a second composite;
(20h) annealing the second composite at a second annealing temperature in a magnetic field of a second magnitude to pin the magnetization direction of the free magnetic layer in a direction substantially orthogonal to the magnetization direction of the pinned magnetic layer.

21. The method for manufacturing a magnetic sensing element according to claim 20, further comprising the steps of:
(21a) depositing a second insulating layer over the indent and the first insulating layers; and
(21b) removing a portion of the second insulating layer deposited on the bottom portion of the indent,
wherein said steps (21a) and (21b) are performed after said step (20f) and before said step (20g).

22. The method for manufacturing a magnetic sensing element according to claim 20, further comprising the steps of:
(22a) forming a protrusion at the center of the lower electrode layer in the track width direction, the protrusion projecting toward the region where the first composite is to be formed; and
(22b) forming third insulating layers on two side portions of the lower electrode layer in the track width direction, the two side portions being arranged beside the protrusion,
wherein said steps (22a) and (22b) are performed after said step (20a) and before said step (20b),
wherein, in said step (20b), the lower surface of the first composite is in contact with the upper surface of the protrusion.

23. The method for manufacturing a magnetic sensing element according to claim 22, said step (22b) further comprising planarizing the upper surface of the protrusion and the upper surfaces of the third insulating layers formed on the two side portions of the lower electrode layer.

24. The method for manufacturing a magnetic sensing element according to claim 20, wherein at least one of the lower electrode layer and the upper electrode layer comprises a magnetic material.

25. The method for manufacturing a magnetic sensing element according to claim 20, wherein the upper electrode layer is formed by depositing a nonmagnetic conductive sublayer and a magnetic layer, the nonmagnetic conductive sublayer being electrically connected to the bottom portion of the indent.

26. The method for manufacturing a magnetic sensing element according to claim 20, wherein the nonmagnetic material layer comprises a nonmagnetic conductive material.

27. The method for manufacturing a magnetic sensing element according to claim 20, wherein the nonmagnetic material layer comprises an insulating material.

28. The method for manufacturing a magnetic sensing element according to claim 1, wherein in said step (1e), the second annealing temperature is higher than the blocking temperature of the first antiferromagnetic layer.

29. The method for manufacturing a magnetic sensing element according to claim 1, wherein in said step (1e), the second magnitude of the magnetic field is smaller than an exchange anisotropic magnetic field of the first antiferromagnetic layer.

30. The method for manufacturing a magnetic sensing element according to claim 1, wherein in said step (1a), the nonmagnetic layer is formed using a conductive material.

31. The method for manufacturing a magnetic sensing element according to claim 30, wherein in said step (1a), the nonmagnetic layer is formed with at least one element selected from the group consisting of Ru, Rh, Ir, Re, and Os.

32. The method for manufacturing a magnetic sensing element according to claim 31, wherein the nonmagnetic layer is composed of Ru and has a thickness in the range of from about 0.8 to 1.1 nm.

33. The method for manufacturing a magnetic sensing element according to claim 1, said step (1a) further comprising forming a conductive layer between the nonmagnetic layer and the free magnetic layer, the conductive layer being composed of a conductive material having a specific resistance lower than that of the nonmagnetic layer.

34. The method for manufacturing a magnetic sensing element according to claim 33, wherein the nonmagnetic layer comprises Ru and has a thickness in the range of from about 0.4 to about 1.1 nm.

35. The method for manufacturing a magnetic sensing element according to claim 33, wherein the conductive layer comprises Cu and has a thickness in the range of from about 0.3 to about 0.5 nm.

36. The method for manufacturing a magnetic sensing element according to claim 1, wherein in said step (1a), the pinned magnetic layer is formed by depositing a plurality of ferromagnetic sublayers having different magnitudes of magnetic moments per unit area and at least one nonmagnetic intermediate sublayer between said plurality of ferromagnetic sublayers.

37. The method for manufacturing a magnetic sensing element according to claim 36, wherein the nonmagnetic intermediate sublayer comprises at least one element selected from the group consisting of Ru, Rh, Ir, Os, Cr, Re, and Cu.

38. The method for manufacturing a magnetic sensing element according to claim 1, wherein in said step (1a), the free magnetic layer is formed by depositing a plurality of ferromagnetic sublayers having different magnitudes of the magnetic moments per unit area and at least one nonmagnetic intermediate sublayer between said plurality of ferromagnetic sublayers.

39. The method for manufacturing a magnetic sensing element according to claim 38, wherein the nonmagnetic intermediate sublayer comprises at least one element selected from the group consisting of Ru, Rh, Ir, Os, Cr, Re, and Cu.

40. The method for manufacturing a magnetic sensing element according to claim 1, wherein at least one of the ferromagnetic layer and the free magnetic layer comprises a CoFeNi alloy containing from about 9 to about 17 atomic percent Fe and from about 0.5 to about 10 atomic percent Ni, the balance being Co.

41. The method for manufacturing a magnetic sensing element according to claim 40, wherein both the ferromagnetic layer and the free magnetic layer comprises the CoFeNi alloy.

42. The method for manufacturing a magnetic sensing element according to claim 1, further comprising forming an intermediate layer between the nonmagnetic material layer and the free magnetic layer, the intermediate layer comprising a CoFe alloy or elemental Co.

43. The method for manufacturing a magnetic sensing element according to claim 42, wherein at least one of the ferromagnetic layer and the free magnetic layer comprises a CoFeNi alloy containing from about 7 to about 15 atomic percent Fe and 5 to about 15 atomic percent Ni, the balance being Co.

44. The method for manufacturing a magnetic sensing element according to claim 43, wherein both the ferromagnetic layer and the free magnetic layer comprise the CoFeNi alloy.

45. The method for manufacturing a magnetic sensing element according to claim 1, wherein the first antiferromagnetic layer and the second antiferromagnetic layer comprise the same antiferromagnetic material.

46. The method for manufacturing a magnetic sensing element according to claim 1, wherein at least one of the first antiferromagnetic layer and the second antiferromagnetic layer comprises one of a PtMn alloy, a X—Mn alloy, and a Pt—Mn—X' alloy, wherein X is at least one element selected from the group consisting of Pd, Ir, Rh, Ru, Os, Ni, and Fe and X' is at least one element selected from the group consisting of Pd, Ir, Rh, Ru, Au, Ag, Os, Cr, Ni, Ar, Ne, Xe, and Kr.

* * * * *

UNITED STATES PATENT AND TRADEMARK OFFICE
CERTIFICATE OF CORRECTION

PATENT NO. : 6,901,652 B2
DATED : June 7, 2005
INVENTOR(S) : Naoya Hasegawa et al.

It is certified that error appears in the above-identified patent and that said Letters Patent is hereby corrected as shown below:

<u>Column 53,</u>
Line 16, after "about 0.8 to" insert -- about --.

Signed and Sealed this

Twenty-fifth Day of April, 2006

JON W. DUDAS
*Director of the United States Patent and Trademark Office*